(12) United States Patent
Park et al.

(10) Patent No.: US 12,144,242 B2
(45) Date of Patent: Nov. 12, 2024

(54) ORGANIC METAL COMPOUND, ORGANIC LIGHT EMITTING DIODE AND ORGANIC LIGHT EMITTING DEVICE HAVING THE COMPOUND

(71) Applicant: LG Display Co., Ltd, Seoul (KR)

(72) Inventors: Hee-Jun Park, Paju-si (KR); Do-Han Kim, Paju-si (KR); Hye-Seung Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 642 days.

(21) Appl. No.: 17/009,609

(22) Filed: Sep. 1, 2020

(65) Prior Publication Data

US 2021/0074932 A1 Mar. 11, 2021

(30) Foreign Application Priority Data

Sep. 10, 2019 (KR) .......................... 10-2019-0112389

(51) Int. Cl.
*H10K 85/30* (2023.01)
*C07F 5/02* (2006.01)
(Continued)

(52) U.S. Cl.
CPC ....... *H10K 85/346* (2023.02); *C07F 15/0086* (2013.01); *C09K 11/06* (2013.01);
(Continued)

(58) Field of Classification Search
CPC .......................... H10K 85/346; H10K 85/322; H01L 51/0087; H01L 51/008; H01L 51/009;
(Continued)

(56) References Cited

U.S. PATENT DOCUMENTS 9,231,218 B2 * 1/2016 Lin ...................... H10K 85/346
10,937,984 B2 3/2021 Shin et al.
(Continued)

FOREIGN PATENT DOCUMENTS

CN 111354859 A 6/2020
JP 2014058504 A 4/2014
(Continued)

OTHER PUBLICATIONS

Cebrián et al., "Recent advances in phosphorescent platinum complexes for organic light-emitting diodes," *Beilstein J. Org. Chem.* 14:1459-1481, 2018.

*Primary Examiner* — Jenna N Chandhok
(74) *Attorney, Agent, or Firm* — Seed IP Law Group LLP

(57) ABSTRACT

The present disclosure relates to an organic metal compound having the following structure, and an organic light emitting diode (OLED) and an organic light emitting device including the organic metal compound of the following structure. Incorporating the organic metal compound of the following structure into an emitting unit makes the OLED with
(Continued)

improved luminous efficiency, luminous color purity and luminous lifetime.

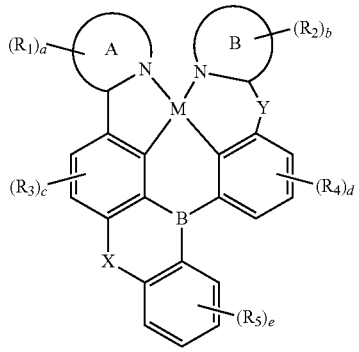

5 Claims, 8 Drawing Sheets

(51) Int. Cl.
*C07F 15/00* (2006.01)
*C07F 19/00* (2006.01)
*C09K 11/06* (2006.01)
*H10K 50/11* (2023.01)
*H10K 50/13* (2023.01)
*H10K 50/19* (2023.01)
*H10K 59/12* (2023.01)
*H10K 59/38* (2023.01)
*H10K 101/10* (2023.01)

(52) U.S. Cl.
CPC .............. *C07F 5/027* (2013.01); *C07F 19/00* (2013.01); *C09K 2211/1029* (2013.01); *C09K 2211/185* (2013.01); *C09K 2211/188* (2013.01); *H10K 50/11* (2023.02); *H10K 50/13* (2023.02); *H10K 50/19* (2023.02); *H10K 59/12* (2023.02); *H10K 59/38* (2023.02); *H10K 85/322* (2023.02); *H10K 85/361* (2023.02); *H10K 2101/10* (2023.02)

(58) Field of Classification Search
CPC ...... C07F 15/0086; C07F 19/00; C07F 5/027; C09K 2211/185; C09K 2211/188
See application file for complete search history.

(56) References Cited

U.S. PATENT DOCUMENTS

| 11,871,653 | B2 | 1/2024 | Tsai et al. | |
|---|---|---|---|---|
| 2006/0188745 | A1 | 8/2006 | Liao et al. | |
| 2014/0014922 | A1* | 1/2014 | Lin | H10K 85/322 |
| | | | | 546/4 |
| 2014/0070196 | A1 | 3/2014 | Kim et al. | |
| 2014/0084261 | A1 | 3/2014 | Brooks et al. | |
| 2014/0084269 | A1 | 3/2014 | Weaver et al. | |
| 2015/0188083 | A1* | 7/2015 | Jang | H01L 27/124 |
| | | | | 257/40 |
| 2016/0181350 | A1 | 6/2016 | Lee | |
| 2018/0166647 | A1* | 6/2018 | Shin | H10K 85/6572 |
| 2018/0305384 | A1 | 10/2018 | Chen et al. | |
| 2018/0375036 | A1 | 12/2018 | Chen et al. | |
| 2020/0168816 | A1* | 5/2020 | Jeon | C07F 15/0086 |
| 2020/0203634 | A1* | 6/2020 | Kim | C09K 11/06 |
| 2020/0274079 | A1* | 8/2020 | Tsai | C07F 19/00 |
| 2020/0388774 | A1* | 12/2020 | Tsai | H10K 85/654 |

FOREIGN PATENT DOCUMENTS

| KR | 10-2018-0067321 A | 6/2018 |
|---|---|---|
| KR | 10-2018-0118559 A | 10/2018 |
| KR | 10-2019-0000812 A | 1/2019 |
| KR | 10-2020-0077673 A | 7/2020 |
| KR | 10-2020-0103545 A | 9/2020 |

* cited by examiner

ORGANIC METAL COMPOUND, ORGANIC LIGHT EMITTING DIODE AND ORGANIC LIGHT EMITTING DEVICE HAVING THE COMPOUND

CROSS-REFERENCE TO RELATED APPLICATIONS

This application claims the priority benefit under 35 U.S.C. § 119(a) of Korean Patent Application No. 10-2019-0112389, filed in the Republic of Korea on Sep. 10, 2019, which is incorporated herein by reference in its entirety.

BACKGROUND

Technical Field

The present disclosure relates to a metal compound, and more specifically, to an organic metal compound having enhanced luminous efficiency and luminous lifetime, an organic light emitting diode and an organic light emitting device including the same.

Discussion of the Related Art

As display devices have become larger, there exists a need for a flat display device with a lower space requirement. Among the flat display devices used widely at present, organic light emitting diodes (OLEDs) are rapidly replacing liquid crystal display devices (LCDs).

The OLED can be formed as a thin film having a thickness less than 2000 Å and can be used to implement unidirectional or bidirectional images as electrode configurations. In addition, the OLED can be formed on a flexible transparent substrate such as a plastic substrate so that the OLED can be implemented as a flexible or foldable display with ease. Moreover, the OLED can be driven at a lower voltage of 10 V or less. Besides, the OLED has relatively lower power consumption for driving compared to plasma display panels and inorganic electroluminescent devices, and the color purity of the OLED is very high. Particularly, the OLED can implement red, green and blue colors, thus it has attracted a lot of attention as a light emitting device.

However, the fluorescent materials have shown low luminous efficiency because they use only the singlet excitons. On the other hand, the phosphorescent materials have relatively high luminous efficiency because they can use triplet excitons as well as the singlet excitons. However, as the representative phosphorescent materials, organic metal compounds have very short luminous lifetime, thus commercial applications of these phosphorescent materials have been limited.

BRIEF SUMMARY

Accordingly, embodiments of the present disclosure are directed to an organic metal compound and an OLED and an organic light emitting device including the organic metal compound that substantially obviates one or more of the problems due to the limitations and disadvantages of the related art.

An object of the present disclosure is to provide an organic metal compound having excellent luminous efficiency, color purity and luminous lifetime, an OLED and an organic light emitting device into which the organic compound is applied.

Additional features and aspects will be set forth in the description that follows, and in part will be apparent from the description, or may be learned by practice of the inventive concepts provided herein. Other features and aspects of the inventive concept may be realized and attained by the structure particularly pointed out in the written description, or derivable therefrom, and the claims hereof as well as the appended drawings.

To achieve these and other aspects of the inventive concepts, as embodied and broadly described, the present disclosure provides an organic metal compound having the following structure represented by Chemical Formula 1:

Chemical Formula 1

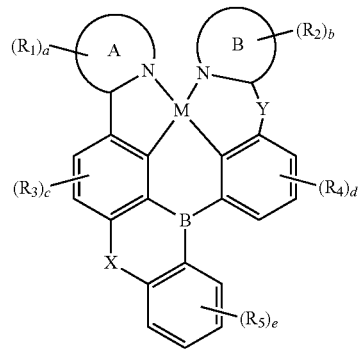

wherein each of A ring and B ring is independently a $C_3$-$C_{30}$ hetero aromatic ring; M is Pt or Pd; X is O, S or $NR_6$; Y is a single bond, *—O—*, *—S—*, *—Se—*, *—$CR_7R_8$—*, *—$CR_7$=$CR_8$—*, *—C=O—*, *—S=O—*, *—S(=O)$_2$—* or *—$SiR_7R_8$—*; each of $R_1$ to $R_8$ is independently selected from the group consisting of hydrogen, halogen, hydroxyl, cyano, nitro, amidino, hydrazine, hydrazone, $C_1$-$C_{20}$ alkyl, $C_2$-$C_{20}$ alkenyl, $C_2$-$C_{20}$ alkynyl, $C_1$-$C_{20}$ alkoxy, a $C_3$-$C_{30}$ alicyclic group, a $C_3$-$C_{20}$ hetero alicyclic group, a $C_6$-$C_{30}$ aromatic group and a $C_3$-$C_{30}$ hetero aromatic group, wherein each of the alicyclic group, the hetero alicyclic group, the aromatic group and the hetero aromatic group is independently unsubstituted or substituted; each of a and b is independently an integer of 0 (zero) to 4; c is an integer of 0 (zero) to 2; d is an integer of 0 (zero) to 3; and e is an integer of 0 (zero) to 4, provided that when each of a, b, c, d and e is independently an integer equal to or more than two, each of two adjacent groups of $R_1$ to $R_5$ independently forms an unsubstituted or substituted $C_5$-$C_{20}$ fused aromatic ring or an unsubstituted or substituted $C_3$-$C_{20}$ fused hetero aromatic ring, or at least one of $R_3$ and $R_6$, $R_4$ and $R_7$, $R_7$ and $R_8$ and $R_4$ and $R_5$ forms an unsubstituted or substituted ring, each of $R_3$ and $R_6$, $R_4$ and $R_7$ and $R_7$ and $R_8$ forms independently an unsubstituted or substituted $C_6$-$C_{20}$ fused aromatic ring or an unsubstituted or substituted $C_3$-$C_{20}$ hetero aromatic ring and $R_4$ and $R_5$ form an unsubstituted or substituted $C_6$-$C_{20}$ fused aromatic ring or an unsubstituted or substituted $C_3$-$C_{20}$ hetero aromatic ring.

In another aspect, the present disclosure provides an OLED that comprises a first electrode; a second electrode facing the first electrode; and at least one emitting unit disposed between the first and second electrodes and comprising an emitting material layer, wherein the emitting material layer comprises the organic metal compound.

For example, the organic metal compound may be comprised in the emitting material layer as a first dopant.

The OLED may comprise a single emitting unit or comprise plural emitting units to form a tandem structure.

In still another aspect, the present disclosure provides an organic light emitting device that comprises a substrate and an OLED disposed over the substrate, as described above.

It is to be understood that both the foregoing general description and the following detailed description are exemplary and explanatory and are intended to provide further explanation of the inventive concepts as claimed.

BRIEF DESCRIPTION OF THE SEVERAL VIEWS OF THE DRAWINGS

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION

Figure 1:
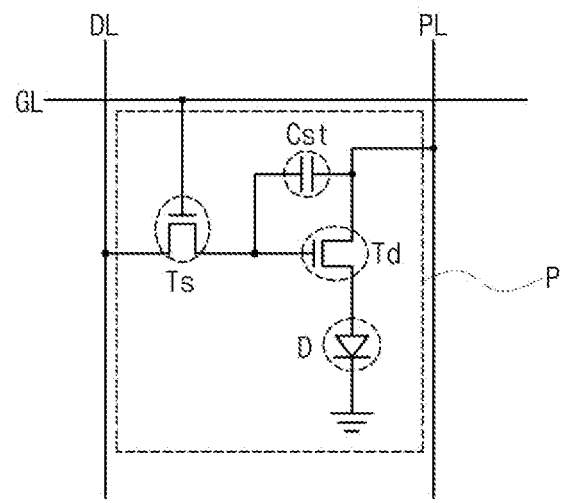
FIG. 1 is a schematic circuit diagram illustrating an organic light emitting display device of the present disclosure.

Reference will now be made in detail to aspects of the disclosure, examples of which are illustrated in the accompanying drawings.

Organic Metal Compound

As the conventional phosphorescent material emits light, its photoluminescence spectrum becomes wide, thus its color purity is lowered and its quantum efficiency is not high. An organic metal compound of the present disclosure has a rigid conformation with improving its luminous efficiency and luminous lifetime. An organic metal compound in accordance with the present disclosure may have the following structure represented by Chemical Formula 1:

Chemical Formula 1

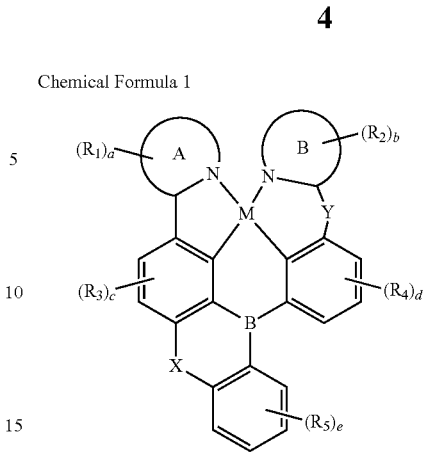

In Chemical Formula 1, each of A ring and B ring is independently a $C_3$-$C_{30}$ hetero aromatic ring; M is Pt or Pd; X is O, S or $NR_6$; Y is a single bond, *—O—*, *—S—*, *—Se—*, *—$CR_7R_8$—*, *—$CR_7$=$CR_8$—*, *—C=O—*, *—S=O—*, *—S(=O)$_2$—* or *—$SiR_7R_8$—*; each of $R_1$ to $R_8$ is independently selected from the group consisting of hydrogen, halogen, hydroxyl, cyano, nitro, amidino, hydrazine, hydrazone, $C_1$-$C_{20}$ alkyl, $C_2$-$C_{20}$ alkenyl, $C_2$-$C_{20}$ alkynyl, $C_1$-$C_{20}$ alkoxy, a $C_3$-$C_{30}$ alicyclic group, a $C_3$-$C_{20}$ hetero alicyclic group, a $C_6$-$C_{30}$ aromatic group and a $C_3$-$C_{30}$ hetero aromatic group, wherein each of the alicyclic group, the hetero alicyclic group, the aromatic group and the hetero aromatic group is independently unsubstituted or substituted; each of a and b is independently an integer of 0 (zero) to 4; c is an integer of 0 (zero) to 2; d is an integer of 0 (zero) to 3; and e is an integer of 0 (zero) to 4, provided that when each of a, b, c, d and e is independently an integer equal to or more than two, each of two adjacent groups of $R_1$ to $R_5$ independently forms an unsubstituted or substituted $C_5$-$C_{20}$ fused aromatic ring or an unsubstituted or substituted $C_3$-$C_{20}$ fused hetero aromatic ring, or at least one of $R_3$ and $R_6$, $R_4$ and $R_7$, $R_7$ and $R_8$ and $R_4$ and $R_5$ forms an unsubstituted or substituted ring, each of $R_3$ and $R_6$, $R_4$ and $R_7$ and $R_7$ and $R_8$ forms independently an unsubstituted or substituted $C_6$-$C_{20}$ fused aromatic ring or an unsubstituted or substituted $C_3$-$C_{20}$ hetero aromatic ring and $R_4$ and $R_5$ form an unsubstituted or substituted $C_6$-$C_{20}$ fused aromatic ring or an unsubstituted or substituted $C_3$-$C_{20}$ hetero aromatic ring.

As used herein, the term "unsubstituted" means that hydrogen is linked, and in this case, hydrogen comprises protium, deuterium and tritium.

As used the term "substituted" herein, the substitution group comprises, but is not limited to, unsubstituted or halogen-substituted $C_1$-$C_{20}$ alkyl, unsubstituted or halogen-substituted $C_1$-$C_{20}$ alkoxy, halogen, cyano, —$CF_3$, a hydroxyl group, a carboxylic group, a carbonyl group, an amino group, a $C_1$-$C_{10}$ alkyl amino group, a $C_6$-$C_{30}$ aryl amino group, a $C_3$-$C_{30}$ hetero aryl amino group, a $C_6$-$C_{30}$ aryl group, a $C_3$-$C_{30}$ hetero aryl group, a nitro group, a hydrazyl group, a sulfonate group, a $C_1$-$C_{20}$ alkyl silyl group, a $C_6$-$C_{30}$ aryl silyl group and a $C_3$-$C_{30}$ hetero aryl silyl group.

As used herein, the term "hetero" in such as "a hetero aromatic ring", "a hetero cycloalkyene group", "a hetero arylene group", "a hetero aryl alkylene group", "a hetero aryl oxylene group", "a hetero cycloalkyl group", "a hetero aryl group", "a hetero aryl alkyl group", "a hetero aryloxy group", "a hetero aryl amino group" means that at least one carbon atom, for example 1-5 carbons atoms, constituting an aromatic ring or an alicyclic ring is substituted at least one hetero atom selected from the group consisting of N, O, S, P and combination thereof.

In one exemplary embodiment, when each of $R_1$ to $R_8$ is independently a $C_6$-$C_{30}$ aromatic group, the $C_6$-$C_{30}$ aromatic group may be a $C_6$-$C_{30}$ aryl group, a $C_7$-$C_{30}$ aralkyl group, a $C_6$-$C_{30}$ aryloxyl group and a $C_6$-$C_{30}$ aryl amino group. For example, when each of $R_1$ to $R_8$ is independently the $C_6$-$C_{30}$ aryl group, the aryl group may comprise independently, but is not limited to, an unfused or fused aryl group such as phenyl, biphenyl, terphenyl, naphthyl, anthracenyl, pentalenyl, indenyl, indeno-indenyl, heptalenyl, biphenylenyl, indacenyl, phenalenyl, phenanthrenyl, benzo-phenanthrenyl, dibenzo-phenanthrenyl, azulenyl, pyrenyl, fluoranthenyl, triphenylenyl, chrysenyl, tetraphenylenyl, tetracenyl, pleiadenyl, picenyl, pentaphenylenyl, pentacenyl, fluorenyl, indeno-fluorenyl and spiro-fluorenyl.

In another exemplary aspect, when each of $R_1$ to $R_8$ is independently a $C_3$-$C_{30}$ aryl group, the hetero aryl group may comprise independently, but is not limited to, an unfused or fused hetero aryl group such as pyrrolyl, pyridinyl, pyrimidinyl, pyrazinyl, pyridazinyl, triazinyl, tetrazinyl, imidazolyl, pyrazolyl, indolyl, iso-indolyl, indazolyl, indolizinyl, pyrrolizinyl, carbazolyl, benzo-carbazolyl, dibenzo-carbazolyl, indolo-carbazolyl, indeno-carbazolyl, benzo-furo-carbazolyl, benzo-thieno-carbazolyl, carbolinyl, quinolinyl, iso-quinolinyl, phthlazinyl, quinoxalinyl, cinnolinyl, quinazolinyl, quinolizinyl, purinyl, benzo-quinolinyl, benzo-iso-quinolinyl, benzo-quinazolinyl, benzo-quinoxalinyl, acridinyl, phenazinyl, phenoxazinyl, phenothiazinyl, phenanthrolinyl, perimidinyl, phenanthridinyl, phtheridinyl, naphthyridinyl, furanyl, pyranyl, oxazinyl, oxazolyl, oxadiazolyl, triazolyl, dioxinyl, benzo-furanyl, dibenzo-furanyl, thiopyranyl, xanthenyl, chromenyl, iso-chromenyl, thioazinyl, thiophenyl, benzo-thiophenyl, dibenzo-thiophenyl, difuro-pyrazinyl, benzofuro-dibenzo-furanyl, benzothieno-benzo-thiophenyl, benzothieno-dibenzo-thiophenyl, benzo-thieno-benzo-furanyl, benzothieno-dibenzo-furanyl, xanthne-linked Spiro acridinyl, dihydroacridinyl substituted with at least one $C_1$-$C_{10}$ alkyl or N-substituted spiro fluorenyl.

As an example, each of the aromatic group and the hetero aromatic group in each of $R_1$ to $R_8$ may have independently one to three aromatic or hetero aromatic rings. When the number of the aromatic or the hetero aromatic ring in each of $R_1$ to $R_8$ becomes large, the conjugated structure within the whole molecule is too long, and therefore the organic compound may have excessively reduced energy bandgap. As an example, the aryl group and/or the hetero aryl group in each of $R_1$ to $R_8$ may be, but is not limited to, phenyl, biphenyl, naphthyl, anthracenyl, pyrrolyl, triazinyl, imidazolyl, pyrazolyl, pyridinyl, pyrazinyl, pyrimidinyl, pyridazinyl, furanyl, benzo-furanyl, dibenzo-furanyl, thiophenyl, benzo-thiophenyl, dibenzo-thiophenyl, carbazolyl, acridinyl, carbolinyl, phenazinyl, phenoxazinyl and/or phenothiazinyl.

Also, when each of a, b, c, d and e is independently an integer equal to or more than two, each of two adjacent groups of $R_1$ to $R_8$ may form independently an unsubstituted or substituted $C_5$-$C_{20}$ fused aromatic ring or an unsubstituted or substituted $C_3$-$C_{20}$ fused hetero aromatic ring, or at least one of $R_3$ and $R_6$, $R_4$ and $R_7$, $R_7$ and $R_8$ and $R_4$ and $R_5$ forms an unsubstituted or substituted ring. As an example, each of $R_3$ and $R_6$, $R_4$ and $R_7$, $R_7$ and $R_8$ and $R_4$ and $R_5$ may form independently an unsubstituted or substituted $C_5$-$C_{20}$ fused aromatic ring or an unsubstituted or substituted $C_3$-$C_{20}$ fused hetero aromatic ring, and $R_4$ and $R_5$ may form an unsubstituted or substituted $C_5$-$C_{20}$ fused aromatic ring or an unsubstituted or substituted $C_3$-$C_{20}$ fused hetero aromatic ring.

As an example, $R_4$ and $R_5$, each of which is linked to the right phenyl ring with respect to the boron atom and linked to the lower phenyl ring with respect to the boron atom, may form an unsubstituted or substituted $C_4$-$C_{20}$ hetero alicyclic ring or an unsubstituted or substituted $C_4$-$C_{20}$ hetero aromatic ring.

The fused aromatic ring, the fused hetero aromatic ring, the fused alicyclic ring or the fused hetero alicyclic ring, which is formed by the combination of each of $R_1$ to $R_5$, $R_3$ and $R_6$, $R_4$ and $R_7$, $R_4$ and $R_5$ and $R_7$ and $R_8$, is not limited to specific ring. For example, the fused aromatic ring or the fused hetero aromatic ring formed by the combination of those groups may comprise, but is not limited to, a fused benzene ring, a fused pyridine ring, a fused indole ring, a fused pyran ring, and the like. As an example, the A ring and B ring is fused to form a quinone ring or an iso-quinone ring.

The organic metal compound having the structure represented by Chemical Formula 1 comprises Pt or Pd having planar tetravalent conformation as the central coordination metal and ligands in which plural aromatic and/or hetero aromatic groups are fused. Since the central coordination metal has the planar tetravalent conformation, as the number of "d" orbital involved in the metal-ligand coordination is decreased, the compound has narrow FWHM (full width at half maximum) in luminescence process. Particularly, since the compound has a rigid chemical conformation, it can maintain better luminous lifetime as the molecular structure of the compound does not change in emitting light. As the luminescence spectrums of the organic compound can be limited to specific ranges in emitting light, its color purity is enhanced.

In addition, the organic metal compound is a heteroleptic metal complex in which a mutually different bidentate ligand is coordinated to the central metal. The differently coordinated bidentate ligand allows the luminescent color purity and the luminescent color of the compound to be adjusted with ease. Also, the color purity and luminescent peaks of the compound may be adjusted by applying various substituents to the ligand. As an example, the organic metal compound having the structure represented by Chemical Formula 1 may emit green or yellow-green light and can improve the luminous efficiency of an OLED.

In one exemplary aspect, the organic metal compound may comprise two pyridine ligands. Such an organic metal compound may have the following structure represented by Chemical Formula 2:

Chemical Formula 2

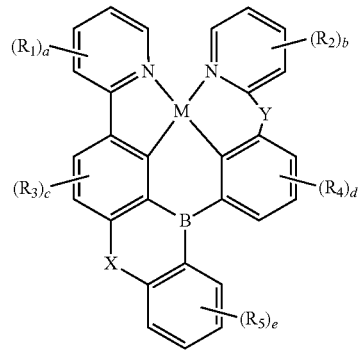

In Chemical Formula 2, each of M, X, Y, $R_1$ to $R_5$, a, b, c, d and e is identical as that defined in Chemical Formula 1.

As described above, $R_4$ and $R_5$ may form an unsubstituted or substituted fused ring, for example, an unsubstituted or substituted $C_4$-$C_{20}$ fused hetero alicyclic ring or an unsubstituted or substituted $C_4$-$C_{20}$ fused hetero aromatic ring in Chemical Formula 2. In one exemplary aspect, "Y" defined in Chemical Formulae 1 and 2 may be a single (direct) bond or may be linked through an ether bond or a fused indole ring. For example, the organic metal complex having the structures represented by Chemical Formulae 1 and 2 may have one of the following structures represented by Chemical Formulae 3 to 5:

Chemical Formula 3

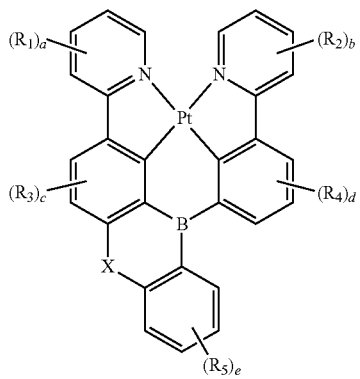

Chemical Formula 4

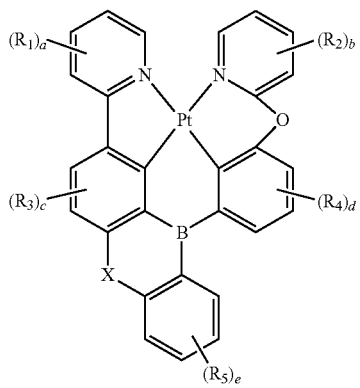

Chemical Formula 5

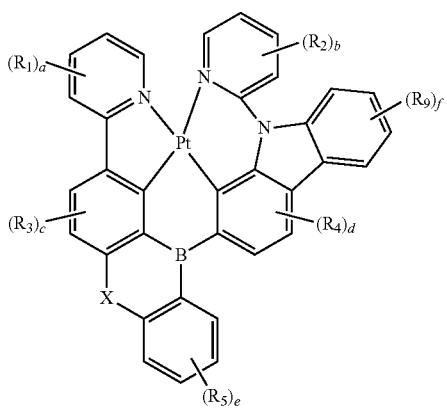

In Chemical Formulae 3 to 5, each of X, $R_1$ to $R_5$, a, b, c, d and e is identical as that defined in Chemical Formula 1;

$R_9$ in Chemical Formula 5 is hydrogen, halogen, hydroxyl, cyano, nitro, amidino, hydrazine, hydrazone, $C_1$-$C_{20}$ alkyl, $C_2$-$C_{20}$ alkenyl, $C_2$-$C_{20}$ alkynyl, $C_1$-$C_{20}$ alkoxy, a $C_3$-$C_{30}$ alicyclic group, a $C_3$-$C_{20}$ hetero alicyclic group, a $C_6$-$C_{30}$ aromatic group or a $C_3$-$C_{30}$ hetero aromatic group, wherein each of the alicyclic group, the hetero alicyclic group, the aromatic group and the hetero aromatic group is independently unsubstituted or substituted; and f is an integer of 0 (zero) to 4, provided that when f is an integer equal to or more than two, two adjacent $R_9$ form an unsubstituted or substituted $C_5$-$C_{20}$ fused aromatic ring or an unsubstituted or substituted $C_3$-$C_{20}$ fused hetero aromatic ring.

In another exemplary aspect, $R_4$ and $R_5$ in Chemical Formulae 1 and 2 may form an unsubstituted or substituted hetero alicyclic ring or an unsubstituted or substituted hetero aromatic ring. Alternatively, the "Y" in Chemical Formulae 1 and 2 may be a single bond or linked through an ether group or a fused indole ring. For example, the organic metal complex having the structures represented by Chemical Formulae 1 and 2 may have the one of the following structures represented by Chemical Formulae 6 to 8:

Chemical Formula 6

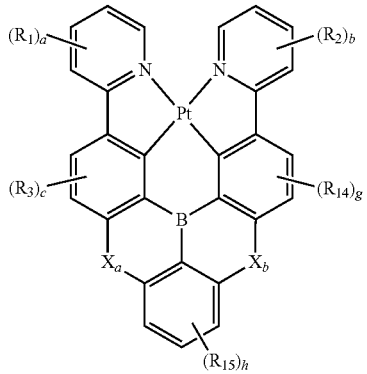

Chemical Formula 7

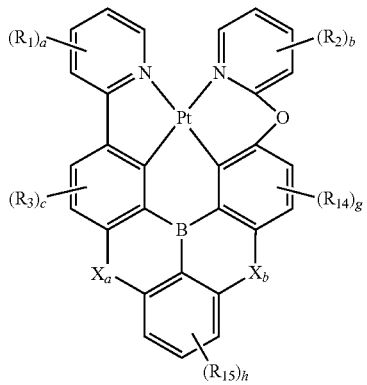

Chemical Formula 8

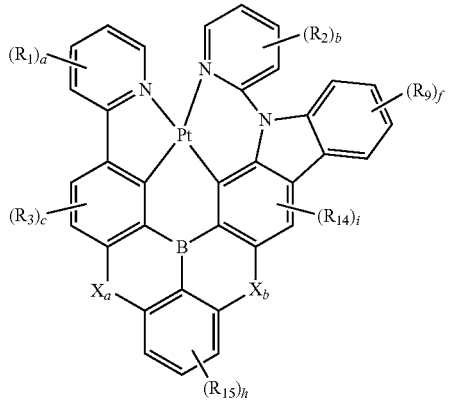

Chemical Formula 9

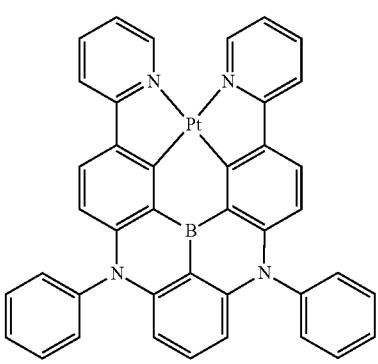

1

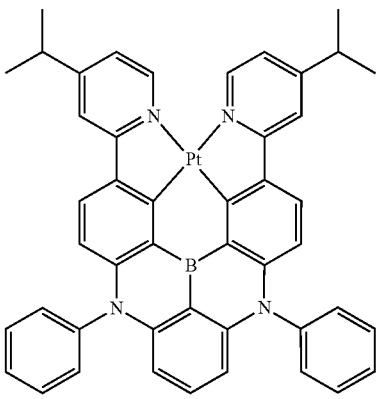

2

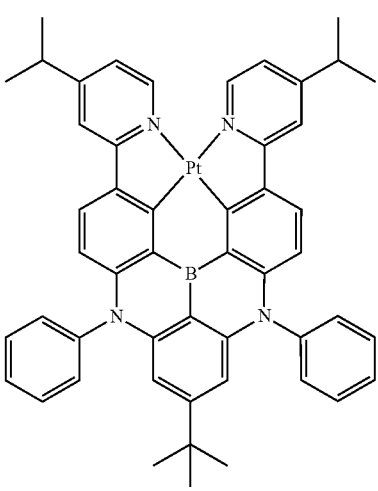

3

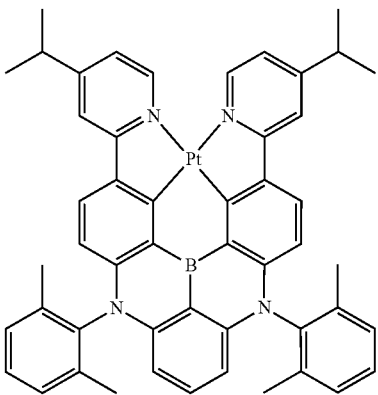

4

In Chemical Formulae 6 to 8, wherein each of $R_1$ to $R_3$, a, b and c is identical as that defined in Chemical Formula 1; $X_a$ is identical to X in Chemical Formula 1; $X_b$ is O, S or $NR_{10}$; each of $R_{10}$, $R_{14}$ and $R_{15}$ is independently hydrogen, halogen, hydroxyl, cyano, nitro, amidino, hydrazine, hydrazone, $C_1$-$C_{20}$ alkyl, $C_2$-$C_{20}$ alkenyl, $C_2$-$C_{20}$ alkynyl, $C_1$-$C_{20}$ alkoxy, a $C_3$-$C_{30}$ alicyclic group, a $C_3$-$C_{20}$ hetero alicyclic group, a $C_6$-$C_{30}$ aromatic group or a $C_3$-$C_{30}$ hetero aromatic group, wherein each of the alicyclic group, the hetero alicyclic group, the aromatic group and the hetero aromatic group in each of $R_1$ to $R_3$, $R_{10}$, $R_{14}$ and $R_{15}$ is independently unsubstituted or substituted; g is an integer of 0 (zero) to 2; h is an integer of 0 (zero) to 3, provided that when each of a, b, c, g and h is an integer equal to or more than two, each of two adjacent groups of $R_1$ to $R_3$, $R_{14}$ and $R_{15}$ independently forms an unsubstituted or substituted $C_5$-$C_{20}$ fused aromatic ring or an unsubstituted or substituted $C_3$-$C_{20}$ fused hetero aromatic ring or at least one of $R_3$ and $R_6$ and $R_{10}$ and $R_{14}$ forms an unsubstituted or substituted $C_6$-$C_{20}$ fused aromatic ring or an unsubstituted or substituted $C_3$-$C_{20}$ hetero aromatic ring.

In Chemical Formula 8, wherein $R_9$ is hydrogen, halogen, hydroxyl, cyano, nitro, amidino, hydrazine, hydrazone, $C_1$-$C_{20}$ alkyl, $C_2$-$C_{20}$ alkenyl, $C_2$-$C_{20}$ alkynyl, $C_1$-$C_{20}$ alkoxy, a $C_3$-$C_{30}$ alicyclic group, a $C_3$-$C_{20}$ hetero alicyclic group, a $C_6$-$C_{30}$ aromatic group or a $C_3$-$C_{30}$ hetero aromatic group, wherein each of the alicyclic group, the hetero alicyclic group, the aromatic group and the hetero aromatic group is independently unsubstituted or substituted; and f is an integer of 0 (zero) to 4, provided that when f is an integer equal to or more than two, two adjacent $R_9$ form an unsubstituted or substituted $C_5$-$C_{20}$ fused aromatic ring or an unsubstituted or substituted $C_3$-$C_{20}$ fused hetero aromatic ring.

More particularly, the organic metal compound having the structures represented by Chemical Formulae 1 and 2 may have one of the following structures represented by Chemical Formula 9:

5
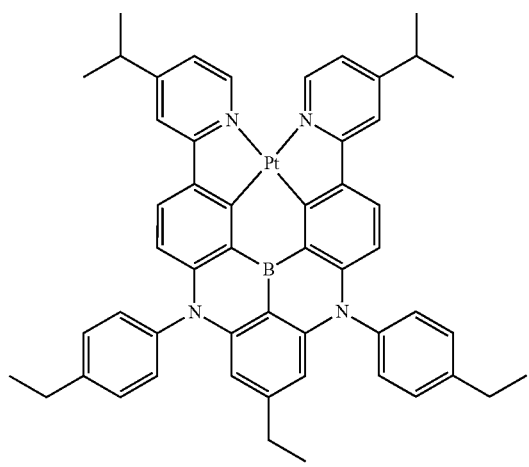
6
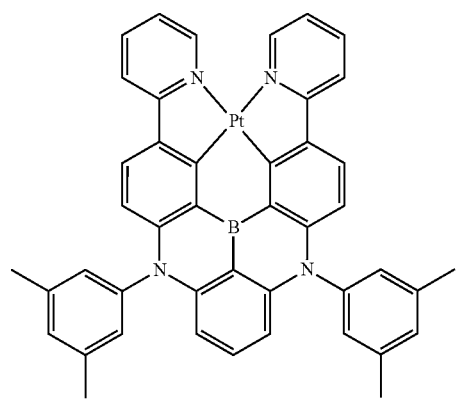
7
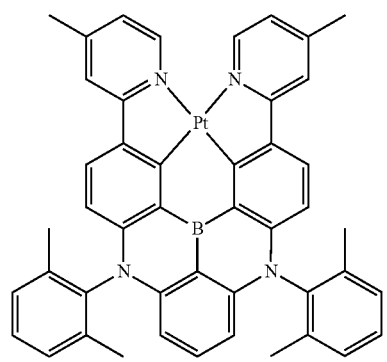
8
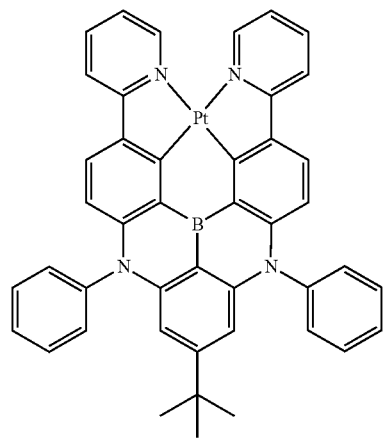
9
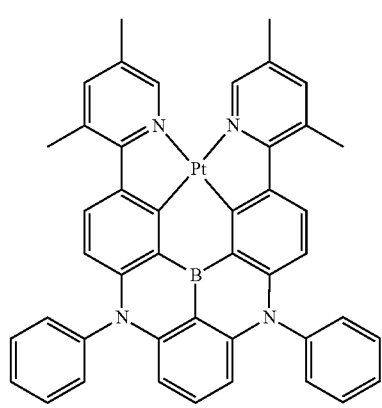
10
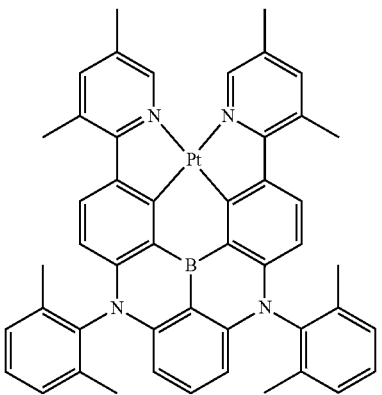
11
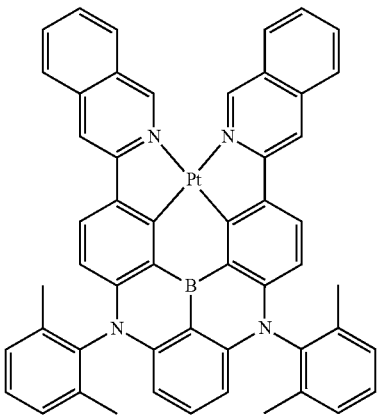
12
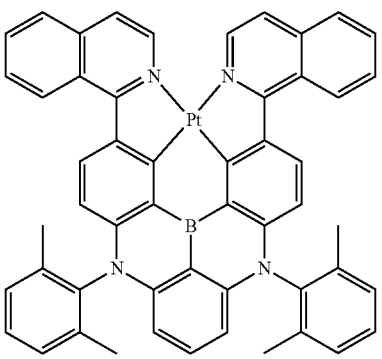

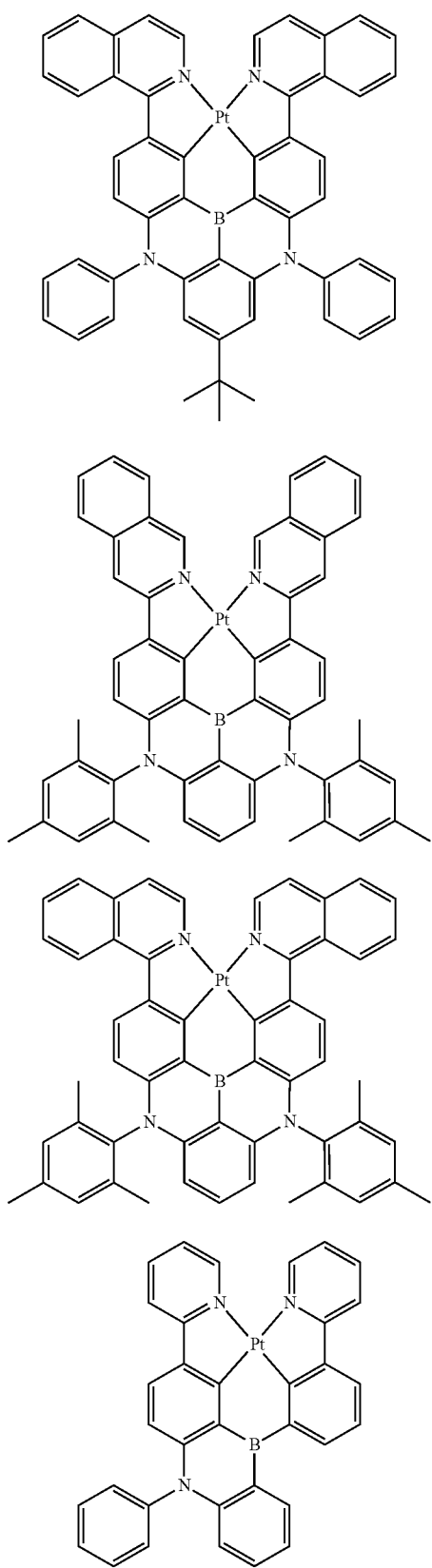
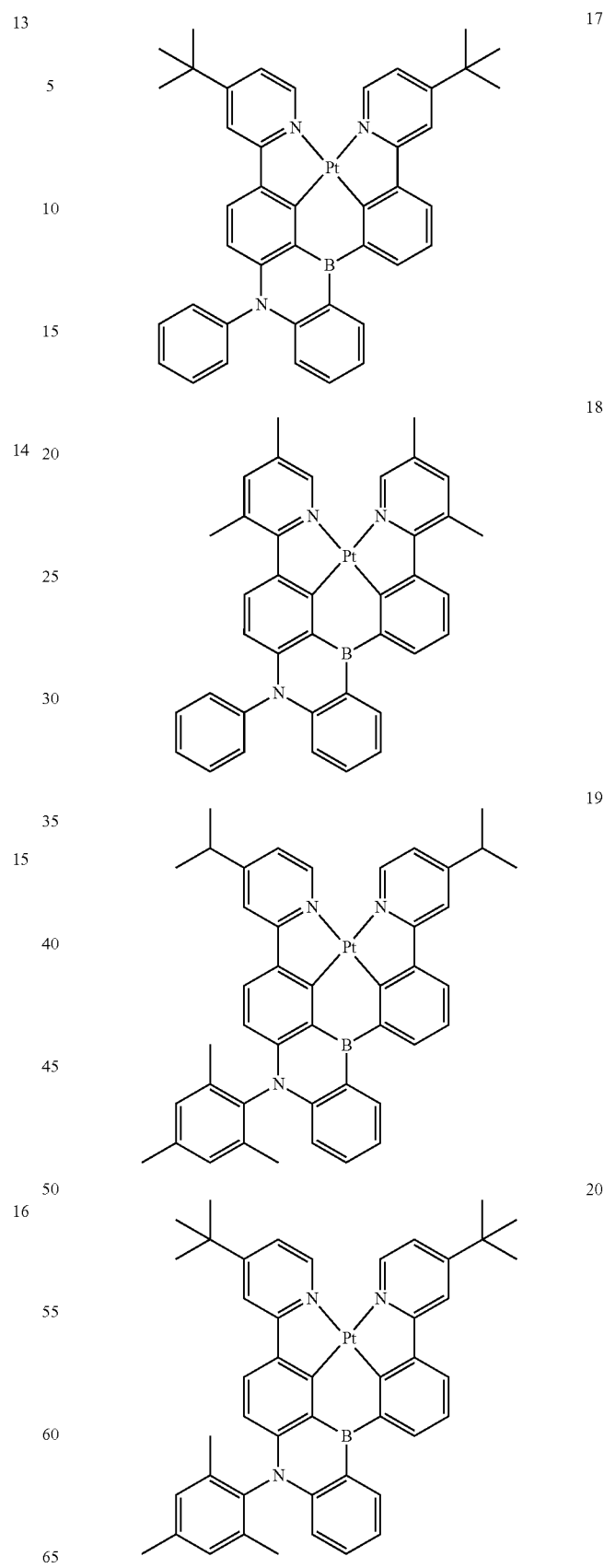

-continued
21
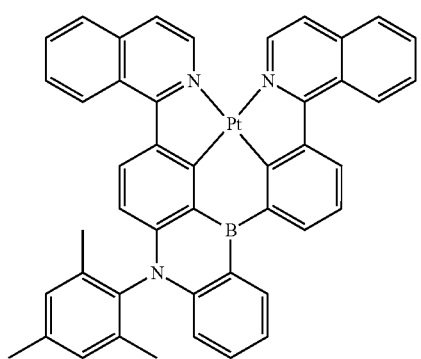
22
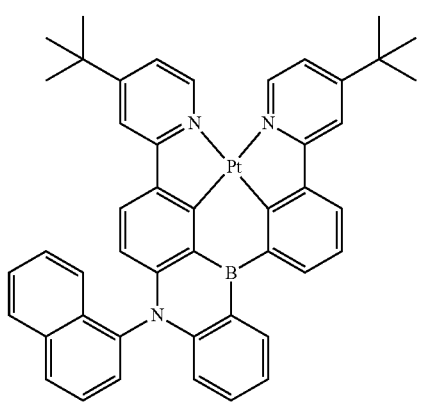
23
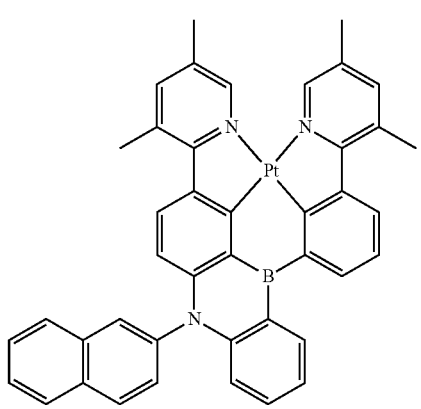
24
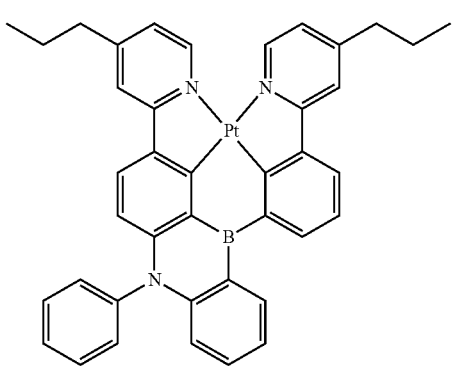
-continued
25
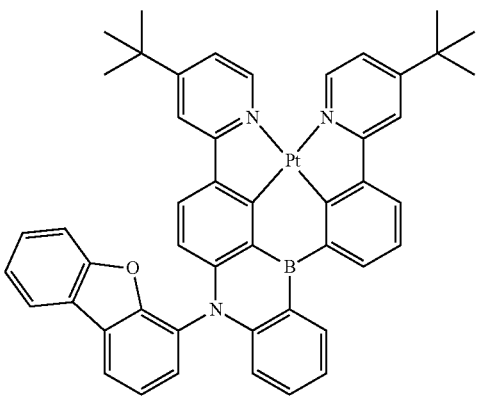
26
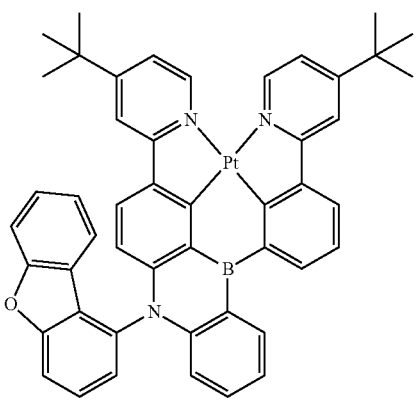
27
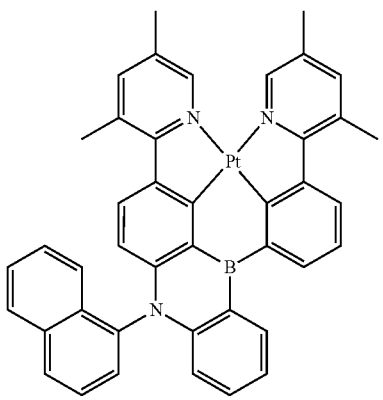
28
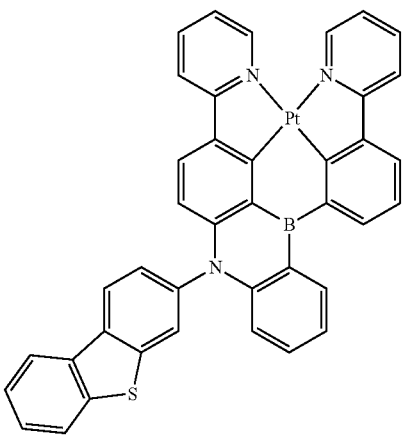

29
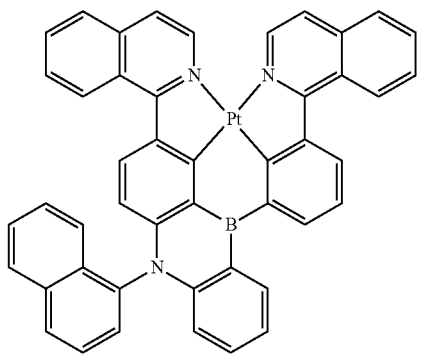
30
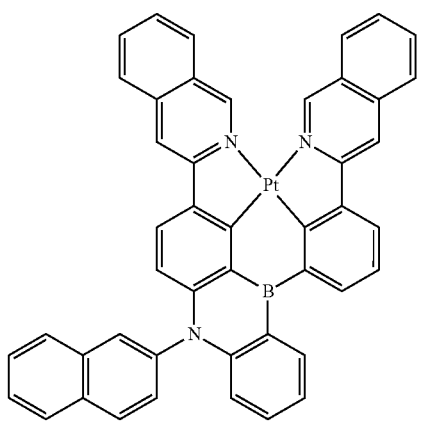
31
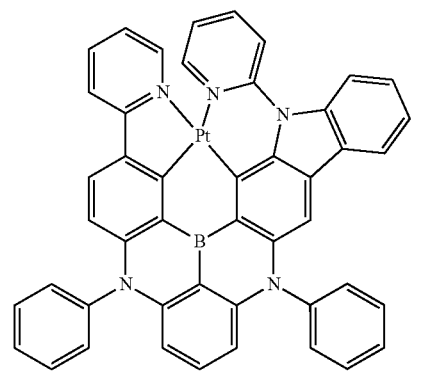
32
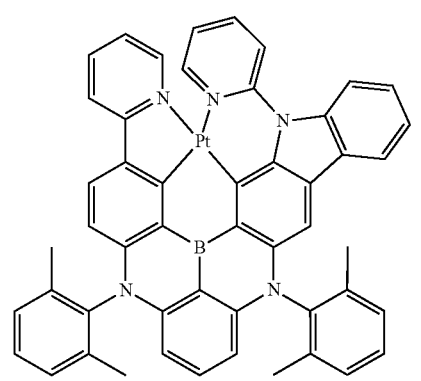
33
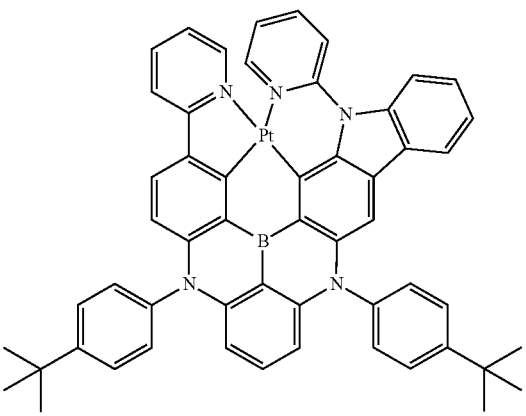
34
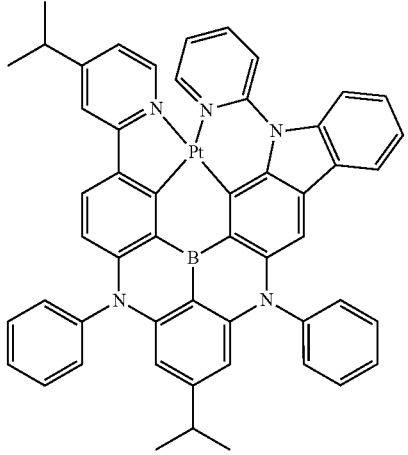
35
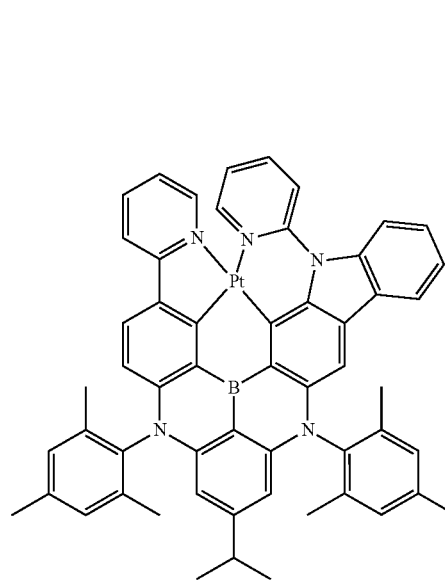

36 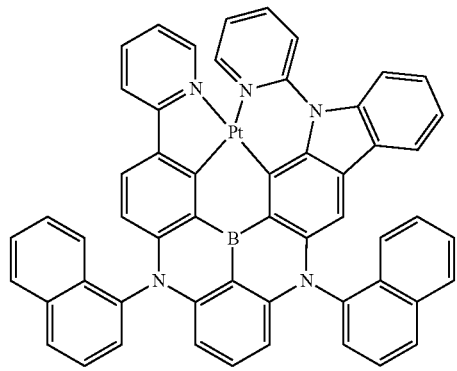
37 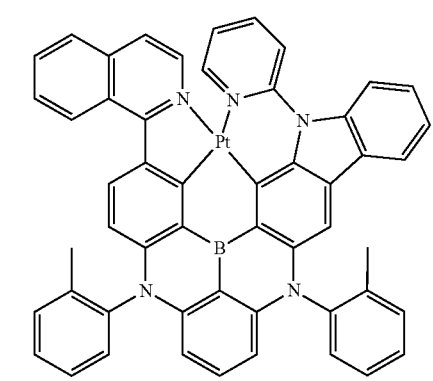
38 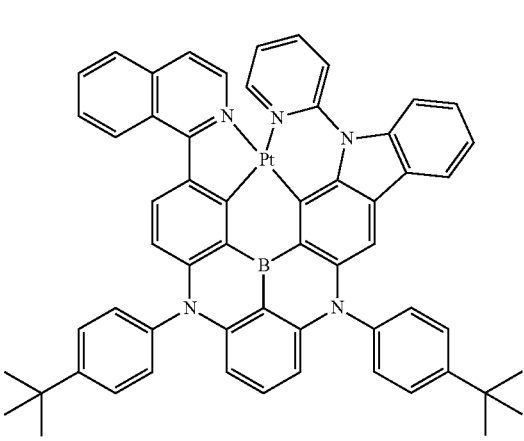
39 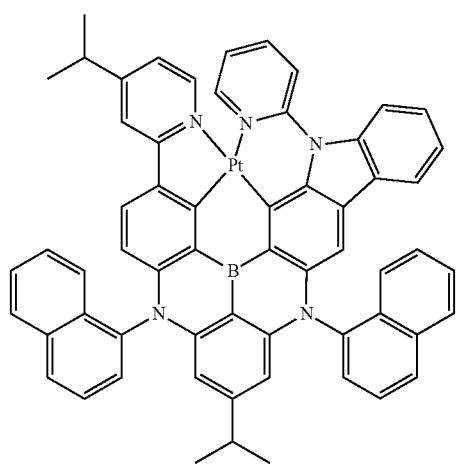
40 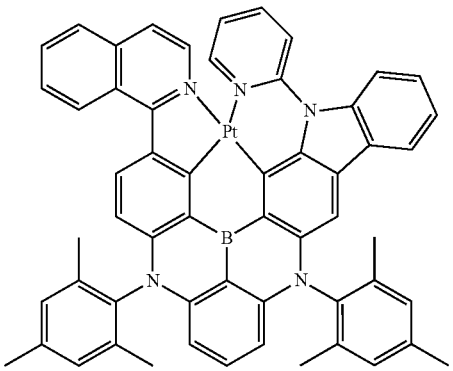
41 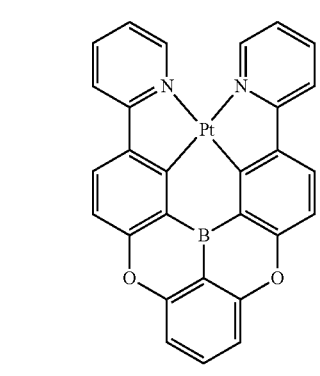
42 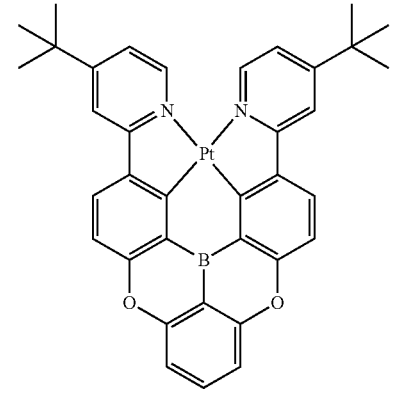
43 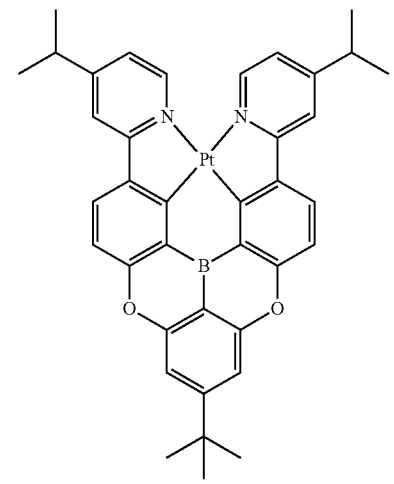

44
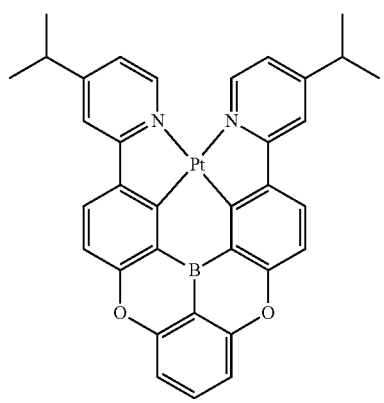
45
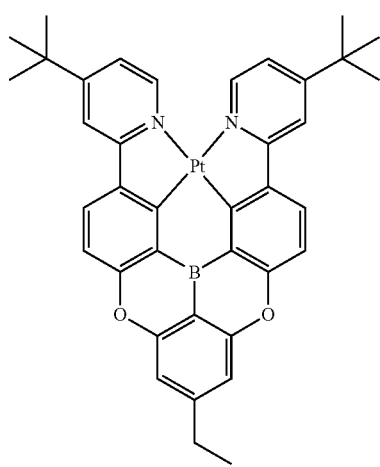
46
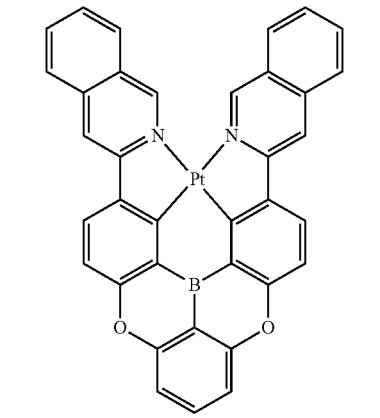
47
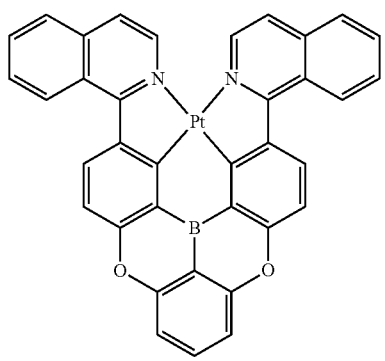
48
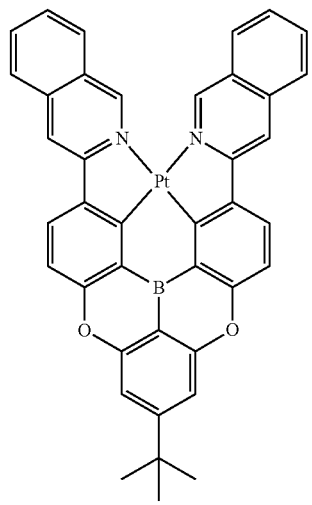
49
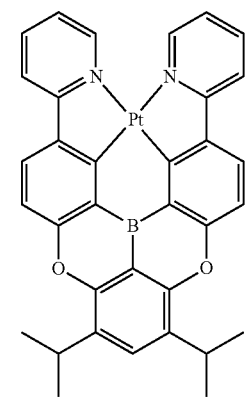
50
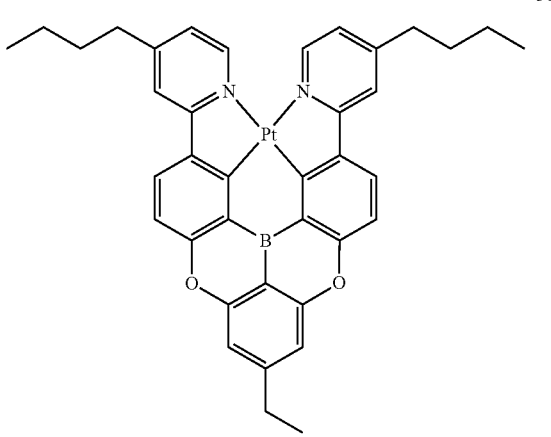

51
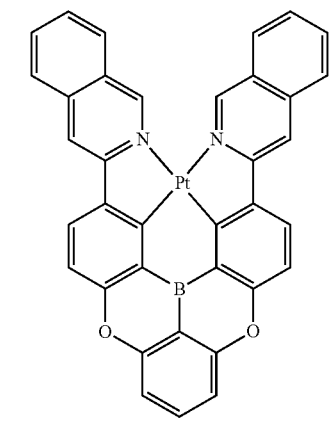
52
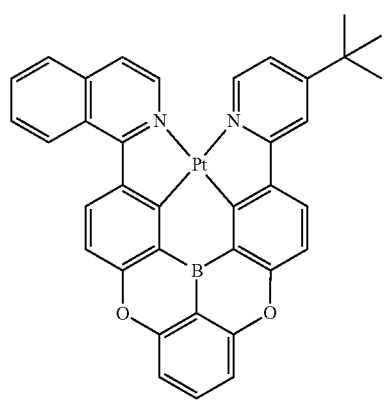
53
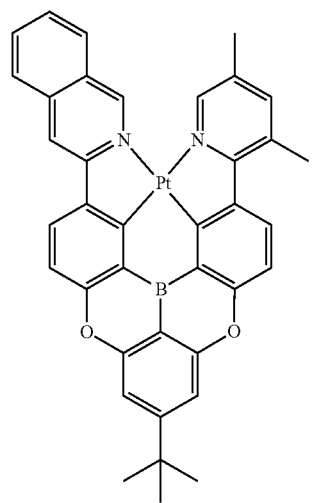
54
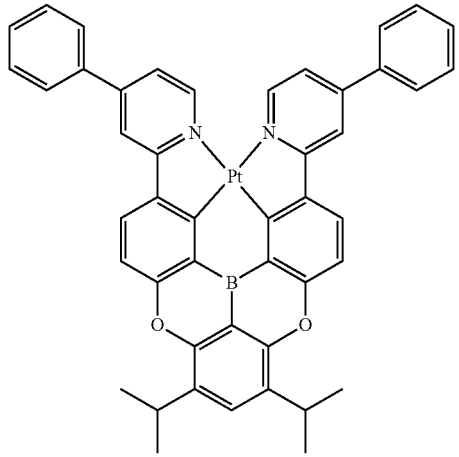
55
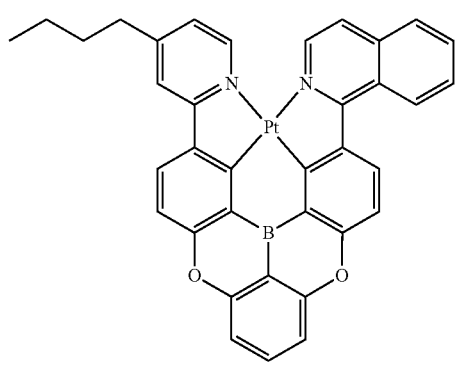
56
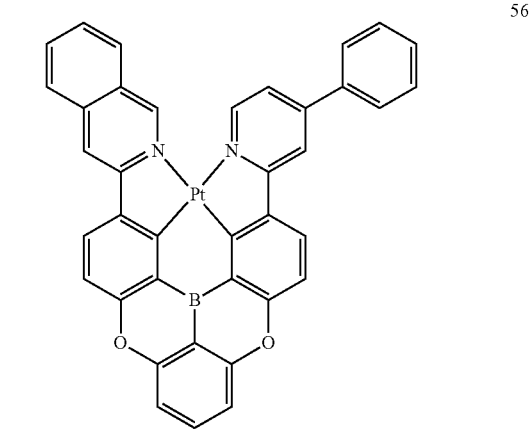
57
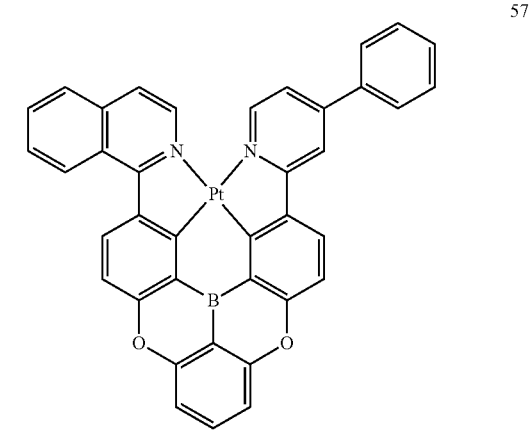

-continued
58
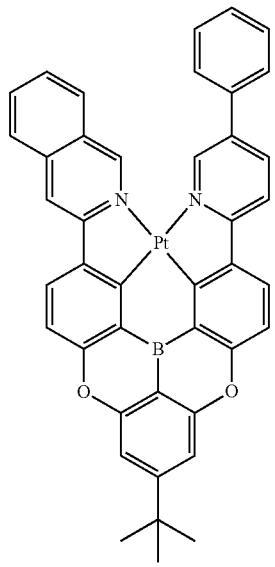
59
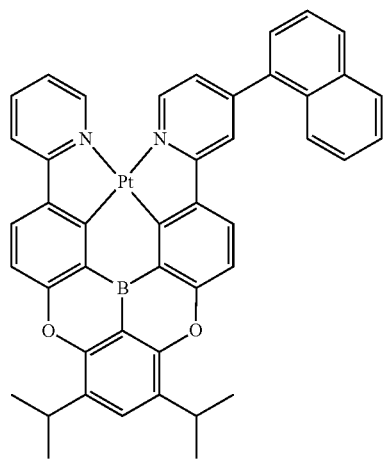
60
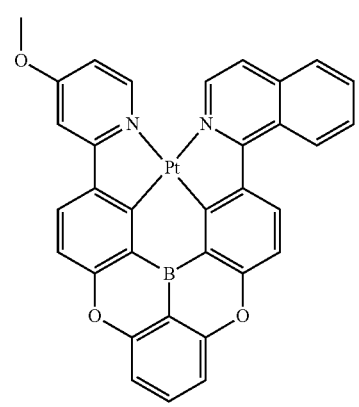
-continued
61
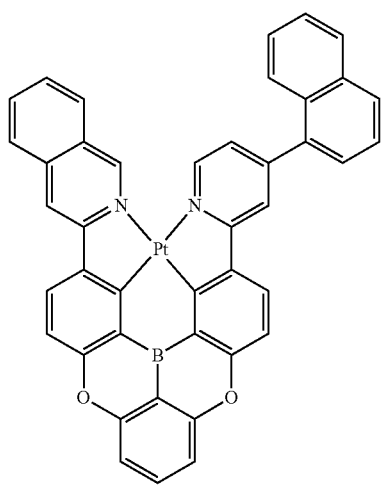
62
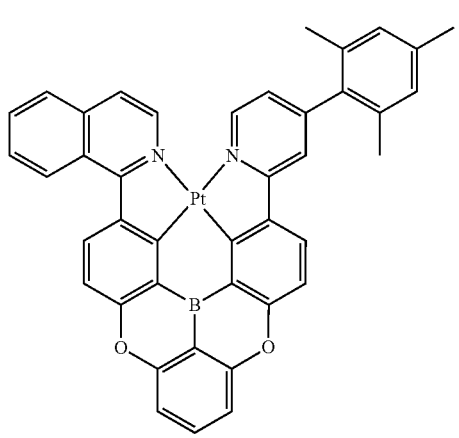
63
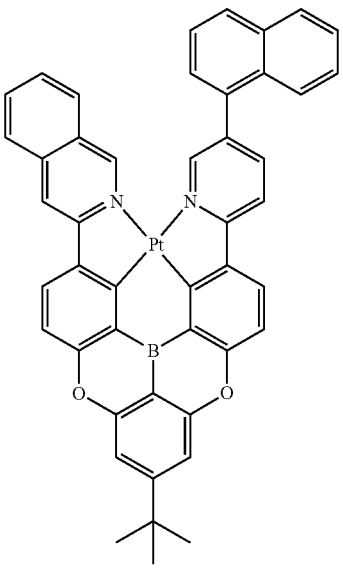

64
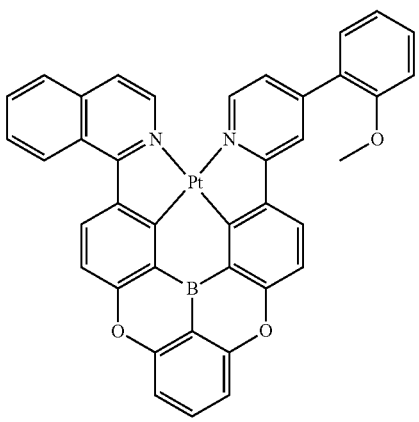
67
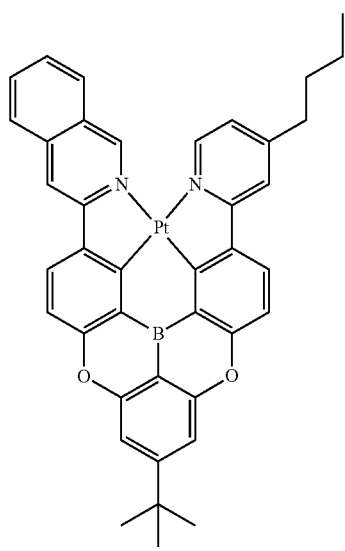
68
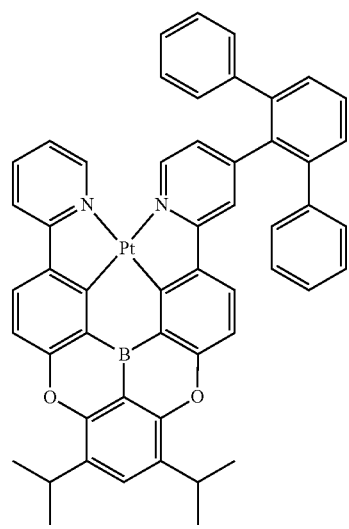
65
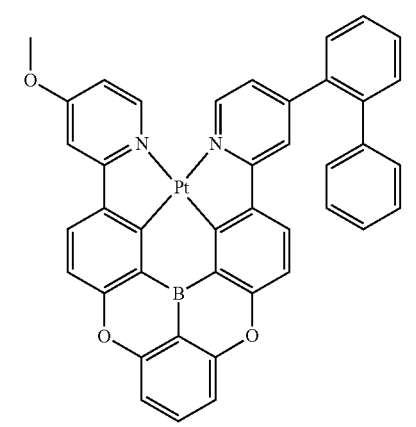
66
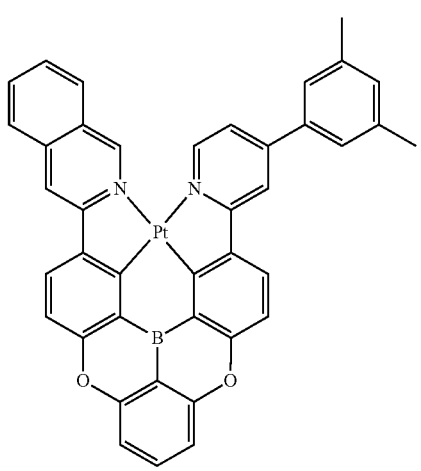
69
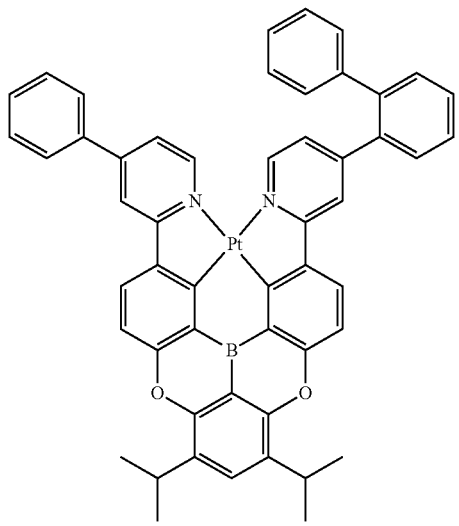

70
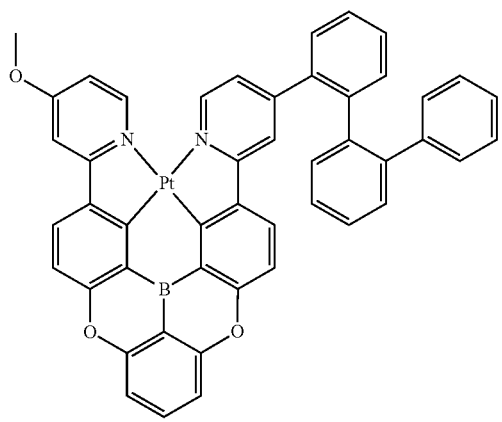
71
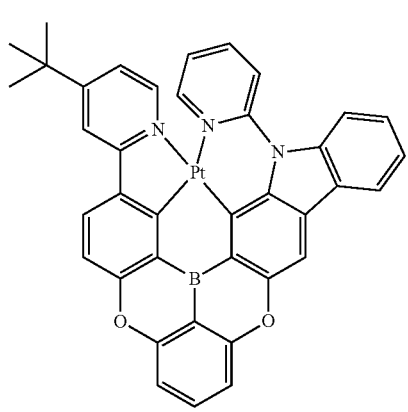
72
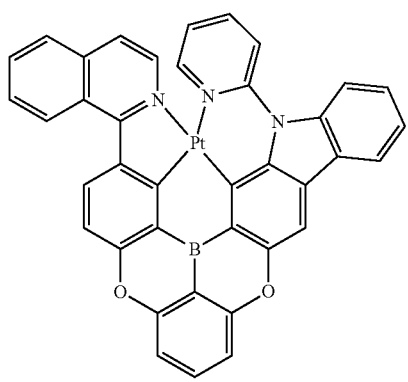
73
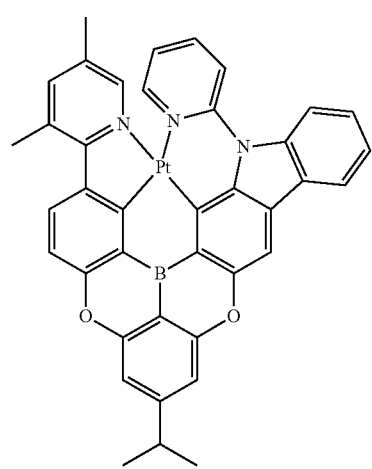
74
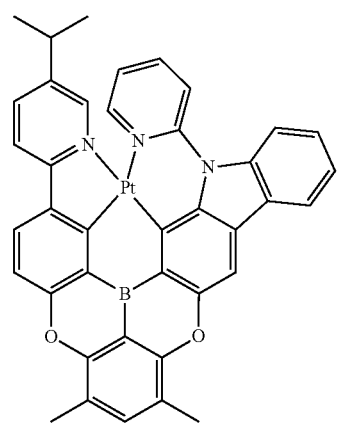
75
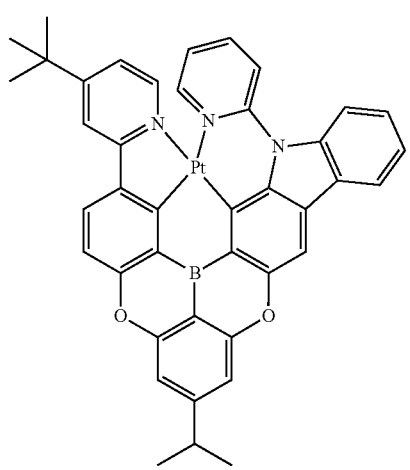
76
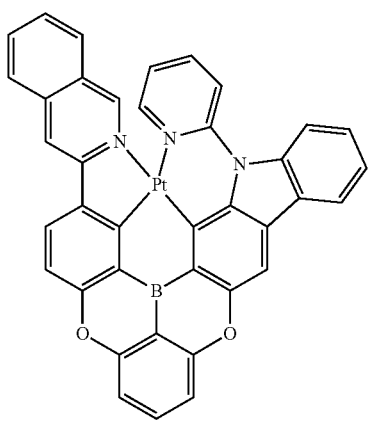

77
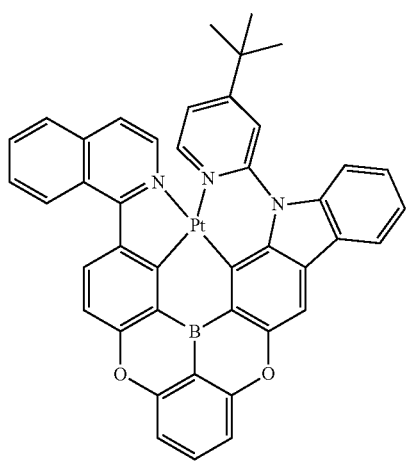
78
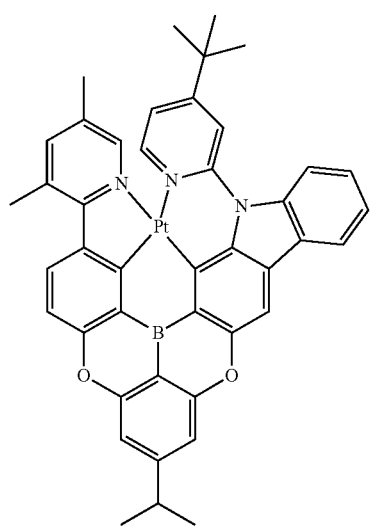
79
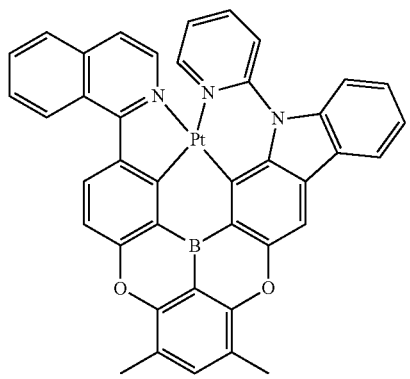
80
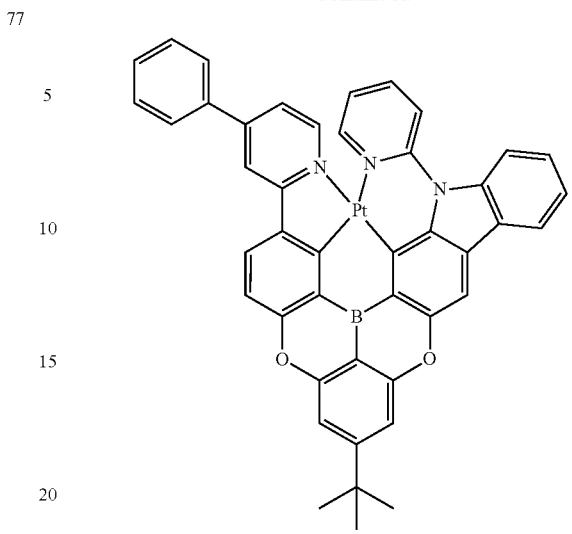
81
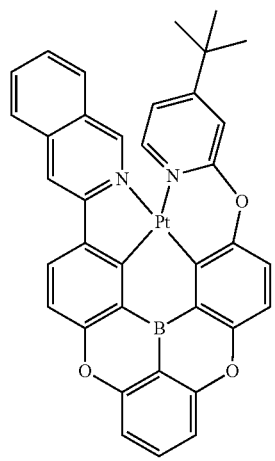
82
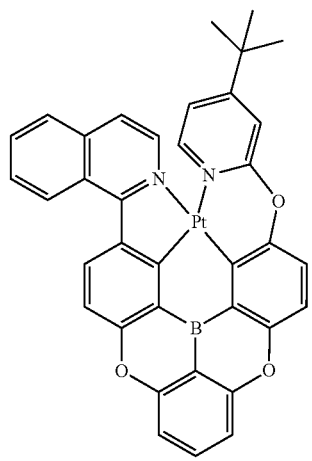

83
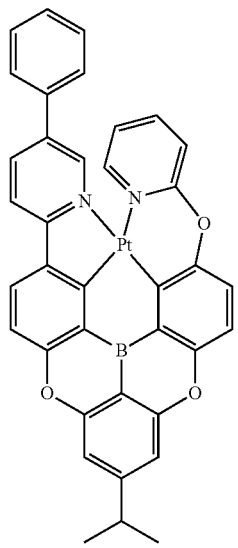
84
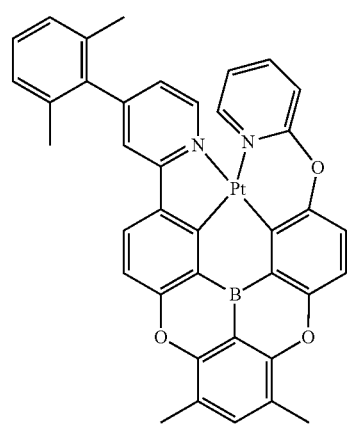
85
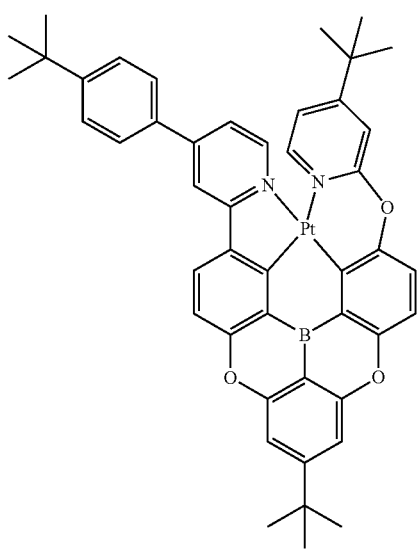
86
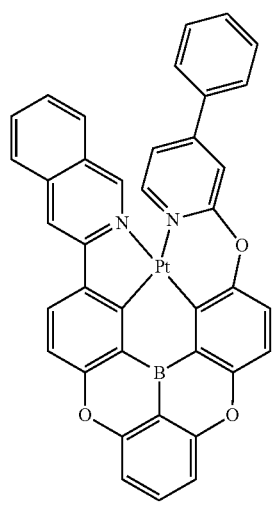
87
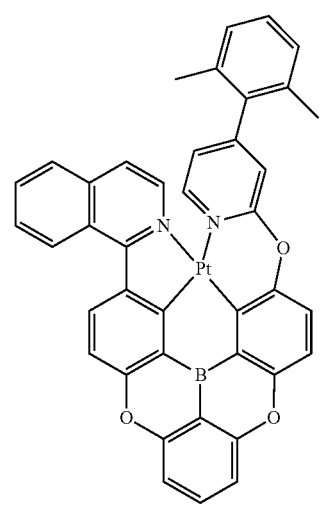
88
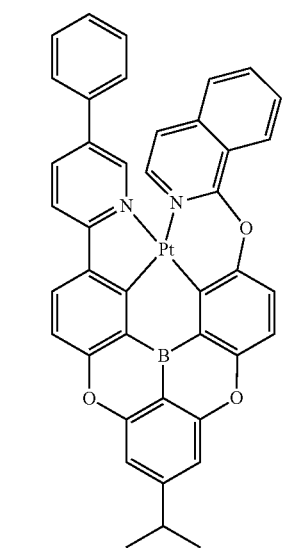

89
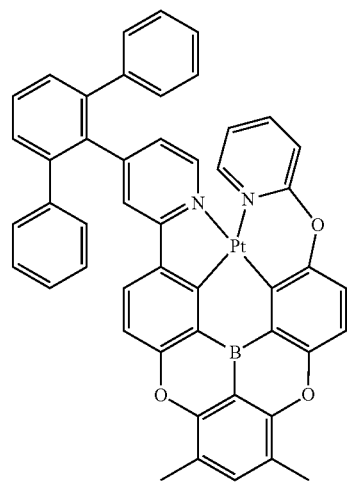
90
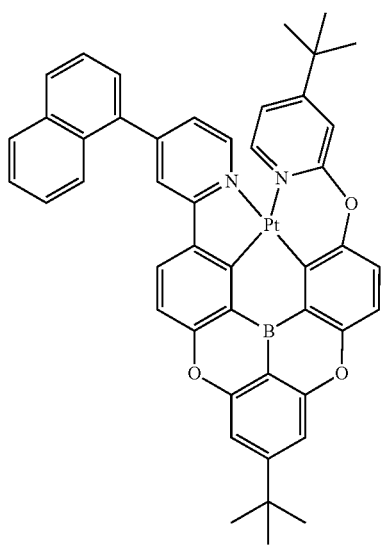
91
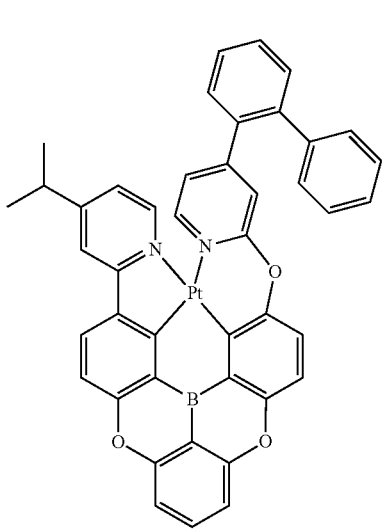
92
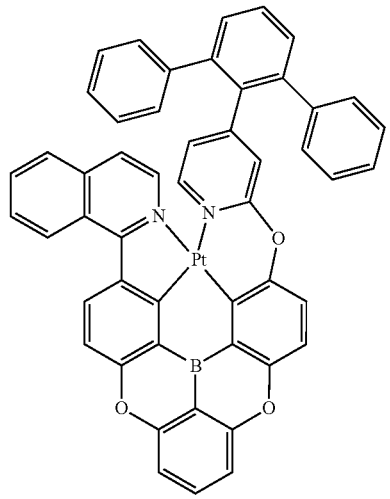
93
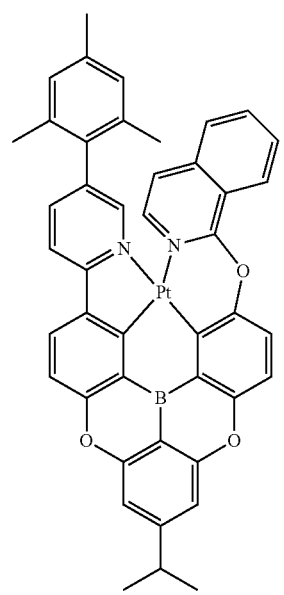
94
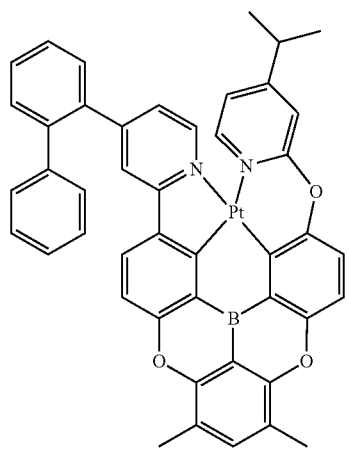

95
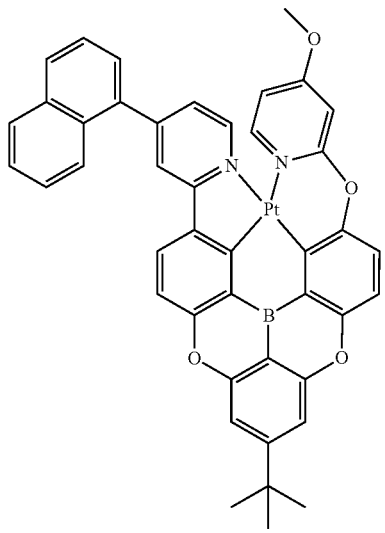
96
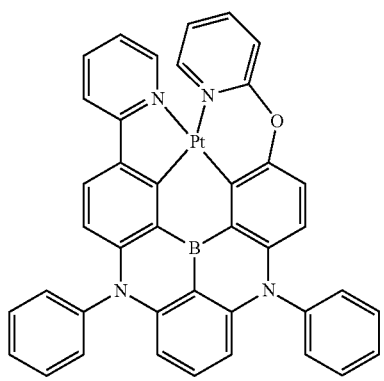
97
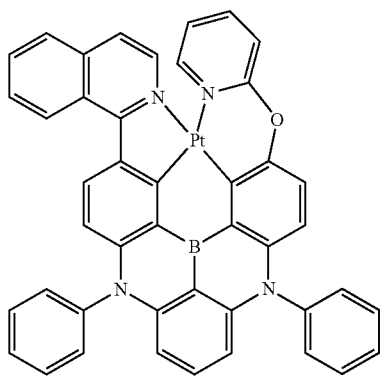
98
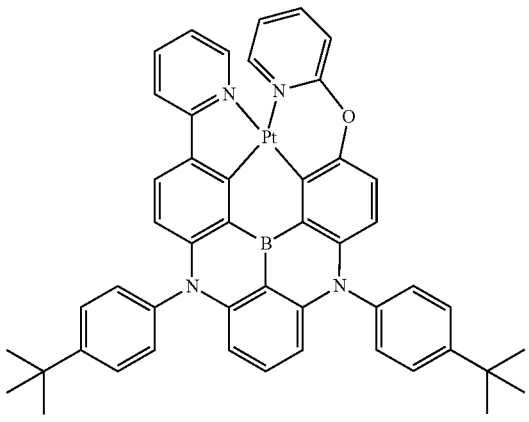
99
100
101
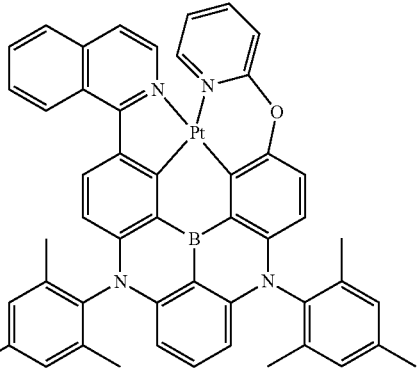
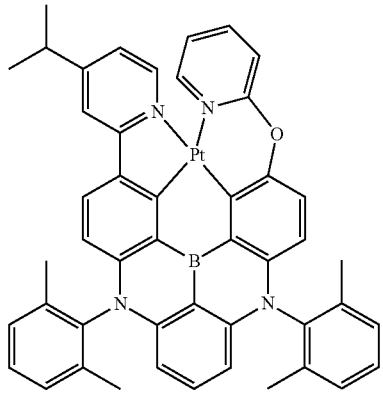

-continued
102
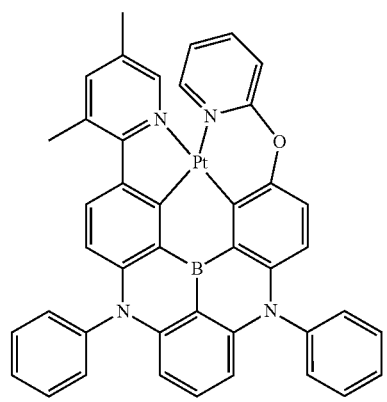
103
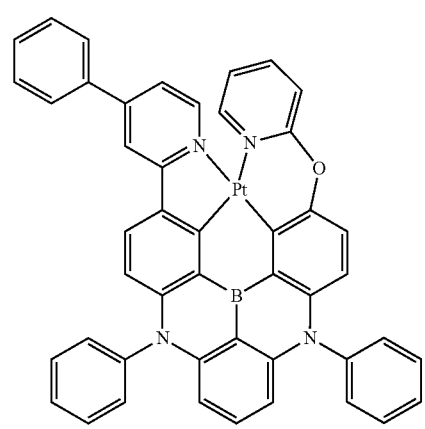
104
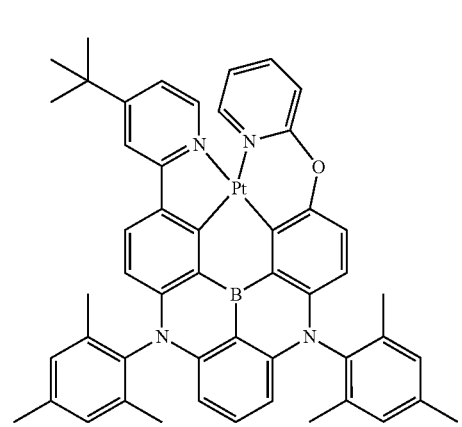
-continued
105
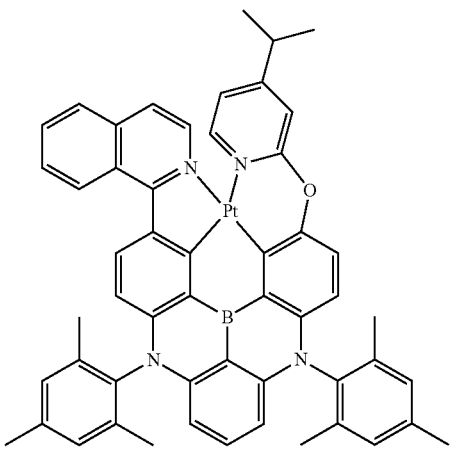
106
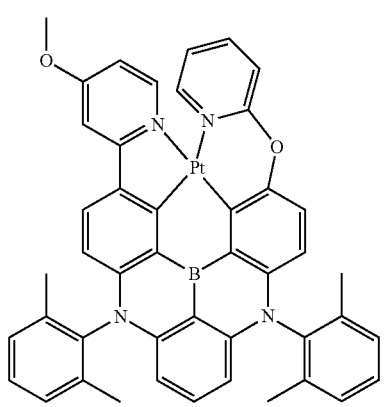
107
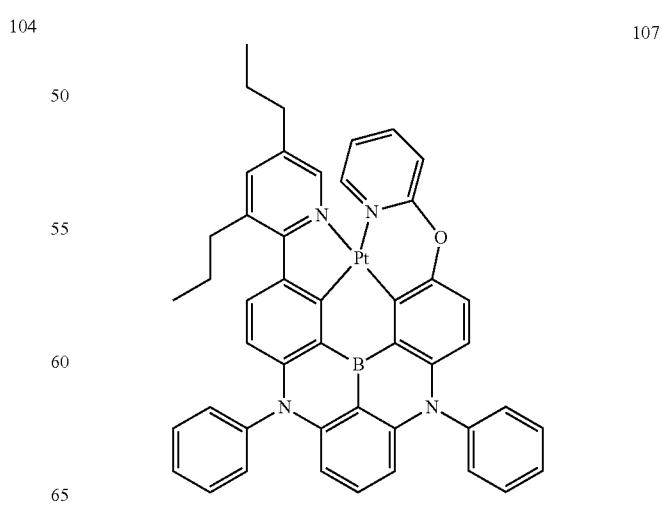

-continued

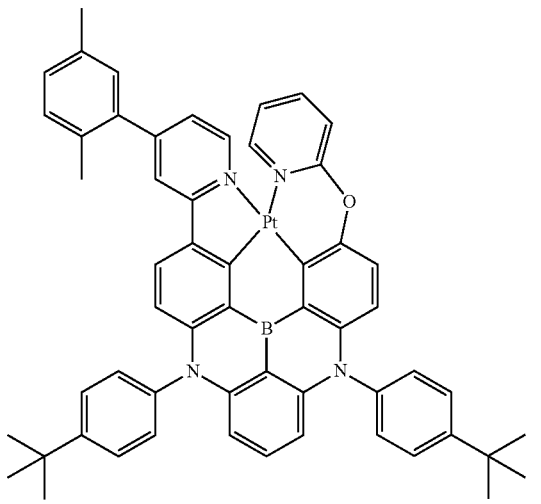

108

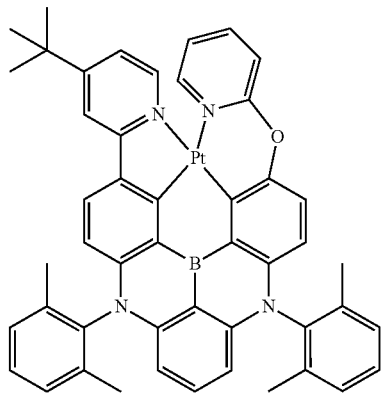

109

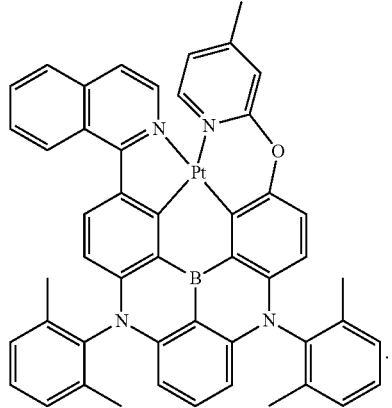

110

In an alternative aspect, the organic metal compound having the structure represented by one of Chemical Formulae 6 to 8 may comprise the compounds 1 to compounds 12 and compounds 31 to compounds 110 among the compounds having the structures represented by Chemical Formula 9.

Any organic metal compound having the structure represented by one of Chemical Formulae 2 to 9 comprises a central metal component that forms a coordination bond with planar tetravalent conformation, and a ligand consisting of plural fused aromatic or hetero aromatic rings. As the number of "d" orbital involved in the metal-ligand coordination is decreased, the compound has narrow FWHM and a rigid chemical conformation. The organic metal compound can improve its color purity and enhance its luminous efficiency as the molecular structure of the compound does not change in emitting light. Also, as the compound is a heteroleptic metal complex in which a different bidentate ligand is coordinated to the central metal, it is possible to adjust the luminescent color purity and luminous colors of the compound with ease. It is possible to implement an OLED having excellent luminous efficiency by applying the organic metal compound having any structure represented by Chemical Formulae 2 to 9.

Organic Light Emitting Device and OLED

It is possible to improve the luminous efficiency and luminous lifetime of the OLED by applying any organic metal compound having the structure represented by one of Chemical Formulae 1 to 9. The OLED of the present disclosure may be applied to an organic light emitting device such as an organic light emitting display device or an organic light emitting lamination device. An organic light emitting display device including the OLED will be explained.

FIG. 1 is a schematic circuit diagram illustrating an organic light emitting display device of the present disclosure. As illustrated in FIG. 1, a gate line GL cross each of a data line DL and a power line PL to define a pixel region P in the organic light display device. A switching thin film transistor Ts, a driving thin film transistor Td, a storage capacitor Cst and an OLED D are formed within the pixel region P. The pixel region P may include a red (R) pixel region, a green (G) pixel region and a blue (B) pixel region.

The switching thin film transistor Ts is connected to the gate line GL and the data line DL, and the driving thin film transistor Td and the storage capacitor Cst are connected between the switching thin film transistor Ts and the power line PL. The organic light emitting diode D is connected to the driving thin film transistor Td. When the switching thin film transistor Ts is turned on by a gate signal applied to the gate line GL, a data signal applied to the data line DL is applied to a gate electrode of the driving thin film transistor Td and one electrode of the storage capacitor Cst through the switching thin film transistor Ts.

The driving thin film transistor Td is turned on by the data signal applied to the gate electrode so that a current proportional to the data signal is supplied from the power line PL to the OLED D through the driving thin film transistor Td. And the organic light emitting diode D emits light having a luminance proportional to the current flowing through the driving thin film transistor Td. In this case, the storage capacitor Cst is charged with a voltage proportional to the data signal so that the voltage of the gate electrode in the driving thin film transistor Td is kept constant during one frame. Therefore, the organic light emitting display device can display a desired image.

Figure 2:
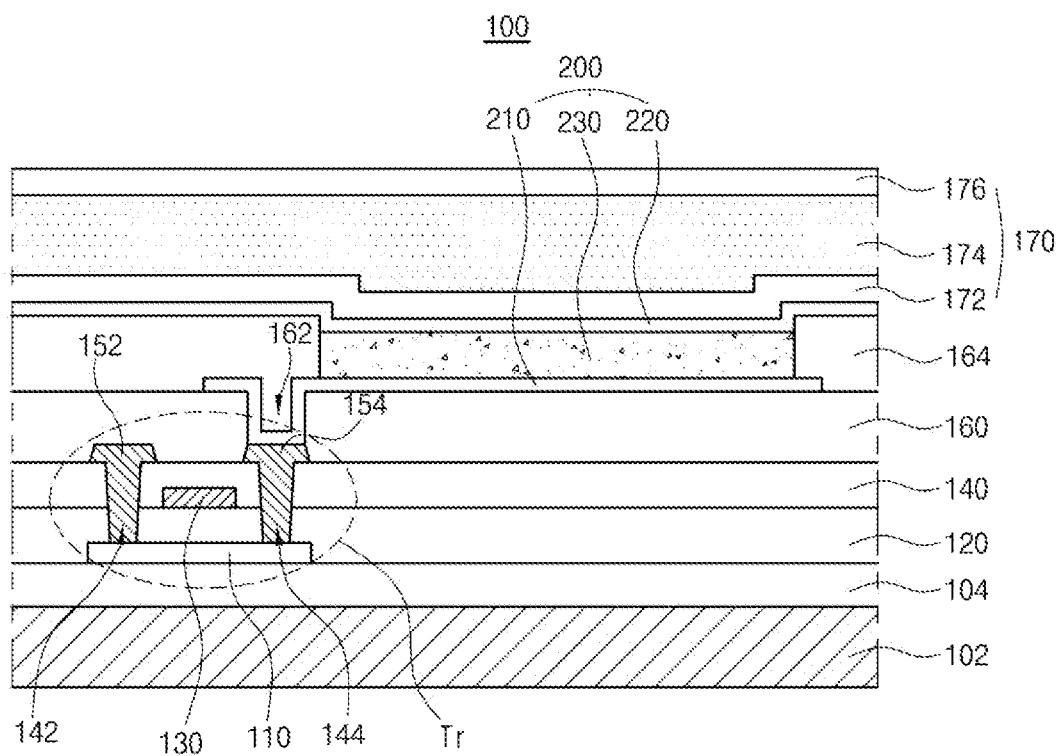
FIG. 2 is a schematic cross-sectional view illustrating an organic light emitting display device in accordance with an exemplary embodiment of the present disclosure.

FIG. 2 is a schematic cross-sectional view illustrating an organic light emitting display device in accordance with an exemplary embodiment of the present disclosure. As illustrated in FIG. 2, the organic light emitting display device 100 includes a substrate 102, a thin-film transistor Tr on the substrate 102, and an organic light emitting diode (OLED) 200 connected to the thin film transistor Tr. As an example, the substrate 102 defines a red pixel, a green pixel and a blue pixel and the OLED 200 is located in each pixel. In other words, the OLED 200, each of which emits red, green or blue light, is located correspondingly in the red pixel, the green pixel and the blue pixel.

The substrate 102 may include, but is not limited to, glass, thin flexible material and/or polymer plastics. For example, the flexible material may be selected from the group including, but is not limited to, polyimide (PI), polyethersulfone (PES), polyethylenenaphthalate (PEN), polyethylene terephthalate (PET), polycarbonate (PC) and combination thereof. The substrate 102, over which the thin film transistor Tr and the OLED 200 are arranged, form an array substrate.

A buffer layer 104 may be disposed over the substrate 102, and the thin film transistor Tr is disposed over the buffer layer 104. The buffer layer 104 may be omitted in some embodiments.

A semiconductor layer 110 is disposed over the buffer layer 104. In one exemplary aspect, the semiconductor layer 110 may include, but is not limited to, oxide semiconductor materials. In this case, a light-shield pattern may be disposed under the semiconductor layer 110, and the light-shield pattern can prevent light from being incident toward the semiconductor layer 110, and thereby, preventing the semiconductor layer 110 from being deteriorated by the light. Alternatively, the semiconductor layer 110 may include, but is not limited to, polycrystalline silicon. In this case, opposite edges of the semiconductor layer 110 may be doped with impurities.

A gate insulating layer 120 formed of an insulating material is disposed on the semiconductor layer 110. The gate insulating layer 120 may include, but is not limited to, an inorganic insulating material such as silicon oxide ($SiO_x$) or silicon nitride ($SiN_x$).

A gate electrode 130 made of a conductive material such as a metal is disposed over the gate insulating layer 120 so as to correspond to a center of the semiconductor layer 110. While the gate insulating layer 120 is disposed over the a whole area of the substrate 102 in FIG. 2, the gate insulating layer 120 may be patterned identically to the gate electrode 130.

An interlayer insulating layer 140 formed of an insulating material is disposed on the gate electrode 130 with covering over an entire surface of the substrate 102. The interlayer insulating layer 140 may include, but is not limited to, an inorganic insulating material such as silicon oxide ($SiO_x$) or silicon nitride ($SiN_x$), or an organic insulating material such as benzocyclobutene or photo-acryl.

The interlayer insulating layer 140 has first and second semiconductor layer contact holes 142 and 144 that expose both sides of the semiconductor layer 110. The first and second semiconductor layer contact holes 142 and 144 are disposed over opposite sides of the gate electrode 130 and are spaced apart from the gate electrode 130. The first and second semiconductor layer contact holes 142 and 144 are formed within the gate insulating layer 120 in FIG. 1. Alternatively, the first and second semiconductor layer contact holes 142 and 144 are formed only within the interlayer insulating layer 140 when the gate insulating layer 120 is patterned identically to the gate electrode 130.

A source electrode 152 and a drain electrode 154, which are formed of conductive material such as a metal, are disposed on the interlayer insulating layer 140. The source electrode 152 and the drain electrode 154 are spaced apart from each other with respect to the gate electrode 130, and contact both sides of the semiconductor layer 110 through the first and second semiconductor layer contact holes 142 and 144, respectively.

The semiconductor layer 110, the gate electrode 130, the source electrode 152 and the drain electrode 154 constitute the thin film transistor Tr, which acts as a driving element.

The thin film transistor Tr in FIG. 2 has a coplanar structure in which the gate electrode 130, the source electrode 152 and the drain electrode 154 are disposed over the semiconductor layer 110. Alternatively, the thin film transistor Tr may have an inverted staggered structure in which a gate electrode is disposed under a semiconductor layer and a source and drain electrodes are disposed over the semiconductor layer. In this case, the semiconductor layer may comprise amorphous silicon.

A gate line GL and a data line DL, which cross each other to define a pixel region P, and a switching element Ts, which is connected to the gate line GL and the data line DL, may be further formed in the pixel region P. The switching element Ts is connected to the thin film transistor Tr, which is a driving element. Besides, the power line PL is spaced apart in parallel from the gate line GL or the data line DL, and the thin film transistor Tr may further include a storage capacitor Cst configured to constantly keep a voltage of the gate electrode 130 for one frame.

A passivation layer 160 is disposed on the source and drain electrodes 152 and 154 over the whole substrate 102. The passivation layer 160 has a flat top surface and a drain contact hole 162 that exposes the drain electrode 154 of the thin film transistor Tr. While the drain contact hole 162 is disposed on the second semiconductor layer contact hole 144, it may be spaced apart from the second semiconductor layer contact hole 144.

The OLED 200 includes a first electrode 210 that is disposed on the passivation layer 160 and connected to the drain electrode 154 of the thin film transistor Tr. The OLED 200 further includes an emitting unit 230 as an emissive layer and a second electrode 220 each of which is disposed sequentially on the first electrode 210.

The first electrode 210 is disposed in each pixel region. The first electrode 210 may be an anode and include a conductive material having a relatively high work function value. For example, the first electrode 210 may include, but is not limited to, a transparent conductive material such as indium tin oxide (ITO), indium zinc oxide (IZO), indium tin zinc oxide (ITZO), tin oxide (SnO), zinc oxide (ZnO), indium cerium oxide (ICO), aluminum doped zinc oxide (AZO), and the like.

In one exemplary aspect, when the organic light emitting display device 100 is a top-emission type, a reflective electrode or a reflective layer may be disposed under the first electrode 210. For example, the reflective electrode or the reflective layer may include, but are not limited to, aluminum-palladium-copper (APC) alloy.

In addition, a bank layer 164 is disposed on the passivation layer 160 in order to cover edges of the first electrode 210. The bank layer 164 exposes a center of the first electrode 210.

An emitting unit 230 is disposed on the first electrode 210. In one exemplary aspect, the emitting unit 230 may have a mono-layered structure of an emitting material layer (EML). Alternatively, the emitting unit 230 may have a multiple-layered structure of a hole injection layer (HIL), a hole transport layer (HTL), an electron blocking layer (EBL), an EML, a hole blocking layer (HBL), an electron transport layer (ETL), an electron injection layer (EIL) and/or a charge generation layer (CGL) (see, FIGS. 3, 5-8). In one aspect, the OLED D may have a single emitting unit 230. Alternatively, the OLED 200 may have multiple emitting units 230 to form a tandem structure.

The emitting unit 230 comprises anyone having the structure represented by Chemical Formulae 1 to 9. As the emitting unit 230 comprises anyone having the structure represented by one of Chemical Formulae 1 to 9, the OLED 200 can improve its luminous efficiency and luminous lifetime significantly.

The second electrode 220 is disposed over the substrate 102 above which the emitting unit 230 is disposed. The second electrode 220 may be disposed over a whole display area and may include a conductive material with a relatively low work function value compared to the first electrode 210. The second electrode 220 may be a cathode. For example, the second electrode 220 may include, but is not limited to, aluminum (Al), magnesium (Mg), calcium (Ca), silver (Ag), alloy thereof or combination thereof such as aluminum-magnesium alloy (Al—Mg).

In addition, an encapsulation film 170 may be disposed over the second electrode 220 in order to prevent outer moisture from penetrating into the OLED 200. The encapsulation film 170 may have, but is not limited to, a laminated structure of a first inorganic insulating film 172, an organic insulating film 174 and a second inorganic insulating film 176.

Moreover, a polarizer may be attached to the encapsulation film 170 in order to decrease external light reflection. For example, the polarizer may be a circular polarizer. In addition, a cover window may be attached to the encapsulation film 170 or the polarizer. In this case, the substrate 102 and the cover window may have a flexible property, thus the organic light emitting display device 100 may be a flexible display device.

Figure 3:
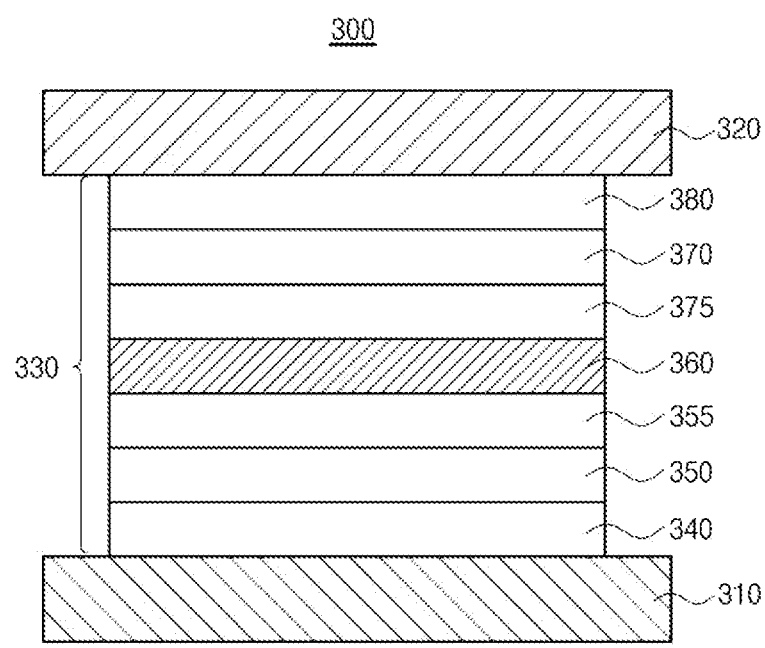
FIG. 3 is a schematic cross-sectional view illustrating an OLED in accordance with an exemplary embodiment of the present disclosure.

Now, we will explain the OLED having the organic metal compound in more detail. FIG. 3 is a schematic cross-sectional view illustrating an OLED in accordance with an exemplary embodiment of the present disclosure. As illustrated in FIG. 3, the OLED 300 includes first and second electrodes 310 and 320 facing each other and an emitting unit 330 disposed between the first and second electrodes 310 and 320. In one exemplary aspect, the emitting unit 330 comprises a HIL 340, a HTL 350, an EML 360, an ETL 370 and an EIL 380 each of which may be disposed sequentially between the first and second electrodes 310 and 320. Alternatively, the emitting unit 330 may further comprise a first exciton blocking layer, i.e., an EBL 355 disposed between the HTL 350 and the EML 360 and/or a second exciton blocking layer, i.e., a HBL 375 disposed between the EML 360 and the ETL 370.

The first electrode 310 may be an anode that provides a hole into the EML 360. The first electrode 310 may include, but is not limited to, a conductive material having a relatively high work function value, for example, a transparent conductive oxide (TCO). In an exemplary aspect, the first electrode 310 may include, but is not limited to, ITO, IZO, ITZO, SnO, ZnO, ICO, AZO, and the like.

The second electrode 320 may be a cathode that provides an electron into the EML 360. The second electrode 320 may include, but is not limited to, a conductive material having a relatively low work function values, i.e., a highly reflective material such as Al, Mg, Ca, Ag, alloy thereof, combination thereof, and the like. As an example, each of the first electrode 310 and the second electrode 320 may have a thickness, but is not limited to, about 30 nm to about 300 nm.

The HIL 340 is disposed between the first electrode 310 and the HTL 350 and improves an interface property between the inorganic first electrode 310 and the organic HTL 350. In one exemplary aspect, the HIL 340 may include, but is not limited to, 4,4'4"-Tris(3-methylphenylamino)triphenylamine (MTDATA), 4,4',4"-Tris(N,N-diphenyl-amino)triphenylamine (NATA), 4,4',4"-Tris(N-(naphthalene-1-yl)-N-phenyl-amino)triphenylamine (1T-NATA), 4,4',4"-Tris(N-(naphthalene-2-yl)-N-phenyl-amino)triphenylamine (2T-NATA), Copper phthalocyanine (CuPc), Tris(4-carbazoyl-9-yl-phenyl)amine (TCTA), N,N'-Diphenyl-N,N'-bis(1-naphthyl)-1,1'-biphenyl-4,4"-diamine (NPB; NPD), 1,4,5,8,9,11-Hexaazatriphenylenehexacarbonitrile (Dipyrazino[2,3-f:2'3'-h]quinoxaline-2,3,6,7,10,11-hexacarbonitrile; HAT-CN), 1,3,5-tris[4-(diphenylamino)phenyl]benzene (TDAPB), poly(3,4-ethylenedioxythiophene)polystyrene sulfonate (PEDOT/PSS), N-(biphenyl-4-yl)-9,9-dimethyl-N-(4-(9-phenyl-9H-carbazol-3-yl)phenyl)-9H-fluoren-2-amine and/or N,N'-diphenyl-N,N'-di[4-(N,N-diphenyl-amino)phenyl]benzidine (NPNPB). The HIL 340 may be omitted in compliance with a structure of the OLED 300.

The HTL 350 is disposed adjacently to the EML 360 between the first electrode 310 and the EML 360. In one exemplary aspect, the HTL 350 may include, but is not limited to, N,N'-Diphenyl-N,N'-bis(3-methylphenyl)-1,1'-biphenyl-4,4'-diamine (TPD), NPB, 4,4'-bis(N-carbazolyl)-1,1'-biphenyl (CBP), Poly[N,N'-bis(4-butylphenyl)-N,N'-bis(phenyl)-benzidine] (Poly-TPD), Poly[(9,9-dioctylfluorenyl-2,7-diyl)-co-(4,4'-(N-(4-sec-butylphenyl) diphenylamine))] (TFB), Di-[4-(N,N-di-p-tolyl-amino)-phenyl]cyclohexane (TAPC), 3,5-Di(9H-carbazol-9-yl)-N,N-diphenylaniline; DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine and/or N-([1,1'-Biphenyl]-4-yl)-9,9-dimethyl-N-(4-(9-phenl-9H-carbazol-3-yl)phenyl)-9H-fluoren-2-amine. As an example, each of the HIL 340 and the HTL 350 may have a thickness of, but is not limited to, about 5 nm to about 200 nm, preferably about 5 nm to about 100 nm.

The EML 360 comprises a (first) host and a (second) dopant where the substantial light emission is occurred. As an example, the EML 360 may emit green or yellow-green light, and any organic metal complex having the structure represented by one of Chemical Formulae 1 to 9 may be used as the dopant.

The ETL 370 and the EIL 380 may be laminated sequentially between the EML 360 and the second electrode 320. The ETL 370 includes a material having high electron mobility so as to provide electrons stably with the EML 360 by fast electron transportation.

In one exemplary aspect, the ETL 370 may comprise, but is not limited to, oxadiazole-based compounds, triazole-based compounds, phenanthroline-based compounds, benzoxazole-based compounds, benzothiazole-based compounds, benzimidazole-based compounds, triazine-based compounds, and the like.

As an example, the ETL 370 may comprise, but is not limited to, tris-(8-hydroxyquinoline aluminum ($Alq_3$), 2-biphenyl-4-yl-5-(4-t-butylphenyl)-1,3,4-oxadiazole (PBD), spiro-PBD, lithium quinolate (Liq), 1,3,5-Tris(N-phenyl-benzimidazol-2-yl)benzene (TPBi), Bis(2-methyl-8-quinolinolato-N1,O8)-(1,1'-biphenyl-4-olato)aluminum (BAlq), 4,7-diphenyl-1,10-phenanthroline (Bphen), 2,9-Bis(naphthalene-2-yl)4,7-diphenyl-1,10-phenanthroline (NBphen), 2,9-Dimethyl-4,7-diphenyl-1,10-phenanthroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl)biphenyl-3-yl)1,3,5-triazine (TmPPPyTz), Poly[9,9-bis(3'-(N,N-dimethyl)-N-ethylammonium)-propyl)-2,7-fluorene]-alt-2,7-(9,9-dioctylfluorene)] (PFNBr), tris(phenylquinoxaline) (TPQ), Diphenyl-4-triphenylsilyl-phenylphosphine oxide (TSPO1), 2-[4-(9, 10-Di-2-naphthalen2-yl-2-anthracen-2-yl)phenyl]-1-phenyl-1H-benzimidazole (ZADN) and combination thereof.

The EIL 380 is disposed between the second electrode 320 and the ETL 370, and can improve physical properties of the second electrode 320 and therefore, can enhance the lifetime of the OLED 300. In one exemplary aspect, the EIL 380 may comprise, but is not limited to, an alkali halide such as LiF, CsF, NaF, $BaF_2$ and the like, and/or an organic metal compound such as lithium quinolate, lithium benzoate, sodium stearate, and the like. As an example, each of the ETL 370 and the EIL 380 may have a thickness of, but is not limited to, about 10 to about 200 nm, preferably about 10 nm to about 100 nm.

When holes are transferred to the second electrode 320 via the EML 360 and/or electrons are transferred to the first electrode 310 via the EML 360, the OLED 300 may have short lifetime and reduced luminous efficiency. In order to prevent these phenomena, the OLED 300 in accordance with this embodiment of the present disclosure may have at least one exciton blocking layer adjacent to the EML 360.

For example, the OLED 300 includes the EBL 355 between the HTL 350 and the EML 360 so as to control and prevent electron transfers. In one exemplary aspect, the EBL 355 may comprise, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, 1,3-Bis(carbazol-9-yl)benzene (mCP), 3,3'-bis(N-carbazolyl)-1,1'-biphenyl (mCBP), CuPc, N,N'-bis[4-(bis(3-methylphenyl)amino)phenyl]-N,N'-diphenyl-[1,1'-biphenyl]-4,4'-diamine (DNTPD), TDAPB, DCDPA and/or 2,8-bis(9-phenyl-9H-carbazol-3-yl)dibenzo[b,d]thiophene.

In addition, the OLED 300 may further include the HBL 375 as a second exciton blocking layer between the EML 360 and the ETL 370 so that holes cannot be transferred from the EML 360 to the ETL 375. In one exemplary aspect, the HBL 375 may comprise, but is not limited to, oxadiazole-based compounds, triazole-based compounds, phenanthroline-based compounds, benzoxazole-based compounds, benzothiazole-based compounds, benzimidazole-based compounds, and triazine-based compounds each of which can be used in the ETL 370.

For example, the HBL 375 may comprise a compound having a relatively low HOMO energy level compared to the luminescent materials in EML 360. The HBL 375 may comprise, but is not limited to, BCP, BAlq, $Alq_3$, PBD, spiro-PBD, Liq, Bis-4,5-(3,5-di-3-pyridylphenyl)-2-methylpyrimidine (B3PYMPM), DPEPO, 9-(6-(9H-carbazol-9-yl)pyridine-3-yl)-9H-3,9'-bicarbazole, TSPO1 and combination thereof.

As described above, the EML 360 may comprise the first host and the first dopant and the first dopant comprises any organic metal compound having the structure represented by one of Chemical Formulae 1 to 9. The host that can be used together with the first dopant may comprise, but is not limited to, 9-(3-(9H-carbazol-9-yl)phenyl)-9H-carbazole-3-carbonitrile (mCP-CN), CBP, mCBP, mCP, DPEPO, 2,8-bis(diphenylphosphoryl)dibenzothiophene (PPT), 1,3,5-Tri[(3-pyridyl)-phen-3-yl]benzene (TmPyPB), 2,6-Di(9H-carbazol-9-yl)pyridine (PYD-2Cz), 2,8-di(9H-carbazol-9-yl)dibenzothiophene (DCzDBT), 3',5'-Di(carbazol-9-yl)[1,1'-bipheyl]-3,5-dicarbonitrile (DCzTPA), 4'-(9H-carbazol-9-yl)biphenyl-3,5-dicarbonitrile(4'-(9H-carbazol-9-yl)biphenyl-3,5-dicarbonitrile (pCzB-2CN), 3'-(9H-carbazol-9-yl)biphenyl-3,5-dicarbonitrile (mCzB-2CN), TSPO1,9-(9-phenyl-9H-carbazol-6-yl)-9H-carbazole (CCP), 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicabazole, 9,9'-Diphenyl-9H,9'H-3,3'-bicarbazole (BCzPh), 1,3,5-Tris(carbazole-9-yl)benzene (TCP), TCTA, 4,4'-Bis(carbazole-9-yl)-2,2'-dimethylbipheyl (CDBP), 2,7-Bis(carbazole-9-yl)-9,9-dimethylfluorene (DMFL-CBP), 2,2',7,7'-Tetrakis(carbazole-9-yl)-9,9-spiorofluorene (Spiro-CBP) and 3,6-Bis(carbazole-9-yl)-9-(2-ethyl-hexyl)-9H-carbazole (TCz1).

As an example, the contents of the first dopant in the EML 360 may be about 1 wt % to about 50 wt %, preferably about 1 wt % to about 30 wt %. The EML 360 may have a thickness of, but is not limited to, about 10 nm to about 200 nm, preferably about 20 nm to about 100 nm, and more preferably about 20 nm to about 50 nm.

The organic metal compound having the structure represented by one of Chemical Formulae 1 to 9 has a less d orbital which is involved between the metal and the ligand, thus its FWHM is very narrow. Since the compound has a rigid chemical conformation, its stable chemical conformation is maintained in emitting light and its color purity and luminous lifetime is increased. Its luminescence color can be adjusted by modifying the structure of the heterologous ligands and the group substituted to the ligands. Accordingly, the OLED 300 can improve its luminous efficiency and luminous lifetime.

In the above embodiment, the OLED having a single emitting unit that emits green (G) or yellow-green (YG) color light and the organic light emitting device is described. A full-color display device including white (W) luminescence can be realized.

Figure 4:
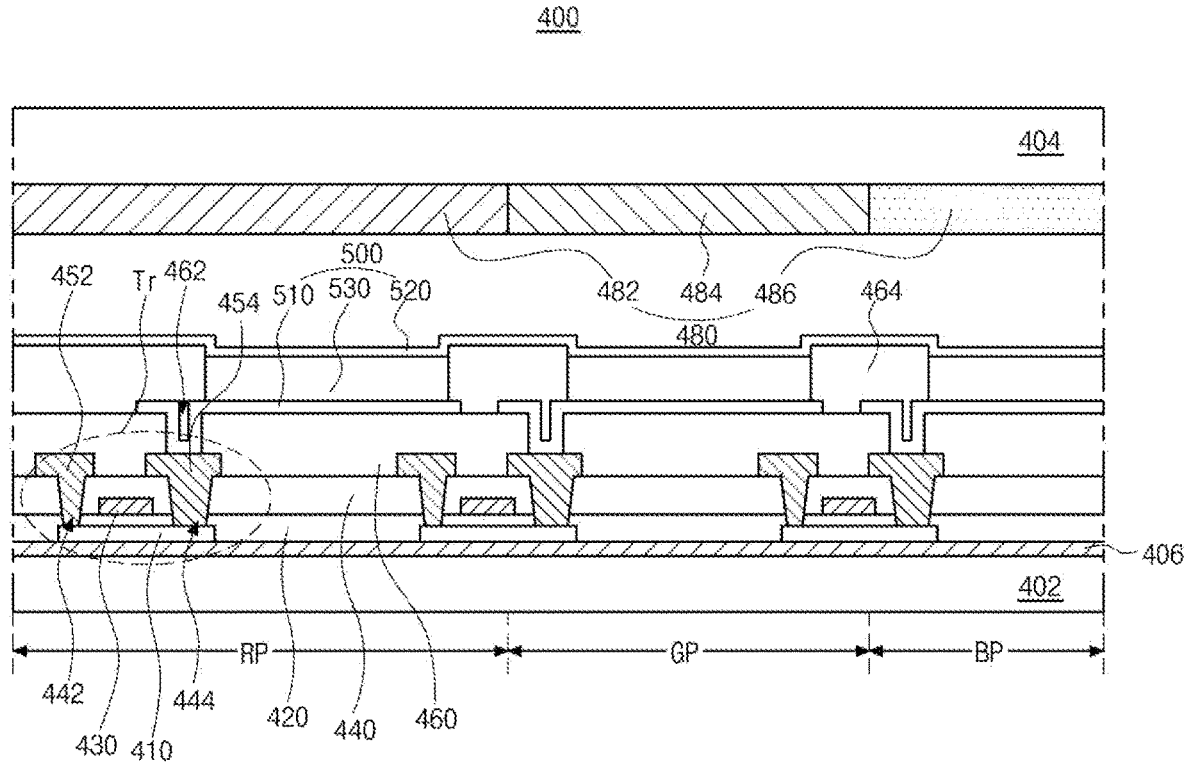
FIG. 4 is a schematic cross-sectional view illustrating an organic light emitting display device in accordance with another exemplary embodiment of the present disclosure.

FIG. 4 is a schematic cross-sectional view illustrating an organic light emitting display device in accordance with another exemplary embodiment of the present disclosure. As illustrated in FIG. 4, the organic light emitting display device 400 comprises a first substrate 402 that defines each of a red pixel RP, a green pixel GP and a blue pixel BP, a second substrate 404 facing the first substrate 402, a thin film transistor Tr over the first substrate 402, an OLED 500 disposed between the first and second substrates 402 and 404 and emitting white (W) light and a color filter layer 480 disposed between the OLED 500 and the second substrate 404.

Each of the first and second substrates 402 and 404 may include, but is not limited to, glass, flexible material and/or polymer plastics. For example, each of the first and second substrates 402 and 404 may be made of PI, PES, PEN, PET, PC and combination thereof. The first substrate 402, over which a thin film transistor Tr and the OLED 500 are arranged, forms an array substrate.

A buffer layer 406 may be disposed over the first substrate 402, and the thin film transistor Tr is disposed over the buffer layer 406 correspondingly to each of the red pixel RP, the green pixel GP and the blue pixel BP. The buffer layer 406 may be omitted.

A semiconductor layer 410 is disposed over the buffer layer 406. The semiconductor layer 410 may be made of oxide semiconductor material or polycrystalline silicon.

A gate insulating layer 420 including an insulating material, for example, inorganic insulating material such as silicon oxide ($SiO_x$) or silicon nitride ($SiN_x$) is disposed on the semiconductor layer 410.

A gate electrode 430 made of a conductive material such as a metal is disposed over the gate insulating layer 420 so as to correspond to a center of the semiconductor layer 410.

An interlayer insulting layer 440 including an insulating material, for example, inorganic insulating material such as silicon oxide ($SiO_x$) or silicon nitride ($SiN_x$), or an organic insulating material such as benzocyclobutene or photo-acryl, is disposed on the gate electrode 430.

The interlayer insulating layer 440 has first and second semiconductor layer contact holes 442 and 444 that expose both sides of the semiconductor layer 410. The first and second semiconductor layer contact holes 442 and 444 are disposed over opposite sides of the gate electrode 430 with spacing apart from the gate electrode 430.

A source electrode 452 and a drain electrode 454, which are made of a conductive material such as a metal, are disposed on the interlayer insulating layer 440. The source electrode 452 and the drain electrode 454 are spaced apart from each other with respect to the gate electrode 430, and contact both sides of the semiconductor layer 410 through the first and second semiconductor layer contact holes 442 and 444, respectively.

The semiconductor layer 410, the gate electrode 430, the source electrode 452 and the drain electrode 454 constitute the thin film transistor Tr, which acts as a driving element.

Although not shown in FIG. 4, a gate line GL and a data line DL, which cross each other to define a pixel region P, and a switching element Ts, which is connected to the gate line GL and the data line DL, is may be further formed in the pixel region P. The switching element Ts is connected to the thin film transistor Tr, which is a driving element. In addition, a power line PL is spaced apart in parallel from the gate line GL or the data line DL, and the thin film transistor Tr may further include a storage capacitor Cst configured to constantly keep a voltage of the gate electrode 430 for one frame (see, FIG. 1).

A passivation layer 460 is disposed on the source and drain electrodes 452 and 454 with covering the thin film transistor Tr over the whole first substrate 402. The passivation layer 460 has a drain contact hole 462 that exposes the drain electrode 454 of the thin film transistor Tr.

The OLED 500 is located over the passivation layer 460. The OLED 500 includes a first electrode 510 that is connected to the drain electrode 454 of the thin film transistor Tr, a second electrode 520 facing the first electrode 510 and an emissive layer 530 disposed between the first and second electrodes 510 and 520.

The first electrode 510 formed for each pixel region may be an anode and may include a conductive material having relatively high work function value. For example, the first electrode 510 may include, ITO, IZO, ITZO, SnO, ZnO, ICO, AZO, and the like. Alternatively, a reflective electrode or a reflective layer (not shown) may be disposed under the first electrode 510. For example, the reflective electrode or the reflective layer (not shown) may include, but is not limited to, APC alloy.

A bank layer 464 is disposed on the passivation layer 460 in order to cover edges of the first electrode 510. The bank layer 464 exposes a center of the first electrode 510 corresponding to each of the red pixel RP, the green pixel GP and the blue pixel BP. The bank layer 464 may be omitted.

An emissive layer 530 including emitting units are disposed on the first electrode 510. As illustrated in FIGS. 5 to 8, the emissive layer 530 may include multiple emitting units 630, 730, 730A, 830, 930, 930A, 1030 and 1030A and at least one charge generation layer 690, 890 and 990. Each of the emitting units 630, 730, 730A, 830, 930, 930A, 1030 and 1030A includes an emitting material layer and may further include a HIL, a HTL, an EBL, a HBL, an ETL and/or an EIL.

The second electrode 520 is disposed over the first substrate 402 above which the emissive layer 530 is disposed. The second electrode 520 may be disposed over a whole display area, and may include a conductive material with a relatively low work function value compared to the first electrode 510, and may be a cathode. For example, the second electrode 520 may include, but is not limited to, aluminum (Al), magnesium (Mg), calcium (Ca), silver (Ag), alloy thereof or combination thereof such as aluminum-magnesium alloy (Al—Mg).

Since the light emitted from the emissive layer 530 is incident to the color filter layer 480 through the second electrode 520 in accordance with this embodiment, the second electrode 520 has a thin thickness so that the light can be transmitted.

The color filter layer 480 is disposed over the OLED 500 and includes a red color filter 482, a green color filter 484 and a blue color filter 486 each of which is disposed correspondingly to the red pixel RP, the green pixel GP and the blue pixel BP, respectively. Although not shown in FIG. 4, the color filter layer 480 may be attached to the OLED 500 via an adhesive layer. Alternatively, the color filter layer 480 may be disposed directly on the OLED 500.

In addition, an encapsulation film (not shown) may be disposed over the second electrode 520 in order to prevent outer moisture from penetrating into the OLED 500. The encapsulation film (not shown) may have, but is not limited to, a laminated structure of a first inorganic insulating film (not shown), an organic insulating film (not shown) and a second inorganic insulating film (not shown) (See, 170 in FIG. 2). In addition, a polarizing plate (not shown) may be attached onto the second substrate 404 to reduce reflection of external light. For example, the polarizing plate (not shown) may be a circular polarizing plate.

In FIG. 4, the light emitted from the OLED 500 is transmitted through the second electrode 520 and the color filter layer 480 is disposed over the OLED 500. Alternatively, the light emitted from the OLED 500 is transmitted through the first electrode 510 and the color filter layer 480 may be disposed between the OLED 500 and the first substrate 402. In addition, a color conversion layer (not shown) may be formed between the OLED 500 and the color filter layer 480. The color conversion layer (not shown) may include a red color conversion layer (not shown), a green color conversion layer (not shown) and a blue color conversion layer (not shown) each of which is disposed correspondingly to each pixel (RP, GP and BP), respectively, so as to covert the white (W) color light to each of a red, green and blue color lights, respectively.

As described above, the white (W) color light emitted from the OLED 500 is transmitted through the red color filter 482, the green color filter 484 and the blue color filter 486 each of which is disposed correspondingly to the red pixel RP, the green pixel GP and the blue pixel BP, respectively, so that red, green and blue color lights are displayed in the red pixel RP, the green pixel GP and the blue pixel BP.

Figure 5:
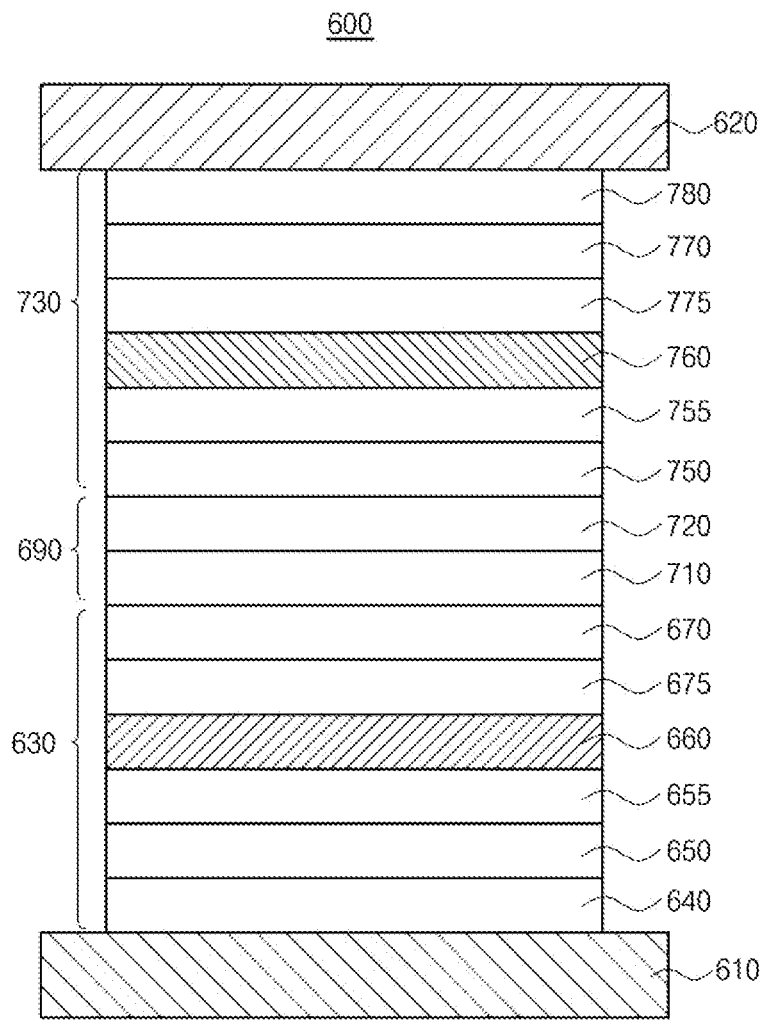
FIG. 5 is a schematic cross-sectional view illustrating an OLED having two emitting units in accordance with anther exemplary embodiment of the present disclosure.

Now, we will describe an OLED that can be applied into the organic light emitting display device in accordance with this embodiment. FIG. 5 is a schematic cross-sectional view illustrating an OLED having two emitting units in accordance with anther exemplary embodiment of the present disclosure. As illustrated in FIG. 5, the OLED 600 comprises first and second electrodes 610 and 620 facing each other, a first emitting unit 630 disposed between the first and second electrodes 610 and 620, a second emitting unit 730 disposed between the first emitting unit 630 and the second electrode 620, and a CGL 690 disposed between the first and second emitting units 630 and 730.

The first electrode 610 may be an anode and include a conductive material having a relatively large work function values, for example, transparent conductive oxide (TCO) such as ITO, IZO, SnO, ZnO, ICO, AZO, and the like. The second electrode 620 may be a cathode and include a conductive material having a relatively small work function values such as Al, Mg, Ca, Ag, alloy thereof or combination thereof. As an example, each of the first and second electrodes 610 and 620 may be laminated with a thickness of, but is not limited to, about 30 nm to about 300 nm.

The first emitting unit 630 comprises a HIL 640, a first HTL (lower HTL, HTL1) 650, a first EML (EML1) 660 and a first ETL (lower ETL, ETL1) 670 each of which is laminated sequentially on the first electrode 610. Alternatively, the first emitting unit 630 may further comprise a first EBL (lower EBL, EBL1) 655 disposed between the HTL1 650 and the EML1 660 and/or a first HBL (lower HBL, HBL1) 675 disposed between the EML1 660 and the ETL1 670.

The second emitting unit 730 comprises a second HTL (upper HTL, HTL2) 750, a second EML (EML2) 760, a second ETL (upper ETL, ETL2) 770 and an EIL 780 each of which is laminated sequentially on the CGL 690. Alternatively, the second emitting unit 730 may further comprise a second EBL (upper EBL, EBL2) 755 disposed between the HTL2 750 and the EML2 760 and/or a second HBL (upper HBL, HBL2) 775 disposed between the EML2 760 and the ETL2 770.

One of the EML1 660 and the EML2 760 may comprise any organic metal compound having the structure represented by one of Chemical Formulae 1 to 9 to emit green (G) or yellow-green (YG) light. The other of the EML1 660 and the EML2 760 may emit red (R) and/or blue (B) lights. Hereinafter, the OLED 600 where the EML1 660 comprises the organic metal compound will be explained.

The HIL 640 is disposed between the first electrode 610 and the HTL1 650 and improves an interface property between the inorganic first electrode 610 and the organic HTL1 650. In one exemplary embodiment, the HIL 640 may include, but is not limited to, MTDATA, NATA, 1T-NATA, 2T-NATA, CuPc, TCTA, NPB(NPD), HAT-CN, TDAPB, PEDOT/PSS, N-(biphenyl-4-yl)-9,9-dimethyl-N-(4-(9-phenyl-9H-carbazol-3-yl)phenyl)-9H-fluoren-2-amine and/or NPNPB. The HIL 640 may be omitted in compliance with a structure of OLED 600.

Each of the HTL1 650 and the HTL2 750 may independently include, but is not limited to, TPD, DNTPD, NBP (NPD), CBP, poly-TPD, TFB, TAPC, DCDPA, N-(biphenyl-4-yl)-9,9-dimethyl-N-(4-(9-phenyl-9H-carbazol-3-yl) phenyl)-9H-fluoren-2-amine, N-(biphenyl-4-yl)-N-(4-(9-phenyl-9H-carbazol-3-yl)phenyl)biphenyl-4-amine and/or N-([1,1'-Biphenyl]-4-yl)-9,9-dimethyl-N-(4-(9-phenyl-9H-carbazol-3-yl)phenyl)-9H-fluoren-2-amine. Each of the HIL 640, the HTL1 650 and the HTL2 750 may have a thickness of, but is not limited to, about 5 nm to about 200 nm, and preferably about 5 nm to about 100 nm.

Each of the ETL1 670 and ETL2 770 facilitates electron transportations in the first emitting unit 630 and the second emitting unit 730, respectively. Each of the ETL1 670 and the ETL2 770 may independently include, but is not limited to, oxadiazole-based compounds, triazole-based compounds, phenanthroline-based compounds, benzoxazole-based compounds, benzothiazole-based compounds, benzimidazole-based compounds, triazine-based compounds, and the like, respectively. As an example, each of the ETL1 670 and ETL2 770 may independently include, but is not limited to, Alq$_3$, PBD, spiro-PBD, Liq, TPBi, BAlq, Bphen, NBphen, BCP, TAZ, NTAZ, TpPyPB, TmPPPyTz, PFNBr, TPQ, TSPO1, ZADN and combination thereof, respectively.

The EIL 780 is disposed between the second electrode 620 and the ETL2 770, and can improve physical properties of the second electrode 620 and therefore, can enhance the lifetime of the OLED 600. In one exemplary aspect, the EIL 780 may include, but is not limited to, an alkali halide such as LiF, CsF, NaF, BaF$_2$ and the like, and/or an organic metal compound such as lithium benzoate, sodium stearate, and the like. Each of the ETL1 670, the ETL2 770 and the EIL 780 may have a thickness of, but is not limited to, about 10 nm to about 200 nm, preferably about 10 nm to about 100 nm.

Each of the EBL1 655 and the EBL2 755 may independently include, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, DNTPD, TDAPB and/o 2,8-bis(9-phenyl-9H-carbazol-3-yl)dibenzo[b,d]thiophene, respectively.

Each of the HBL1 675 and the HBL2 775 may independently include, but is not limited to, oxadiazole-based compounds, triazole-based compounds, phenanthroline-based compounds, benzoxazole-based compounds, benzothiazole-based compounds, benzimidazole-based compounds, and triazine-based compounds. As an example, each of the HBL1 675 and the HBL2 775 may independently include, but is not limited to, BCP, BAlq, Alq$_3$, PBD, spiro-PBD, Liq, B3PYMPM, DPEPO, 9-(6-(9H-carbazol-9-yl)pyridine-3-yl)-9H-3,9'-bicarbazole and combination thereof, respectively.

The CGL 690 is disposed between the first emitting unit 630 and the second emitting unit 730. The CGL 690 includes an N-type CGL (N-CGL) 710 disposed adjacently to the first emitting unit 630 and a P-type CGL (P-CGL) 720 disposed adjacently to the second emitting unit 730. The N-type CGL 710 injects electrons into the first emitting unit 630 and the P-type CGL 720 injects holes into the second emitting unit 730.

As an example, the N-CGL 710 may be an organic layer doped with an alkali metal such as Li, Na, K and/or Cs and/or an alkaline earth metal such as Mg, Sr, Ba and/or Ra. For example, a host used in the N-CGL 710 may include, but is not limited to, an organic compound such as Bphen or MTDATA. The alkali metal or the alkaline earth metal may be doped by about 0.01 wt % to about 30 wt % in the N-type CGL 710.

The P-CGL 720 may include, but is not limited to, an inorganic material selected from the group consisting of tungsten oxide (WO$_x$), molybdenum oxide (MoO$_x$), beryllium oxide (Be$_2$O$_3$), vanadium oxide (V$_2$O$_5$) and combination thereof, and/or an organic material selected from the group consisting of NPD, HAT-CN, F4TCNQ, TPD, N,N, N',N'-Tetranaphthalenyl-benzidine (TNB), TCTA, N,N'-dioctyl-3,4,9,10-perylenedicarboximide (PTCDI-C8) and combination thereof.

The EML2 760 may comprise a first host and a first dopant. As an example, the first dopant may comprise any organic metal compound having the structure represented by one of Chemical Formulae 1 to 9 to emit green (G) or yellow-green (YG) light. The first host may comprise, but is not limited to, mCP-CN, CBP, mCBP, mCP, DPEPO, PPT, TmPyPB, PYD-2Cz, DCzDBT, DCzTPA, pCzB-2CN, mCzB-2CN, TSPO1, CCP, 4-(3-(triphenylen-2-yl)phenyl)

dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicabazole, BCzPh, TCP, TCTA, CDBP, DMFL-CBP, Spiro-CBP and TCz1.

The contents of the first dopant in the EML2 760 may be about 1 wt % to about 50 wt %, preferably about 1 wt % to about 30 wt %. As an example, the EML2 760 may have a thickness of, but is not limited to, about 10 nm to about 200 nm, preferably about 20 nm to about 100 nm, and more preferably about 20 nm to about 50 nm.

In this embodiment, the EML1 660 may emit blue (B) and/or red (R) lights. In one exemplary aspect, the EML1 660 may comprise a blue EML and a red EML. When the EML1 660 emits blue (B) light, the EML1 660 emits sky-blue or deep blue light as well as blue light.

As an example, the EML1 660 may comprise a lower EML disposed between the EBL1 655 and the HBL1 675 and an upper EML disposed between the lower EML and the HBL1 675. One of the lower and upper EMLs may emit red light and the other of the first and upper EMLs may emit blue light.

For example, when the lower EML emits red light, the lower EML may comprise a second host(red host), and a second dopant(red dopant).

The second host as the red host may comprise the first host as described above. Alternatively, the second host as the red host may comprise, but is not limited to, Bis(2-hydroxylphenyl)-pyridine)beryllium (Bepp2), Bis(10-hydroxylbenzo[h] quinolinato)beryllium (Bebq2), 1,3,5-Tris(1-pyrenyl)benzene (TPB3), and the like.

The second dopant as the red dopant may comprise, but is not limited to, an organic metal compound having the following structure represented by Chemical Formula 10 or Chemical Formula 11:

Chemical Formula 10

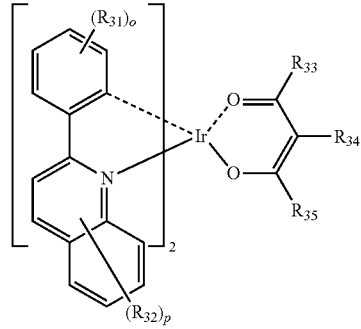

Chemical Formula 11

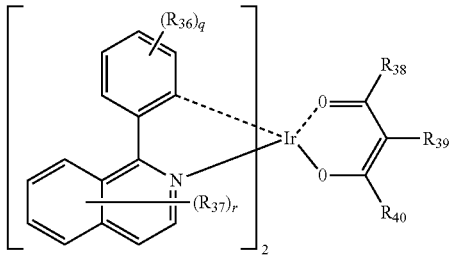

wherein each of $R_{31}$, $R_{32}$, $R_{36}$ and $R_{37}$ is independently protium, deuterium, halogen, $C_1$-$C_{10}$ alkyl, $C_3$-$C_6$ cycloalkyl, $C_6$-$C_{10}$ aryl or $C_4$-$C_{10}$ hetero aryl; each of o and q is independently an integer of 0 (zero) to 4; each of p and r is independently an integer of 0 (zero) to 6; and each of $R_{33}$ to $R_{35}$ and $R_{38}$ to $R_{40}$ is independently protium, deuterium or $C_1$-$C_{10}$ alkyl.

As an example, the second dopant as the red dopant, including the organic metal compound having the structure represented by Chemical Formula 10 or Chemical Formula 11, may comprise, but is not limited to, [Bis(2-(4,6-dimethyl)phenylquinoline)](2,2,6,6-tetramethylheptane-3,5-dionate)iridium(III), Bis[2-(4-n-hexylphenyl)quinoline] (acetylacetonate)iridium(III) (Hex-Ir(phq)$_2$(acac)), Tris[2-(4-n-hexylphenyl)quinoline]iridium(III) (Hex-Ir(phq)$_3$), Tris[2-phenyl-4-methylquinoline]iridium(III) (Ir(Mphq)$_3$), Bis(2-phenylquinoline)(2,2,6,6-tetramethylheptene-3,5-dionate)iridium(III) (Ir(dpm)PQ$_2$), Bis(phenylisoquinoline)(2,2,6,6-tetramethylheptene-3,5-dionate)iridium(III) (Ir(dpm)(piq)$_2$), (Bis[(4-n-hexylphenyl)isoquinoline] (acetylacetonate)iridium(III) (Hex-Ir(piq)$_2$(acac)), Tris[2-(4-n-hexylphenyl)quinoline]iridium(III) (Hex-Ir(piq)$_3$), Tris (2-(3-methylphenyl)-7-methyl-quinolato)iridium (Ir(dmpq)$_3$), Bis[2-(2-methylphenyl)-7-methyl-quinoline] (acetylacetonate)iridium(III) (Ir(dmpq)$_2$(acac)), Bis[2-(3,5-dimethylphenyl)-4-methyl-quinoline](acetylacetonate) iridium(III) (Ir(mphmq)$_2$(acac)), and the like.

The upper EML comprises a third host as a blue host and a third dopant as a blue dopant. For example, the third host as the blue host may comprise, but is not limited to, mCP, mCP-CN, mCBP, CBP-CN, CBP, 9-(3-(9H-Carbazol-9-yl)phenyl)-3-(diphenylphosphoryl)-9H-carbazole (mCPPO1), 3,5-Di(9H-carbazol-9-yl)biphenyl (Ph-mCP), TSPO1,9-(3'-(9H-carbazol-9-yl)-[1,1'-biphenyl]-3-yl)-9H-pyrido[2,3-b] indole (CzBPCb), Bis(2-methylphenyl)diphenylsilane (UGH-1), 1,4-Bis(triphenylsilyl)benzene (UGH-2), 1,3-Bis (triphenylsilyl)benzene (UGH-3), 9,9-Spiorobifluoren-2-yl-diphenyl-phosphine oxide (SPPO1), 9,9'-(5-(Triphenylsilyl)-1,3-phenylene)bis(9H-carbazole) (SimCP), and the like.

The third dopant as the blue dopant may comprise, but is not limited to, perylene, 4,4'-Bis[4-(di-p-tolylamino)styryl] biphenyl (DPAVBi), 4-(Di-p-tolylamino)-4-4'-[(di-p-tolylamino)styryl]stilbene (DPAVB), 4,4'-Bis[4-(diphenylamino)styryl]biphenyl (BDAVBi), 2,5,8,11-Tetra-tetrbutylperylene (TBPe), Bepp2,9-(9-Phenylcarbazole-3-yl)-10-(naphthalene-1-yl)anthracene (PCAN), mer-Tris(1-phenyl-3-methylimidazolin-2-ylidene-C,C(2)'iridium(III) (mer-Ir(pmi)$_3$), fac-Tris(1,3-diphenyl-benzimidazolin-2-ylidene-C,C(2)'iridium(III) (fac-Ir(dpbic)$_3$), Bis(3,4,5-trifluoro-2-(2-pyridyl)phenyl-(2-carboxypyridyl)iridium(III) (Ir(tfpd)$_2$pic), Ir(Fppy)$_3$, Bis[2-(4,6-difluorophenyl)pyridinato-C$^2$,N](picolinato)iridium(III) (FIrpic), and the like.

Each of the contents of the second and third dopants in the red and blue EMLs in the EML1 660 may be about 1 wt % to about 50 wt %, preferably about 1 wt % to about 30 wt %, respectively. Each of the red and blue EMLs in the EML1 660 may have a thickness, but is not limited to, about 10 nm to about 100 nm, preferably about 10 nm to about 50 nm.

The OLED 600 of this embodiment has a tandem structure and comprises the organic metal compound having the structure represented by one of Chemical Formulae 1 to 9. The organic compound has excellent thermal property, a rigid chemical conformation and can adjust its luminescent color with ease, thus the OLED 600 including the organic compound can enhance its luminous efficiency, luminous lifetime and color purity.

Figure 6:
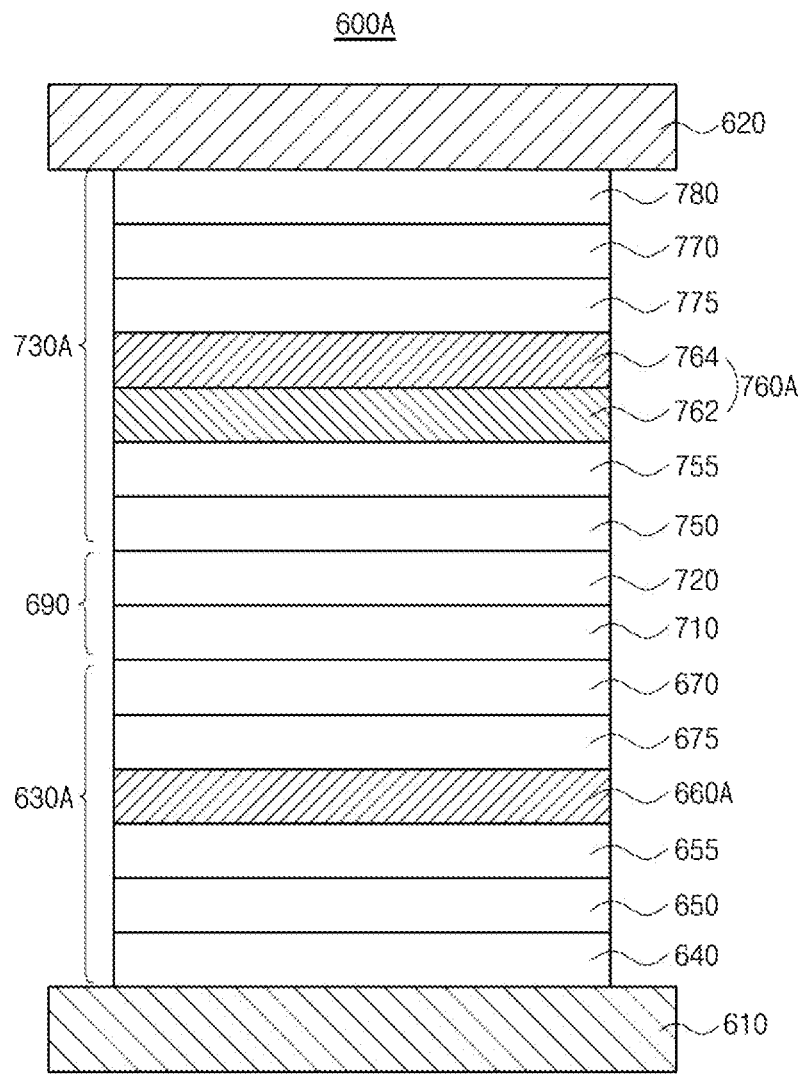
FIG. 6 is a schematic cross-sectional view illustrating an OLED having two emitting units in accordance with anther exemplary embodiment of the present disclosure.

In the second embodiment, the EML including the organic metal compound having the structure represented by one of Chemical Formulae 1 to 9, i.e., the EML2 760 emits green light. Alternatively, an EML including the organic metal compound may emit red-green (RG) light. FIG. 6 is a schematic cross-sectional view illustrating an OLED having two emitting units in accordance with anther exemplary embodiment of the present disclosure.

As illustrated in FIG. 6, the OLED 600A comprises first and second electrodes 610 and 620 facing each other, a first emitting unit 630A disposed between the first and second electrodes 610 and 620, a second emitting unit 730A disposed between the first emitting unit 630A and the second electrode 620, and a CGL 690 disposed between the first and second emitting units 630A and 730A.

The first emitting unit 630A comprises the HIL 640, the HTL1 650, an EML1 660A, the ETL1 670, and optionally the EBL1 655 and/or the HBL1 675. The second emitting unit 730A comprises the HTL2 750, an EML2 760A, the ETL2 770 and the EIL 780, and optionally the EBL2 755 and/or the HBL2 775. The CGL 690 comprises the N-type CGL 710 disposed adjacently to the first emitting unit 630A and the P-type CGL 720 disposed adjacently to the second emitting unit 730A. Each of the first and second electrodes 610 and 620, the CGL 690, the first emitting 630A unit except the EML1 660A and the second emitting unit 730A except the EML2 760A is identical to the corresponding elements in FIG. 5.

In this embodiment, one of the EML1 660A and EML2 760A may comprise the organic metal compound having the structure represented by one of Chemical Formulae 1 to 9. Hereinafter, the OLED 600A where the EML2 760A comprises the organic metal compound will be explained.

The EML2 760A comprises a lower EML 762 disposed between the EBL2 755 and the HBL2 775 and an upper EML 764 disposed between the lower EML 762 and the HBL2 775. One of the lower EML 762 and the upper EML 764 may comprise any organic metal compound having the structure represented by one of Chemical Formulae 1 to 9 to emit green (G) or yellow-green (YG) light, and the other of the lower EML 762 and the upper EML 764 may emit red (R) light. Hereinafter, the EML2 760A where the lower EML 762 emits green (G) or yellow-green (YG) light and the upper EML 764 emits red (R) light will be explained.

The lower EML 762 of the EML2 760A comprises a first host and a first dopant, The first host may comprise, but is not limited to, mCP-CN, CBP, mCBP, mCP, DPEPO, PPT, TmPyPB, PYD-2Cz, DCzDBT, DCzTPA, pCzB-2CN, mCzB-2CN, TSPO1, CCP, 4-(3-(triphenylen-2-yl)phenyl) dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicabazole, BCzPh, TCP, TCTA, CDBP, DMFL-CBP, Spiro-CBP and TCz1. The first dopant comprises any organic metal compound having the structure represented by one of Chemical Formulae 1 to 9 to emit green (G) or yellow-green (YG) light.

The upper EML 764 of the EML2 760A may comprise a second host and a second dopant. In one exemplary aspect, the second host may be a red host and the second dopant may be a red dopant. The second host as the red dopant may comprise Bepp2, Bebq2 and TPB3 as well as the first host. The second dopant as the red dopant may comprise the organic metal compound having the structure represented by Chemical Formula 10 or Chemical Formula 11. As an example, the second dopant as the red dopant may comprise, but is not limited to, [Bis(2-(4,6-dimethyl)phenylquinoline)] (2,2,6,6-tetramethylheptane-3,5-dionate)iridium(III), Hex-Ir (phq)$_2$(acac), Hex-Ir(phq)$_3$, Ir(Mphq)$_3$, Ir(dpm)PQ$_2$, Ir(dpm)(piq)$_2$, Hex-Ir(piq)$_2$(acac), Hex-Ir(piq)$_3$, Ir(dmpq)$_3$, Ir(dmpq)$_2$(acac), Ir(mphmq)$_2$(acac), and the like.

When each of the lower and upper EMLs 762 and 764 comprises the first and second dopant, respectively, each of the contents of the first and second dopants in each of the EMLs 762 and 764 may be about 1 wt % to about 50 wt %, preferably about 1 wt % to about 30 wt %. Each of the lower and upper EMLs 762 and 764 may have a thickness of, but is not limited to, about 10 nm to about 100 nm, preferably about 10 nm to about 50 nm.

In this embodiment, the EML1 660A may be a blue EML. The EML1 660A may emit sky blue or deep blue light as well as blue light. The EML1 660A may comprise a third host as a blue host and a third dopant as a blue dopant. For example, the third host as the blue host may comprise, but is not limited to, mCP, mCP-CN, mCBP, CBP-CN, CBP, mCPPO1, Ph-mCP, TSPO1, CzBPCb, UGH-1, UGH-2, UGH-3, SPPO1, SimCP, and the like. The third dopant as the blue dopant may comprise, but is not limited to, perylene, DPAVBi, DPAVB, BDAVBi, TBPe, Bepp2, PCAN, mer-Ir (pmi)$_3$, fac-Ir(dpbic)$_3$, Ir(tfpd)$_2$pic, Ir(Fppy)$_3$, FIrpic, and the like.

The contents of the third dopant as the blue dopant in the EML1 660A may be about 1 wt % to about 50 wt %, preferably about 1 wt % to about 30 wt %. For example, the EML1 660A may have a thickness of, but is not limited to, about 10 nm to about 200 nm, preferably about 20 nm to about 100 nm, and more preferably about 20 nm to about 50 nm.

The OLEDs 600 and 600A comprise any organic metal compound having the structure represented by one of Chemical Formulae 1 to 9 in at least one emitting units 660, 660A, 760 and 760A. The organic metal compound has narrow luminescent FWHM and can maintain stable chemical conformation in luminescence process. As a result, the OLEDs comprising the organic metal compound and having two emitting units can implement white luminescence having excellent luminous efficiency, color purity and luminous lifetime.

Figure 7:
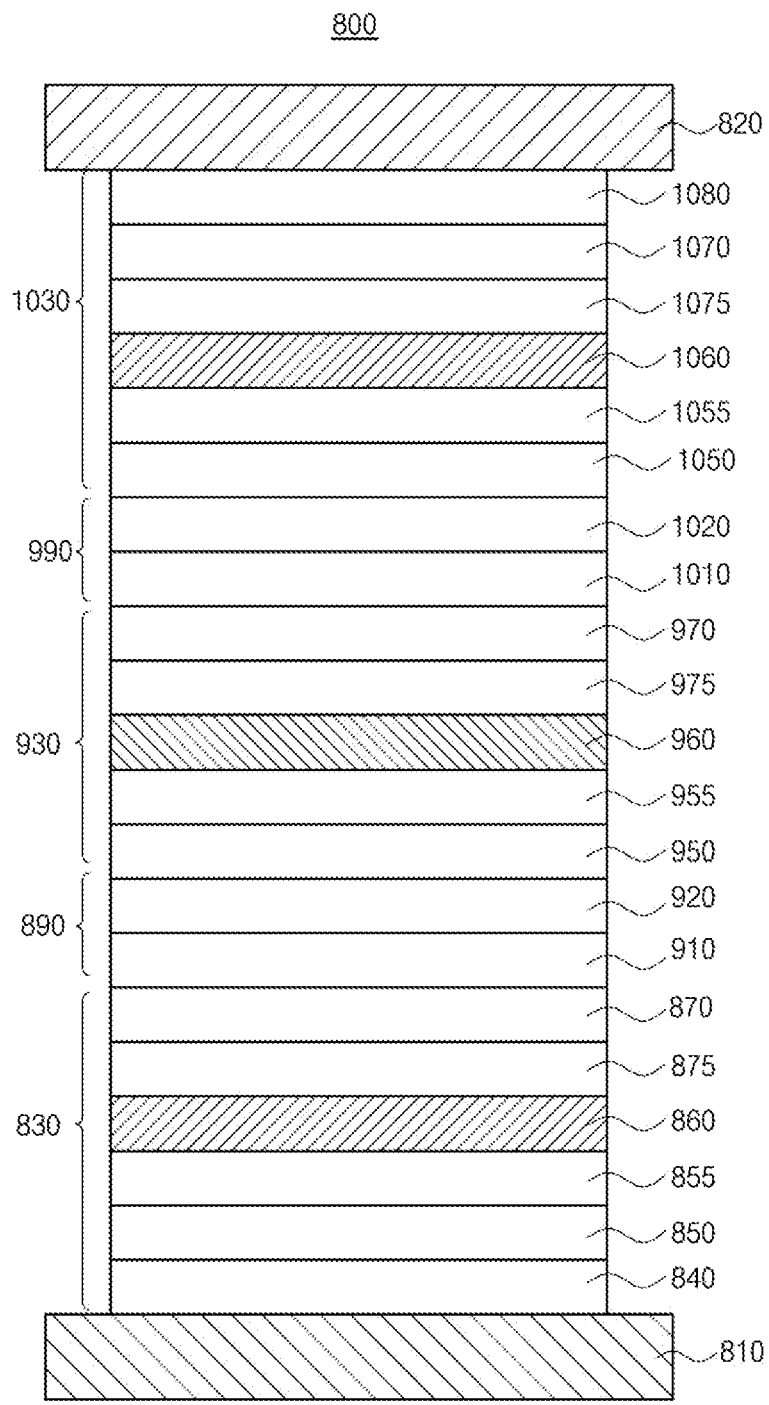
FIG. 7 is a schematic cross-sectional view illustrating an OLED having three emitting units in accordance with another exemplary embodiment of the present disclosure.

Alternatively, an OLED may have a tandem structure in which three or more emitting units are laminated. FIG. 7 is a schematic cross-sectional view illustrating an OLED having three emitting units in accordance with another exemplary embodiment of the present disclosure.

As illustrated in FIG. 7, the OLED 800 comprises first and second electrodes 810 and 820 facing each other, a first emitting unit 830 disposed between the first and second electrodes 810 and 820, a second emitting unit 930 disposed between the first emitting unit 830 and the second electrode 820, a third emitting unit 1030 disposed between the second emitting unit 930 and the second electrode 820, a first CGL (CGL1) 890 disposed between the first and second emitting units 830 and 930 and a second CGL (CGL2) 990 disposed between the second and third emitting units 930 and 1030.

The first electrode 810 may be an anode and include a conductive material having a relatively large work function values, for example, transparent conductive oxide (TCO) such as ITO, IZO, SnO, ZnO, ICO, AZO, and the like. The second electrode 820 may be a cathode and include a conductive material having a relatively small work function values such as Al, Mg, Ca, Ag, alloy thereof or combination thereof. As an example, each of the first and second electrodes 810 and 820 may be laminated with a thickness of, but is not limited to, about 30 nm to about 300 nm.

The first emitting unit 830 comprises a HIL 840, a first HTL (HTL1) 850, a first EML (EML1) 860 and a first ETL (ETL1) 870 each of which is laminated sequentially on the first electrode 810. Alternatively, the first emitting unit 830 may further comprise a first EBL (EBL1) 855 disposed between the HTL1 850 and the EML1 860 and/or a first HBL (HBL1) 875 disposed between the EML1 860 and the ETL1 870.

The second emitting unit 930 comprises a second HTL (HTL2) 950, a second EML (EML2) 960 and a second ETL (ETL2) 970 each of which is laminated sequentially on the CGL1 890. Alternatively, the second emitting unit 930 may further comprise a second EBL (EBL2) 955 disposed between the HTL2 950 and the EML2 960 and/or a second HBL (HBL2) 975 disposed between the EML2 960 and the ETL2 970.

The third emitting unit 1030 comprises a third HTL (HTL3) 1050, a third EML (EML3) 1060, a third ETL (ETL3) 1070 and an EIL 1080 each of which is laminated sequentially on the CGL2 990. Alternatively, the third emitting unit 1030 may further comprise a third EBL (EBL3) 1055 disposed between the HTL3 1050 and the EML3 1060 and/or a third HBL (HBL3) 1075 disposed between the EML3 1060 and the ETL3 1070.

At least one of the EML1 860, the EML2 960 and the EML3 1060 may comprise any organic metal compound having the structure represented by one of Chemical Formulae 1 to 9 to emit green (G) or yellow-green (YG) light. For example, one of EML1 860, the EML2 960 and the EML3 1060 may emit green (G) or yellow-green (YG) light. In this case, another of the EML1 860, the EML2 960 and the EML3 1060 may emit red (R) light and a third of EML1 860, the EML2 960 and the EML3 1060 may emit blue (B) light so that the OLED 800 can realize white (W) luminescence. Hereinafter, The OLED 800 where the EML2 960 comprises any organic metal compound having the structure represented by one of Chemical Formulae 1 to 9 to emit green (G) or yellow-green (YG) light, the EML1 860 emits red (R) light and the EML3 1060 emits blue (B) light will be explained.

The HIL 840 is disposed between the first electrode 810 and the HTL1 850 and improves an interface property between the inorganic first electrode 810 and the organic HTL1 850. In one exemplary embodiment, the HIL 840 include, but is not limited to, MTDATA, NATA, 1T-NATA, 2T-NATA, CuPc, TCTA, NPB(NPD), HAT-CN, TDAPB, PEDOT/PSS, N-(biphenyl-4-yl)-9,9-dimethyl-N-(4-(9-phenyl-9H-carbazol-3-yl)phenyl)-9H-fluoren-2-amine and/or NPNPB. The HIL 840 may be omitted in compliance with a structure of OLED 800.

Each of the HTL1 850, the HTL2 950 and the HTL3 1050 may independently include, but is not limited to, TPD, DNTPD, NBP(NPD), CBP, poly-TPD, TFB, TAPC, DCDPA, N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine and/or N-([1,1'-Biphenyl]-4-yl)-9,9-dimethyl-N-(4-(9-phenl-9H-carbazol-3-yl)phenyl)-9H-fluoren-2-amine. Each of the HIL 840, the HTL1 850, the HTL2 950 and the HTL3 1050 may have a thickness of, but is not limited to, about 5 nm to about 200 nm, and preferably about 5 nm to about 100 nm.

Each of the ETL1 870, the ETL2 970 and the ETL3 1070 facilitates electron transportations in each of first to third emitting units 830, 930 and 1030, respectively. Each of the ETL1 870, the ETL2 970 and the ETL3 1070 may independently include, but is not limited to, oxadiazole-based compounds, triazole-based compounds, phenanthroline-based compounds, benzoxazole-based compounds, benzothiazole-based compounds, benzimidazole-based compounds, triazine-based compounds, and the like, respectively. As an example, each of the ETL1 870, the ETL2 970 and the ETL3 1070 may independently include, but is not limited to, $Alq_3$, PBD, spiro-PBD, Liq, TPBi, BAlq, Bphen, NBphen, BCP, TAZ, NTAZ, TpPyPB, TmPPPyTz, PFNBr, TPQ, TSPO1, ZADN and combination thereof, respectively.

The EIL 1080 is disposed between the second electrode 820 and the ETL3 1070, and can improve physical properties of the second electrode 820 and therefore, can enhance the lifetime of the OLED 800. In one exemplary aspect, the EIL 1080 may include, but is not limited to, an alkali halide such as LiF, CsF, NaF, $BaF_2$ and the like, and/or an organic metal compound such as lithium benzoate, sodium stearate, and the like. Each of the ETL1 870, the ETL2 970, the ETL3 1070 and the EIL 1080 may have a thickness of, but is not limited to, about 10 nm to about 200 nm, preferably about 10 nm to about 100 nm.

Each of the EBL1 855, the EBL2 955 and the EBL3 1055 may independently include, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, DNTPD, TDAPB and/o 2,8-bis(9-phenyl-9H-carbazol-3-yl)dibenzo[b,d]thiophene, respectively.

Each of the HBL1 875, the HBL2 975 and the HBL3 1075 may independently include, but is not limited to, oxadiazole-based compounds, triazole-based compounds, phenanthroline-based compounds, benzoxazole-based compounds, benzothiazole-based compounds, benzimidazole-based compounds, and triazine-based compounds. As an example, each of the HBL1 875, the HBL2 975 and the HBL3 1075 may independently include, but is not limited to, BCP, BAlq, $Alq_3$, PBD, spiro-PBD, Liq, B3PYMPM, DPEPO, 9-(6-(9H-carbazol-9-yl)pyridine-3-yl)-9H-3,9'-bicarbazole and combination thereof, respectively.

The CGL1 890 is disposed between the first emitting unit 830 and the second emitting unit 930 and the CGL2 990 is disposed between the second emitting unit 930 and the third emitting unit 1030. The CGL1 890 includes a first N-type CGL (N-CGL1) 910 disposed adjacently to the first emitting unit 830 and a first P-type CGL (P-CGL1) 920 disposed adjacently to the second emitting unit 930. The CGL2 990 includes a second N-type CGL (N-CGL2) 1010 disposed adjacently to the second emitting unit 930 and a second P-type CGL (P-CGL2) 1020 disposed adjacently to the third emitting unit 1030. Each of the N-CGL1 910 and the N-CGL2 1010 injects electrons into each of the first emitting unit 830 and the second emitting unit 930, respectively, and each of the P-CGL1 920 and the P-CGL2 1020 injects holes into each of the second emitting unit 930 and the third emitting unit 1030, respectively.

As an example, each of the N-CGL1 910 and the N-CGL2 1010 may be an organic layer doped with an alkali metal such as Li, Na, K and/or Cs and/or an alkaline earth metal such as Mg, Sr, Ba and/or Ra. For example, a host used in each of the N-CGL1 910 and the N-CGL2 1010 may include, but is not limited to, an organic compound such as Bphen or MTDATA. The alkali metal or the alkaline earth metal may be doped by about 0.01 wt % to about 30 wt % in the N-type CGLs 910 and 1010.

Each of the P-CGL1 920 and the P-CGL2 1020 may include, but is not limited to, an inorganic material selected from the group consisting of tungsten oxide ($WO_x$), molybdenum oxide ($MoO_x$), beryllium oxide ($Be_2O_3$), vanadium oxide ($V_2O_5$) and combination thereof, and/or an organic material selected from the group consisting of NPD, HAT-CN, F4TCNQ, TPD, N,N,N',N'-Tetranaphthalenyl-benzidine (TNB), TCTA, N,N'-dioctyl-3,4,9,10-perylenedicarboximide (PTCDI-C8) and combination thereof.

In this embodiment, the EML2 960 comprises a first host and a first dopant that is any organic metal compound having the structure represented by one of Chemical Formulae 1 to 9 to emit green (G) or yellow-green (YG) light. The first host may comprise, but is not limited to, mCP-CN, CBP, mCBP, mCP, DPEPO, PPT, TmPyPB, PYD-2Cz, DCzDBT, DCzTPA, pCzB-2CN, mCzB-2CN, TSPO1, CCP, 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicabazole, BCzPh, TCP, TCTA, CDBP, DMFL-CBP, Spiro-CBP and TCz1.

The contents of the first dopant in the EML2 960 may be about 1 wt % to about 50 wt %, preferably about 1 wt % to about 30 wt %. As an example, the EML2 960 may have a thickness of, but is not limited to, about 10 nm to about 200 nm, preferably about 20 nm to about 100 nm, and more preferably about 20 nm to about 50 nm.

In this embodiment, the EML1 860 may emit red (R) light. In one exemplary aspect, the EML1 860 may comprise a second host as a red host and a second dopant as a red dopant. The second host as the red host in the EML1 860 may comprise Bepp2, Bebq2 and TPB3 as well as the first host. The second dopant as the red dopant may comprise the organic metal compound having the structure represented by Chemical Formula 10 or Chemical Formula 11. As an example, the second dopant as the red dopant may comprise, but is not limited to, [Bis(2-(4,6-dimethyl)phenylquinoline)](2,2,6,6-tetramethylheptane-3,5-dionate)iridium(III), Hex-Ir(phq)$_2$(acac), Hex-Ir(phq)$_3$, Ir(Mphq)$_3$, Ir(dpm)PQ$_2$, Ir(dpm)(piq)$_2$, Hex-Ir(piq)$_2$(acac), Hex-Ir(piq)$_3$, Ir(dmpq)$_3$, Ir(dmpq)$_2$(acac), Ir(mphmq)$_2$(acac), and the like.

The EML3 1060 may emit blue light and may comprise a third host as a blue host and a third dopant as a blue dopant. The third host as the blue host in the EML3 1060 may comprise, but is not limited to, mCP, mCP-CN, mCBP, CBP-CN, CBP, mCPPO1, Ph-mCP, TSPO1, CzBPCb, UGH-1, UGH-2, UGH-3, SPPO1, SimCP, and the like. The third dopant as the blue dopant may comprise, but is not limited to, perylene, DPAVBi, DPAVB, BDAVBi, TBPe, Bepp2, PCAN, mer-Ir(pmi)$_3$, fac-Ir(dpbic)$_3$, Ir(tfpd)$_2$pic, Ir(Fppy)$_3$, FIrpic, and the like.

Each of the contents of the first to third dopants in each of the EML1 860, the EML2 960 and the EML3 1060 may be about 1 wt % to about 50 wt %, preferably about 1 wt % to about 30 wt %, respectively. Each of the EML1 860, the EML2 960 and the EML3 1060 may have a thickness of, but is not limited to, about 10 nm to about 200 nm, preferably about 20 nm to about 100 nm, and more preferably about 20 nm to about 50 nm.

In the above embodiment, the OLED 800 comprises the EML2 960 comprising any organic metal compound having the structure represented by one of Chemical Formulae 1 to 9 as the green or yellow green EML. Alternatively, an EML including the organic metal compound may emit red-green (RG) light.

Figure 8:
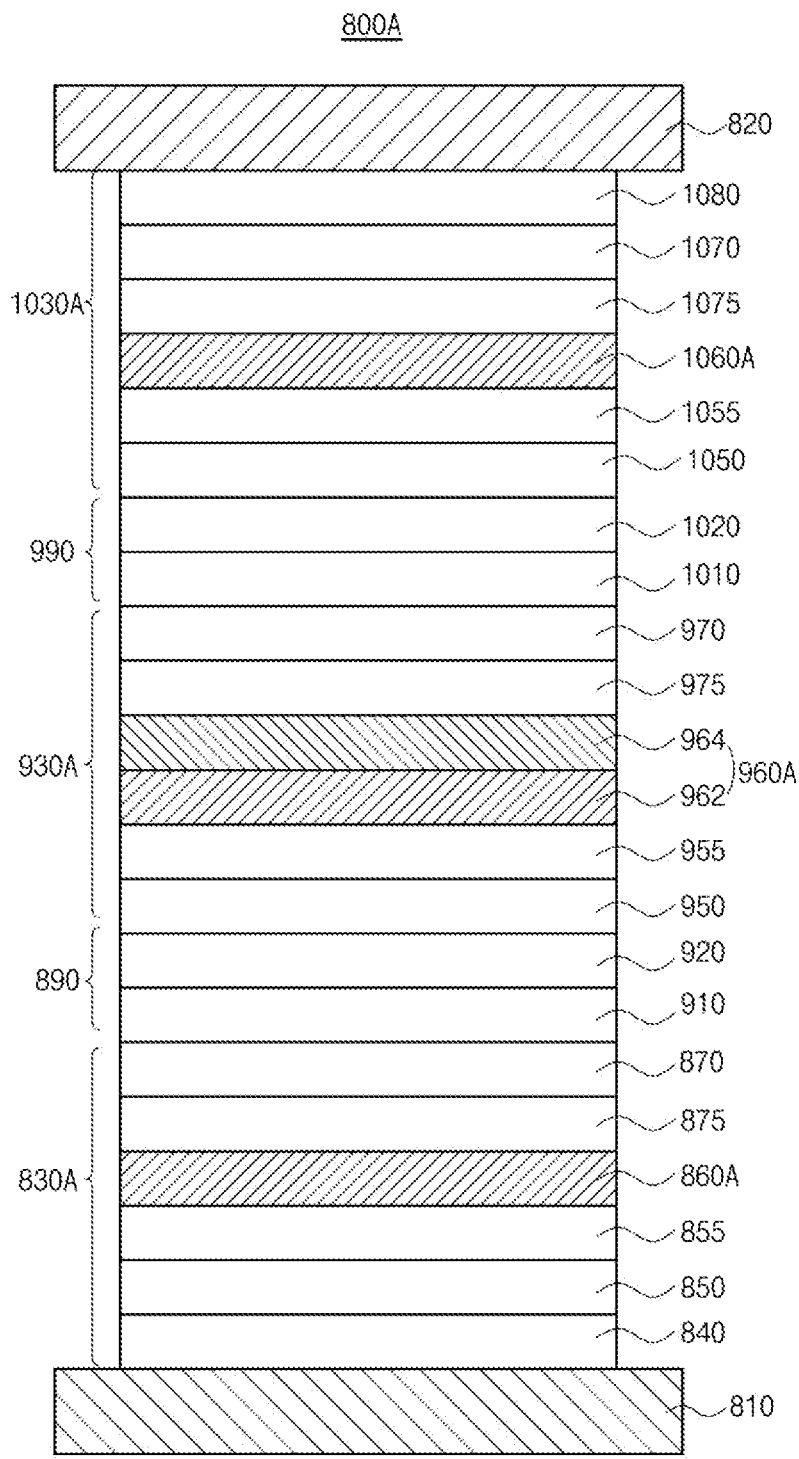
FIG. 8 is a schematic cross-sectional view illustrating an OLED having three emitting units in accordance with another exemplary embodiment of the present disclosure.

FIG. 8 is a schematic cross-sectional view illustrating an OLED having three emitting units in accordance with another exemplary embodiment of the present disclosure.

As illustrated in FIG. 8, the OLED 800A comprises first and second electrodes 810 and 820 facing each other, a first emitting unit 830A disposed between the first and second electrodes 810 and 820, a second emitting unit 930A disposed between the first emitting unit 830A and the second electrode 820, a third emitting unit 1030A disposed between the second emitting unit 930A and the second electrode 820, a CGL1 890 disposed between the first and second emitting units 830A and 930A, and a CGL2 990 disposed between the second and third emitting units 930A and 1030A.

The first emitting unit 830A comprises the HIL 840, the HTL1 850, an EML1 860A, the ETL1 870, and optionally the EBL1 855 and/or the HBL1 875. The second emitting unit 930A comprises the HTL2 950, an EML2 960A, the ETL2 970, and optionally the EBL2 955 and/or the HBL2 975. The third emitting unit 1030A comprises the HTL3 1050, an EML3 1060A, the ETL3 1070 and the EIL 1080, and optionally the EBL3 1055 and/or the HBL3 1075.

The CGL1 890 comprises the N-CGL1 910 disposed adjacently to the first emitting unit 830A and the P-CGL1 920 disposed adjacently to the second emitting unit 930A. The CGL2 990 comprises the N-CGL2 1010 disposed adjacently to the second emitting unit 930A and the P-CGL2 1020 disposed adjacently to the third emitting unit 1030A. Each of the first and second electrodes 810 and 820, the CGL1 890, the CGL2 990, the first emitting 830A unit except the EML1 860A, the second emitting unit 930A except the EML2 960A, the third emitting unit 1030A except the EML3 960A is identical to the corresponding elements in FIG. 7.

In this embodiment, one of the EML1 860A, EML2 960A and the EML3 1060A may comprise the organic metal compound having the structure represented by one of Chemical Formulae 1 to 9. Hereinafter, the OLED 800A where the EML2 960A comprises the organic metal compound will be explained.

The EML2 960A comprises a lower EML 962 disposed between the EBL2 955 and the HBL2 975 and an upper EML 964 disposed between the lower EML 962 and the HBL2 975. One of the lower EML 962 and the upper EML 964 may comprise any organic metal compound having the structure represented by one of Chemical Formulae 1 to 9 to emit green (G) or yellow-green (YG) light, and the other of the lower EML 962 and the upper EML 964 may emit red (R) light. Hereinafter, the EML2 960A where the lower EML 962 emits green (G) or yellow-green (YG) light and the upper EML 74 emits red (R) light will be explained.

The lower EML 962 of the EML2 960A comprises a first host and a first dopant, The first host may comprise, but is not limited to, mCP-CN, CBP, mCBP, mCP, DPEPO, PPT, TmPyPB, PYD-2Cz, DCzDBT, DCzTPA, pCzB-2CN, mCzB-2CN, TSPO1, CCP, 4-(3-(triphenylen-2-yl)phenyl) dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicabazole, BCzPh, TCP, TCTA, CDBP, DMFL-CBP, Spiro-CBP and TCz1. The first dopant comprises any organic metal compound having the structure represented by one of Chemical Formulae 1 to 9 to emit green (G) or yellow-green (YG) light.

The upper EML 964 of the EML2 960A may comprise a second host and a second dopant. In one exemplary aspect, the second host may be a red host and the second dopant may be a red dopant. The second host as the red host may comprise Bepp2, Bebq2 and TPB3 as well as the first host. The second dopant as the red dopant may comprise the organic metal compound having the structure represented by Chemical Formula 10 or Chemical Formula 11. As an example, the second dopant as the red dopant may comprise, but is not limited to, [Bis(2-(4,6-dimethyl)phenylquinoline)](2,2,6,6-tetramethylheptane-3,5-dionate)iridium(III), Hex-Ir(phq)$_2$(acac), Hex-Ir(phq)$_3$, Ir(Mphq)$_3$, Ir(dpm)PQ$_2$, Ir(dpm)(piq)$_2$, Hex-Ir(piq)$_2$(acac), Hex-Ir(piq)$_3$, Ir(dmpq)$_3$, Ir(dmpq)$_2$(acac), Ir(mphmq)$_2$(acac), and the like.

When each of the lower and upper EMLs 962 and 964 comprises the first and second dopant, respectively, each of the contents of the first and second dopants in each of the EMLs 962 and 964 may be about 1 wt % to about 50 wt %, preferably about 1 wt % to about 30 wt %. Each of the lower and upper EMLs 962 and 964 may have a thickness of, but is not limited to, about 10 nm to about 100 nm, preferably about 10 nm to about 50 nm.

In this embodiment, both the EML1 860A and the EML3 1060A may be blue EMLs. Each of the EML1 860A and the EML3 1060A may emit sky blue or deep blue light as well as blue light. Each of the EML1 860A and the EML3 1060A may comprise a third host as a blue host and a third dopant as a blue dopant, respectively. For example, the third host as the blue host may comprise, but is not limited to, mCP, mCP-CN, mCBP, CBP-CN, CBP, mCPPO1, Ph-mCP, TSPO1, CzBPCb, UGH-1, UGH-2, UGH-3, SPPO1, SimCP, and the like. The third dopant as the blue dopant may comprise, but is not limited, perylene, DPAVBi, DPAVB, BDAVBi, TBPe, Bepp2, PCAN, mer-Ir(pmi)$_3$, fac-Ir(dpbic)$_3$, Ir(tfpd)$_2$pic, Ir(Fppy)$_3$, FIrpic, and the like.

The contents of the third dopant as the blue dopant in each of the EML1 860A and the EML3 1060A may be about 1 wt % to about 50 wt %, preferably about 1 wt % to about 30 wt %, respectively. For example, each of the EML1 860A and the EML3 1060A may have a thickness of, but is not limited to, about 10 nm to about 200 nm, preferably about 20 nm to about 100 nm, and more preferably about 20 nm to about 50 nm.

The OLEDs 800 and 800A comprise any organic metal compound having the structure represented by one of Chemical Formulae 1 to 9 in at least one emitting units 860, 860A, 960, 960A, 1060 and 1060A. The organic metal compound has narrow luminescent FWHM and can maintain stable chemical conformation in luminescence process. As a result, the OLEDs comprising the organic metal compound and having three emitting units can implement white luminescence having excellent luminous efficiency, color purity and luminous lifetime.

Figure 9:
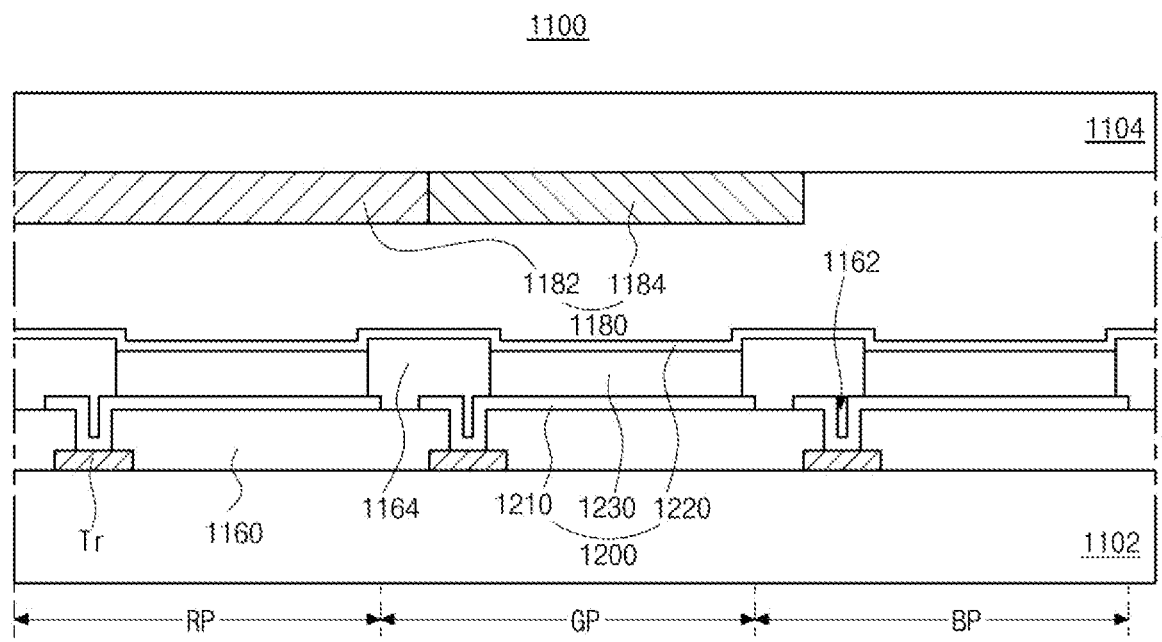
FIG. 9 is a schematic cross-sectional view illustrating an organic light emitting display device in accordance with another exemplary embodiment of the present disclosure.

In another exemplary aspect, an organic light emitting device may comprise a color conversion film. FIG. 9 is a schematic cross-sectional view illustrating an organic light emitting display device in accordance with another exemplary embodiment of the present disclosure.

As illustrated in FIG. 9, the organic light emitting display device 1100 comprises a first substrate 1102 that defines each of a red pixel RP, a green pixel GP and a blue pixel BP, a second substrate 1104 facing the first substrate 1102, a thin film transistor Tr over the first substrate 1102, an OLED 1200 disposed between the first and second substrates 1102 and 1104 and emitting blue (B) light or white (W) light and a color conversion layer 1180 disposed between the OLED 1200 and the second substrate 1104. Although not shown in FIG. 9, a color filter may be formed disposed between the second substrate 1104 and the respective color conversion layer 1180.

The thin film transistor Tr is disposed over the first substrate 1102 correspondingly to each of the red pixel RP, the green pixel GP and the blue pixel BP. A passivation layer 1160, which has a drain contact hole 1162 exposing one electrode, for example a drain electrode (not shown), constituting the thin film transistor Tr, is formed with covering the thin film transistor Tr over the whole first substrate 1102.

The OLED 1200, which includes a first electrode 1210, an emissive layer 1230 and the second electrode 1220, is disposed over the passivation layer 1160. The first electrode 1210 may be connected to the drain electrode (not shown) of the thin film transistor Tr through the drain contact hole 1162. In addition, a bank layer 1164 covering edges of the first electrode 1210 is formed at the boundary between the red pixel RP, the green pixel GP and the blue pixel BP. In this case, the OLED 1200 may have a structure of FIGS. 4 to 8 and can emit blue (B) color light or white (W) color light. The OLED 1200 is disposed in each of the red pixel RP, the green pixel GP and the blue pixel BP to provide blue (B) color light.

The color conversion layer 1180 may include a first color conversion layer 1182 corresponding to the red pixel RP and a second color conversion layer 1184 corresponding to the green pixel GP. As an example, the color conversion layer 1180 may include an inorganic luminescent material such as quantum dot (QD).

The blue (B) color light or white (W) color light emitted from the OLED 1200 in the red pixel RP is converted into red (R) color light by the first color conversion layer 1182 and the blue (B) color light or white (W) color light emitted from the OLED 1200 in the green pixel GP is converted into green (G) color light by the second color conversion layer 1184. Accordingly, the organic light emitting display device 1100 can implement a color image.

In addition, when the light emitted from the OLED 1200 is displayed through the first substrate 1102, the color conversion layer 1180 may be disposed between the OLED 1200 and the first substrate 1102.

Synthesis Example 1

Synthesis of Compound 1

(1) Synthesis of Intermediate 1-1

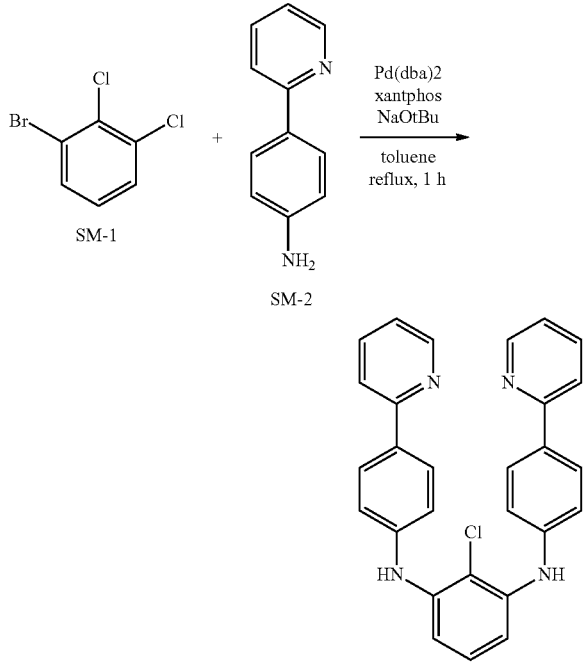

Reaction Formula 1-1

SM-1 (4.5 g, 20 mmol), SM-2 (6.8 g, 40 mmol), bis (dibenzylideneacetone)palladium (0) (Pd(dba)$_2$, 1.15 g, 2.0 mmol), 4,5-bis(diphenylphosphine)-9,9-dimethylxanthene (xantphos, 1.16 g, 2.0 mmol) and sodium tert-butoxide (NaOtBu, 0.31 g, 80 mmol) dissolved in toluene (80 mL) was added into a 500 mL round-bottom flask, and then the solution was heated at 110° C. for 1 hour with stirring. After the reaction was complete, the solution was cooled down to a room temperature, and the organic layer was extracted with chloroform and was washed with water. The moisture was removed with anhydrous MgSO$_4$, the organic layer was concentrated under reduced pressure and purified with a column chromatography using methylene chloride (MC)/hexane (1:3) as an eluent to give an intermediate 1-1 (5.02 g, yield: 56%).

(2) Synthesis of Intermediate 1-2

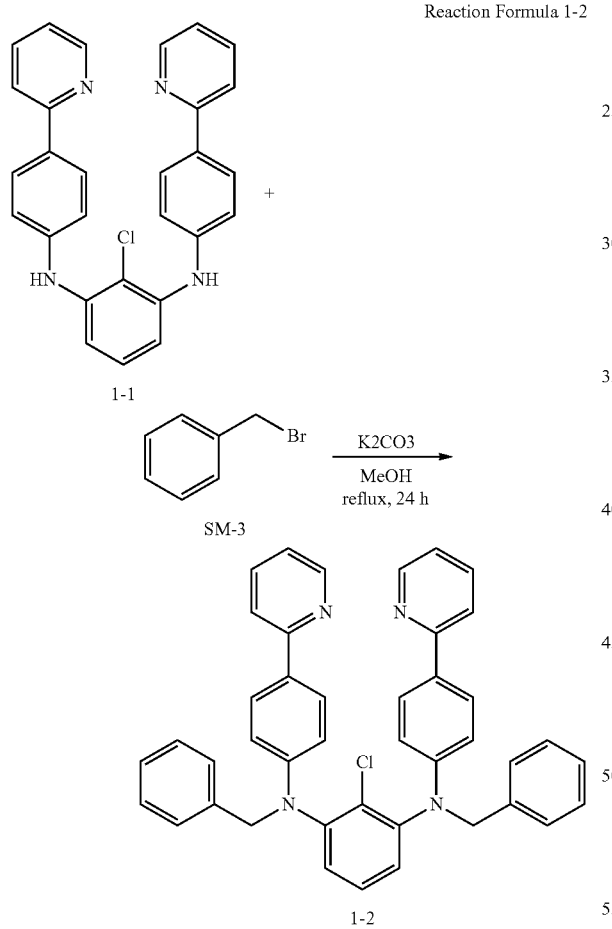

Reaction Formula 1-2

Intermediate 1-1 (4.5 g, 10 mmol), SM-3 (5.1 g, 30 mmol) and K$_2$CO$_3$ (6.9 g, 50 mmol) dissolved in methanol (200 mL) was added into a 500 mL round-bottom flask under nitrogen atmosphere, and the solution was refluxed for 24 hours with stirring. After the reaction was complete, the solution was cooled down to a room temperature, and the organic layer was extracted with chloroform and was washed with water. The moisture was removed with anhydrous MgSO$_4$, the organic layer was concentrated under reduced pressure, and purified with a column chromatography using MC/hexane (1:3) as an eluent to give an intermediate 1-2 (5.66 g, yield: 90%).

(3) Synthesis of Intermediate 1-3

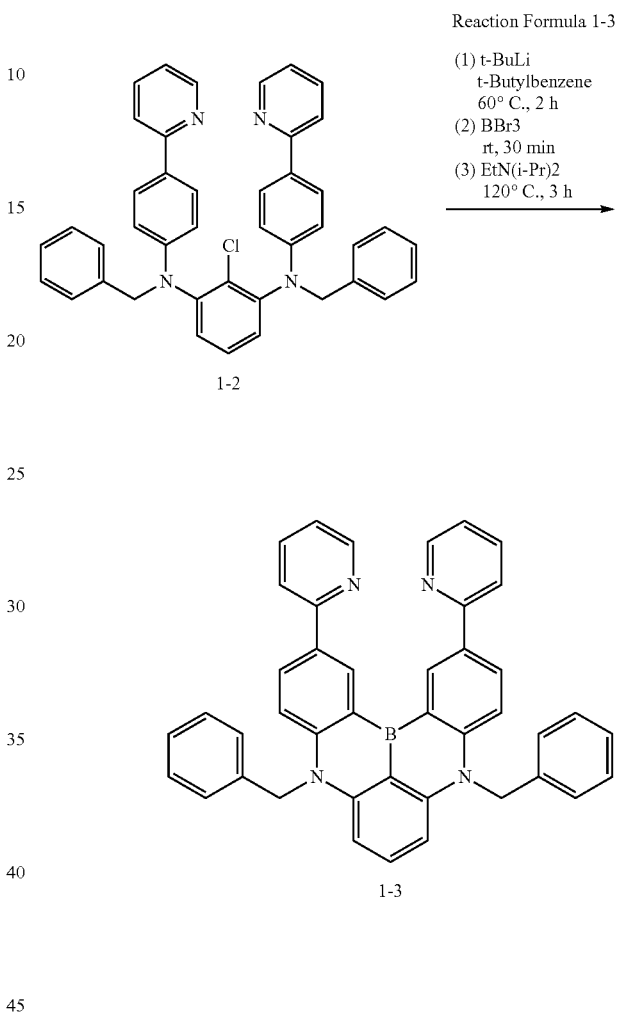

Reaction Formula 1-3

Intermediate 1-2 (6.3 g, 10 mmol) dissolved in t-butylbenzne (100 mL) was added into a 250 mL round-bottom flask under nitrogen atmosphere and the temperature was adjusted to 60° C. 1.7 M t-BuLi (in pentane, 7 mL, 12 mmol) was added drop wise to the flask and the solution was stirred for 2 hours. After the temperature was cooled down to a room temperature, boron tribromide (BBr$_3$, 3.00 g, 12 mmol) was slowly added drop wise to the flask and the solution was stirred at a room temperature for 30 minutes. N,N-diisopropylethylamine (EtN(i-Pr)$_2$, 2.58 g, 20 mmol) was added drop wise to the flask and the solution was stirred at 120° C. for 3 hours. After the reaction was complete, the solution was cooled down to a room temperature, and the organic layer was extracted with chloroform and was washed with water. The moisture was removed with anhydrous MgSO$_4$, the organic layer was concentrated under reduced pressure and purified with a column chromatography using MC/hexane (1:3) as an eluent to give an intermediate 1-3 (2.41 g, yield: 40%).

(4) Synthesis of Intermediate 1-4

Reaction Formula 1-4

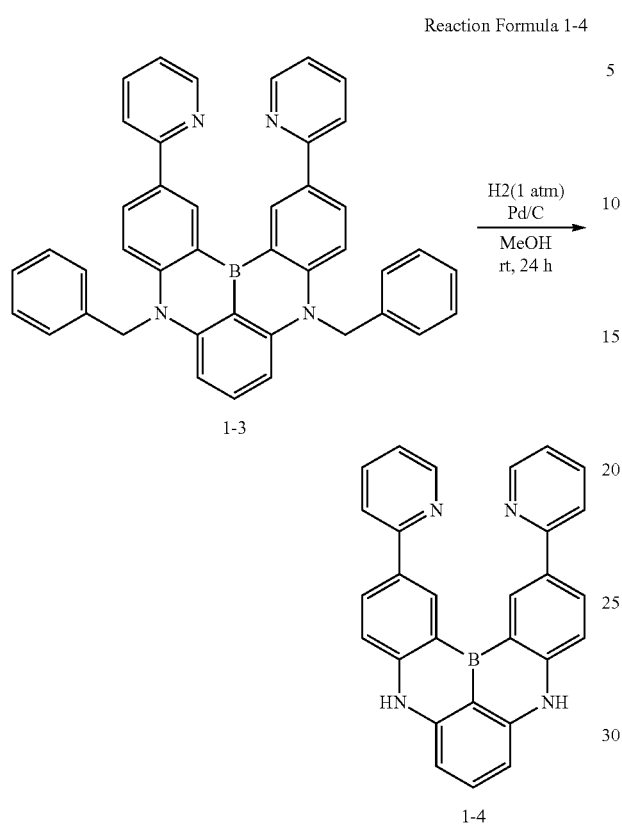

Intermediate 1-3 (6.03 g, 10 mmol) and palladium on activated charcoal (1 g, 10% Pd/C) dissolved in methanol (100 mL) was added into a 250 mL round-bottom flask under hydrogen atmosphere, and then the solution was stirred for 24 hours. After the reaction was complete, the solution was cooled down to a room temperature, and the organic layer was extracted with chloroform and was washed with water. The moisture was removed with anhydrous MgSO₄, the organic layer was concentrated under reduced pressure and purified with a column chromatography using MC/hexane (1:3) as an eluent to give an intermediate 1-4 (3.38 g, yield: 80%).

(5) Synthesis of Intermediate 1-5

Reaction Formula 1-5

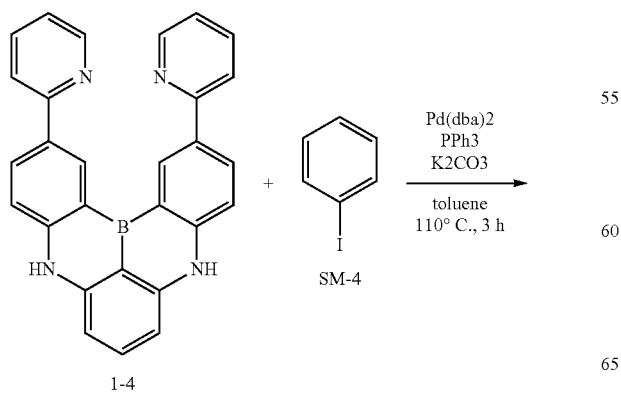

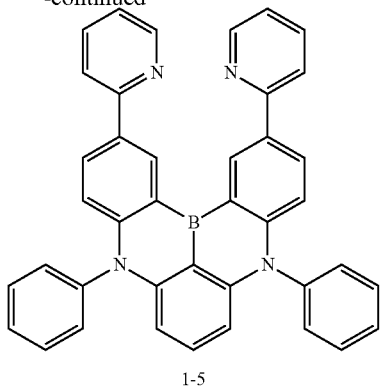

Intermediate 1-4 (45 g, 20 mmol), SM-4 (8.16 g, 40 mmol), Pd(dba)₂ (1.15 g, 2.0 mmol), triphenylphosphine (PPh₃, 0.52 g, 2.0 mmol) and K₂CO₃ (0.31 g, 80 mmol) dissolved in toluene (200 mL) was added into a 500 mL round-bottom flask under nitrogen atmosphere, and then the solution was heated at 130° C. for 3 hours with stirring. After the reaction was complete, the solution was cooled down to a room temperature, and the organic layer was extracted with chloroform and was washed with water. The moisture was removed with anhydrous MgSO₄, the organic layer was concentrated under reduced pressure and purified with a column chromatography using MC/hexane (1:3) as an eluent to give an intermediate 1-5 (10.9 g, yield: 95%).

(6) Synthesis of Compound 1

Reaction Formula 1-6

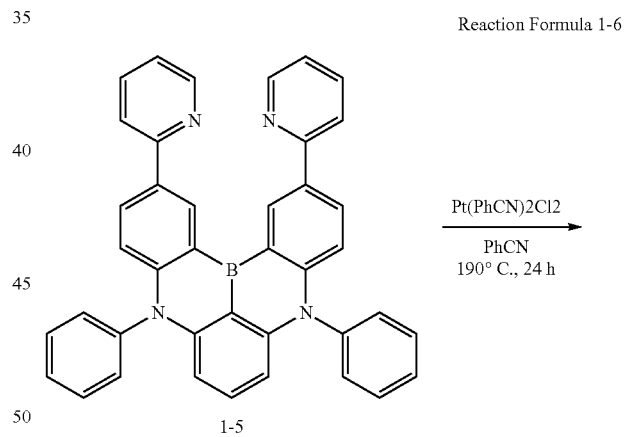

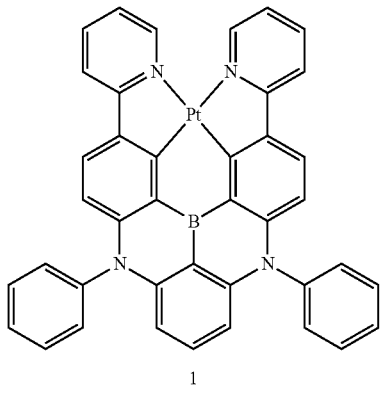

Intermediate 1-5 (75 g, 10 mmol) and bis(benzonitrile) platinum chloride (II) (Pt(PhCN)$_2$Cl$_2$, 4.72 g, 10 mmol) dissolved in benzonitrile (PhCN, 100 mL) was added into a 250 round-bottom flask under nitrogen atmosphere, and then the solution was stirred at 190° C. for 24 hours. After the reaction was complete, the solution was cooled down to a room temperature, and the organic layer was extracted chloroform and was washed with water. The moisture was removed with anhydrous MgSO$_4$, the organic layer was concentrated under reduced pressure and purified with a column chromatograph using MC/hexane (5:1) as an eluent to give Compound 1 (1.92 g, yield: 25%).

Synthesis Example 2

Synthesis of Compound 3

(1) Synthesis of Intermediate 3-1

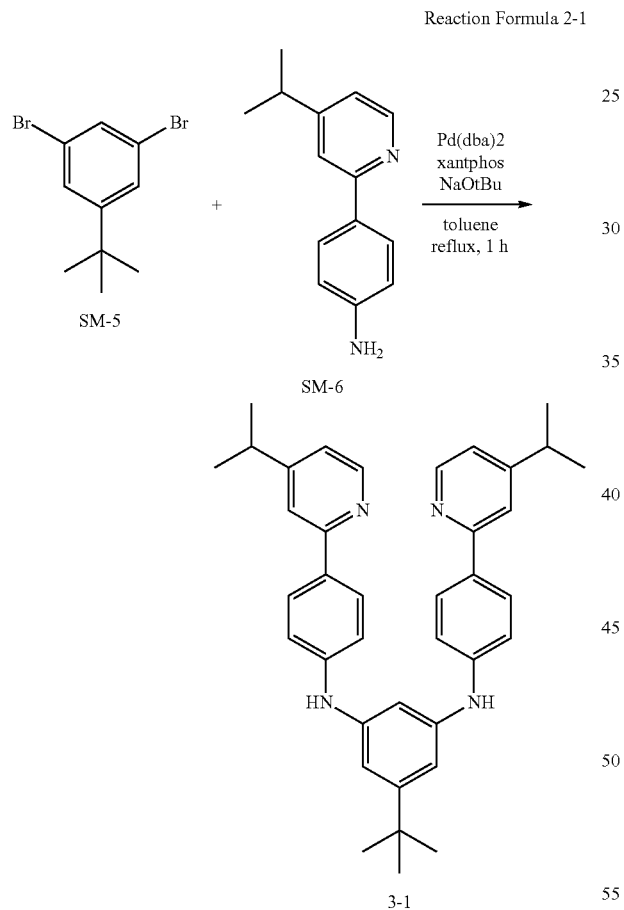

SM-5 (5.84 g, 20 mmol), SM-6 (8.49 g, 40 mmol), Pd(dba)$_2$ (1.15 g, 2.0 mmol), xantphos (1.16 g, 2.0 mmol) and NaOtBu (0.31 g, 80 mmol) dissolved in toluene (200 mL) was added into a 500 mL round-bottom flask, and then the solution was heated at 110° C. for 1 hour with stirring. After the reaction was complete, the solution was cooled down to a room temperature, and the organic layer was extracted with chloroform and was washed with water. The moisture was removed with anhydrous MgSO$_4$, the organic layer was concentrated under reduced pressure and purified with a column chromatography using MC/hexane (1:3) as an eluent to give an intermediate 3-1 (6.77 g, yield: 61%).

(2) Synthesis of Intermediate 3-2

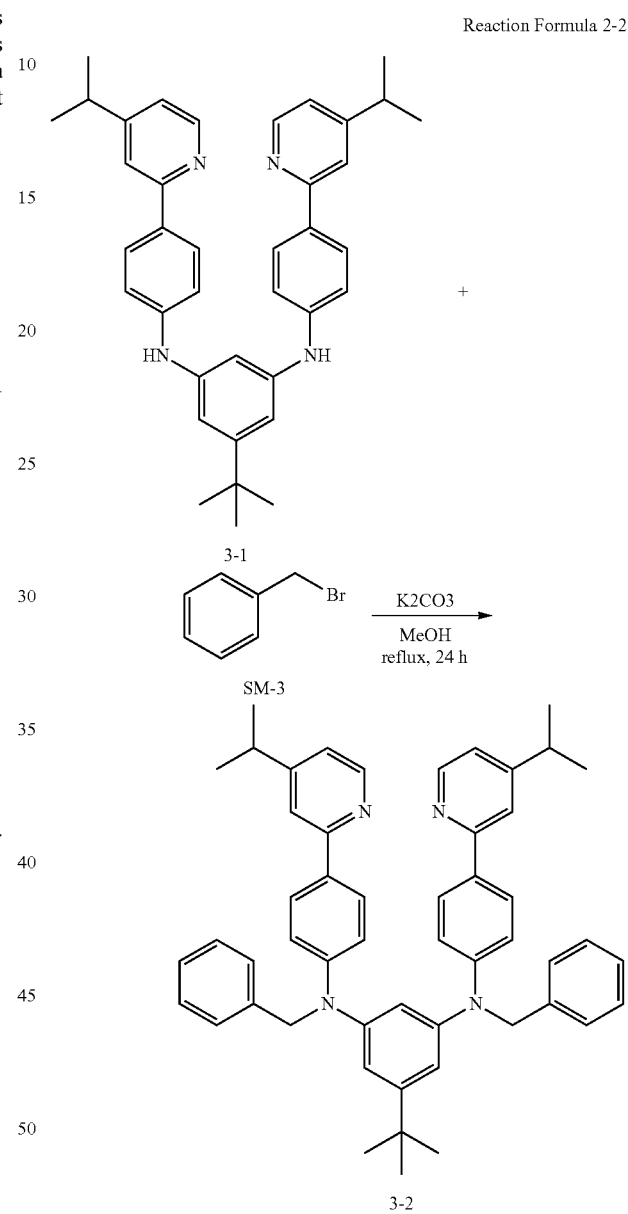

Intermediate 3-1 (5.55 g, 10 mmol), SM-3 (5.1 g, 30 mmol) and K$_2$CO$_3$ (6.9 g, 50 mmol) dissolved in methanol (200 mL) was added into a 500 mL round-bottom flask under nitrogen atmosphere, and the solution was refluxed for 24 hours with stirring. After the reaction was complete, the solution was cooled down to a room temperature, and the organic layer was extracted with chloroform and was washed with water. The moisture was removed with anhydrous MgSO$_4$, the organic layer was concentrated under reduced pressure, and purified with a column chromatography using MC/hexane (1:3) as an eluent to give an intermediate 3-2 (6.76 g, yield: 92%).

(3) Synthesis of Intermediate 3-3

(4) Synthesis of Intermediate 3-4

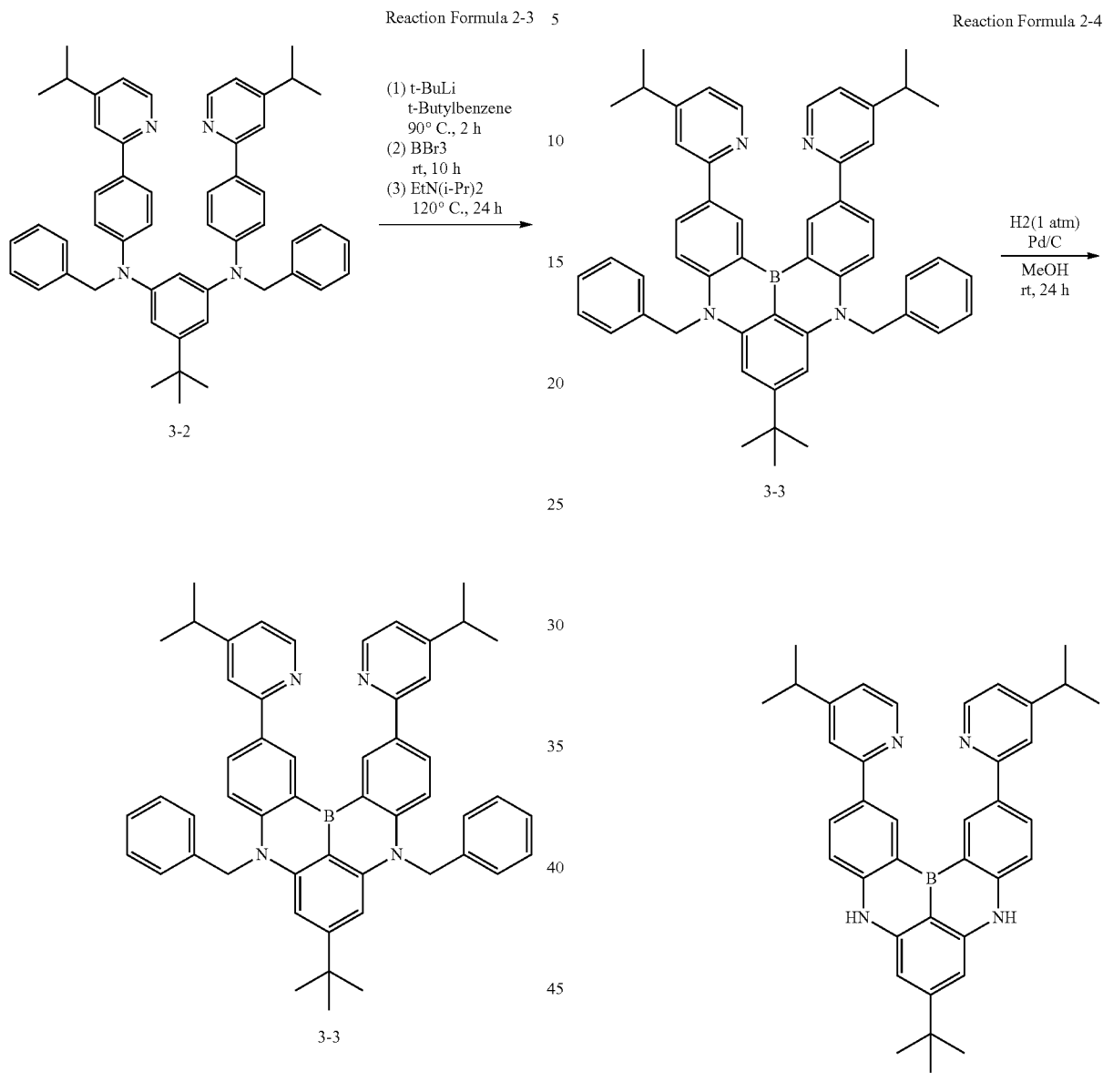

Intermediate 3-2 (7.35 g, 10 mmol) dissolved in t-butylbenzne (100 mL) was added into a 250 mL round-bottom flask under nitrogen atmosphere and the temperature was adjusted to 90° C. 1.7 M t-BuLi (in pentane, 7 mL, 12 mmol) was added drop wise to the flask and the solution was stirred for 2 hours. After the temperature was cooled down to a room temperature, $BBr_3$ (3.00 g, 12 mmol) was slowly added drop wise to the flask and the solution was stirred at a room temperature for 10 hours. EtN(i-Pr)$_2$ (2.58 g, 20 mmol) was added drop wise to the flask and the solution was stirred at 120° C. for 24 hours. After the reaction was complete, the solution was cooled down to a room temperature, and the organic layer was extracted with chloroform and was washed with water. The moisture was removed with anhydrous $MgSO_4$, the organic layer was concentrated under reduced pressure and purified with a column chromatography using MC/hexane (1:3) as an eluent to give an intermediate 3-3 (2.75 g, yield: 37%).

Intermediate 3-3 (7.43 g, 10 mmol) and palladium on activated charcoal (1 g, 10% Pd/C) dissolved in methanol (100 mL) was added into a 250 mL round-bottom flask under hydrogen atmosphere, and then the solution was stirred for 24 hours. After the reaction was complete, the solution was cooled down to a room temperature, and the organic layer was extracted with chloroform and was washed with water. The moisture was removed with anhydrous $MgSO_4$, the organic layer was concentrated under reduced pressure and purified with a column chromatography using MC/hexane (1:3) as an eluent to give an intermediate 3-4 (4.95 g, yield: 88%).

(5) Synthesis of Intermediate 3-5

(6) Synthesis of Compound 3

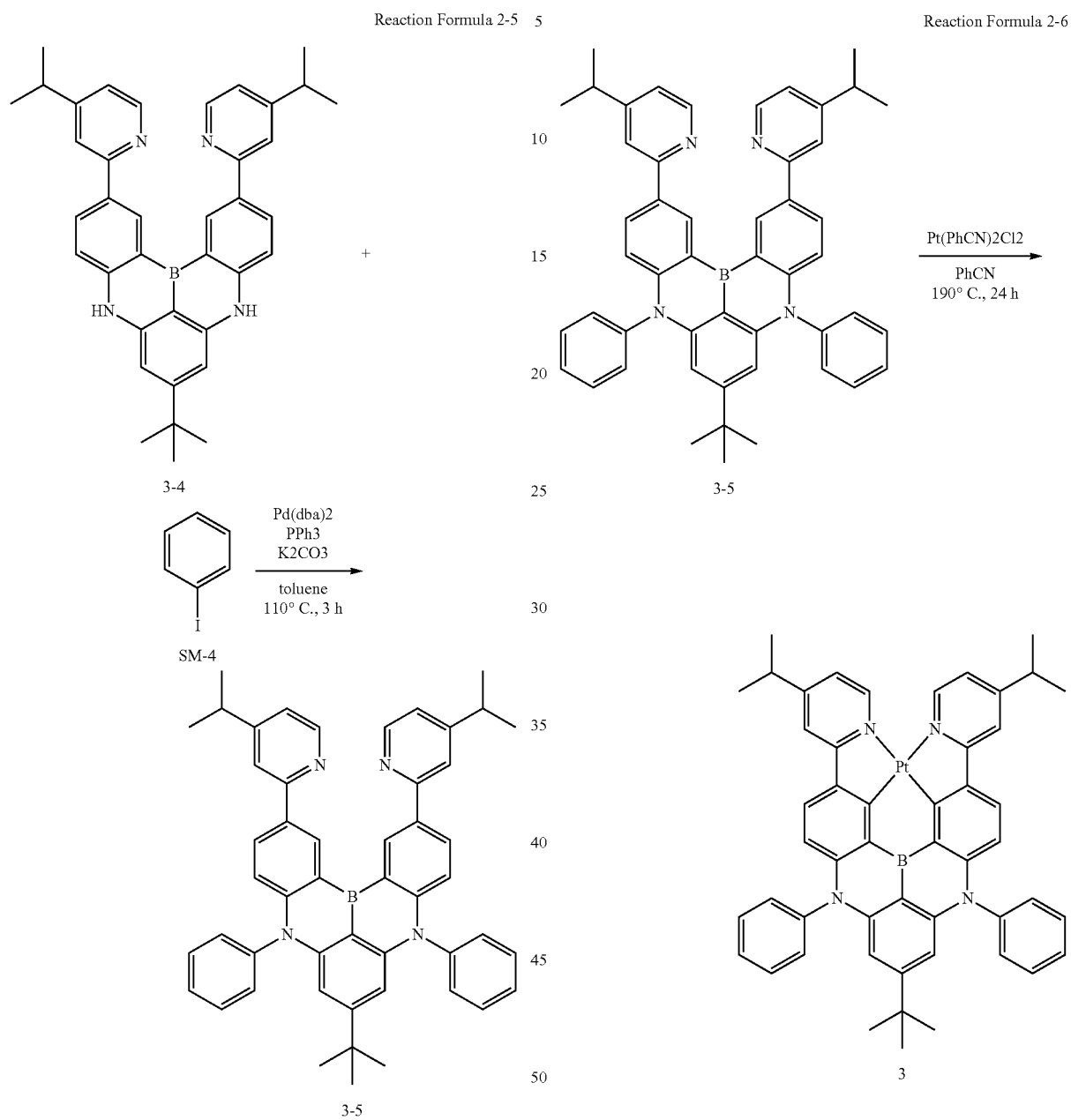

Reaction Formula 2-5

Reaction Formula 2-6

Intermediate 3-4 (11.3 g, 20 mmol), SM-4 (8.16 g, 40 mmol), Pd(dba)$_2$ (1.15 g, 2.0 mmol), PPh$_3$ (0.52 g, 2.0 mmol) and K$_2$CO$_3$ (0.31 g, 80 mmol) dissolved in toluene (200 mL) was added into a 500 mL round-bottom flask under nitrogen atmosphere, and then the solution was heated at 110° C. for 3 hours with stirring. After the reaction was complete, the solution was cooled down to a room temperature, and the organic layer was extracted with chloroform and was washed with water. The moisture was removed with anhydrous MgSO$_4$, the organic layer was concentrated under reduced pressure and purified with a column chromatography using MC/hexane (1:3) as an eluent to give an intermediate 3-5 (13.6 g, yield: 95%).

Intermediate 3-5 (7.15 g, 10 mmol) and Pt(PhCN)$_2$Cl$_2$ (4.72 g, 10 mmol) dissolved in PhCN (100 mL) was added into a 250 round-bottom flask under nitrogen atmosphere, and then the solution was stirred at 190° C. for 24 hours. After the reaction was complete, the solution was cooled down to a room temperature, and the organic layer was extracted chloroform and was washed with water. The moisture was removed with anhydrous MgSO$_4$, the organic layer was concentrated under reduced pressure and purified with a column chromatograph using MC/hexane (5:1) as an eluent to give Compound 3 (2.45 g, yield: 27%).

Synthesis Example 3

Synthesis of Compound 8

(1) Synthesis of Intermediate 8-1

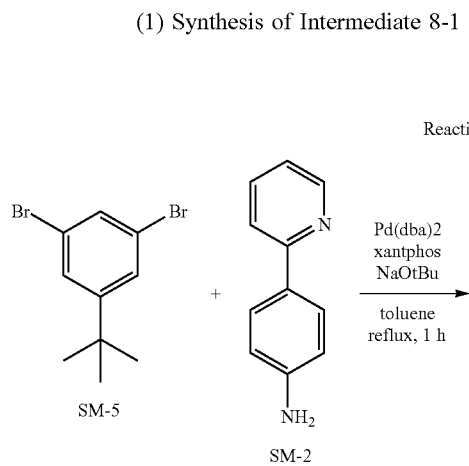

Reaction Formula 3-1

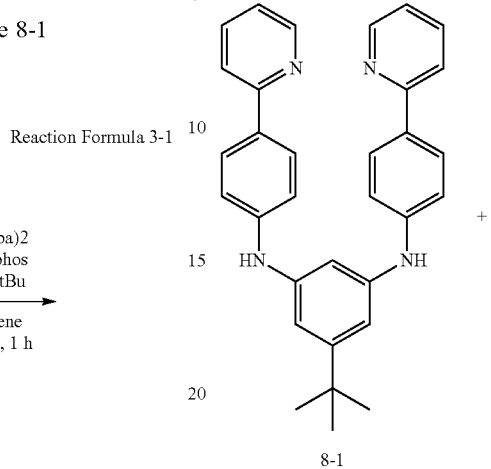

(2) Synthesis of Intermediate 8-2

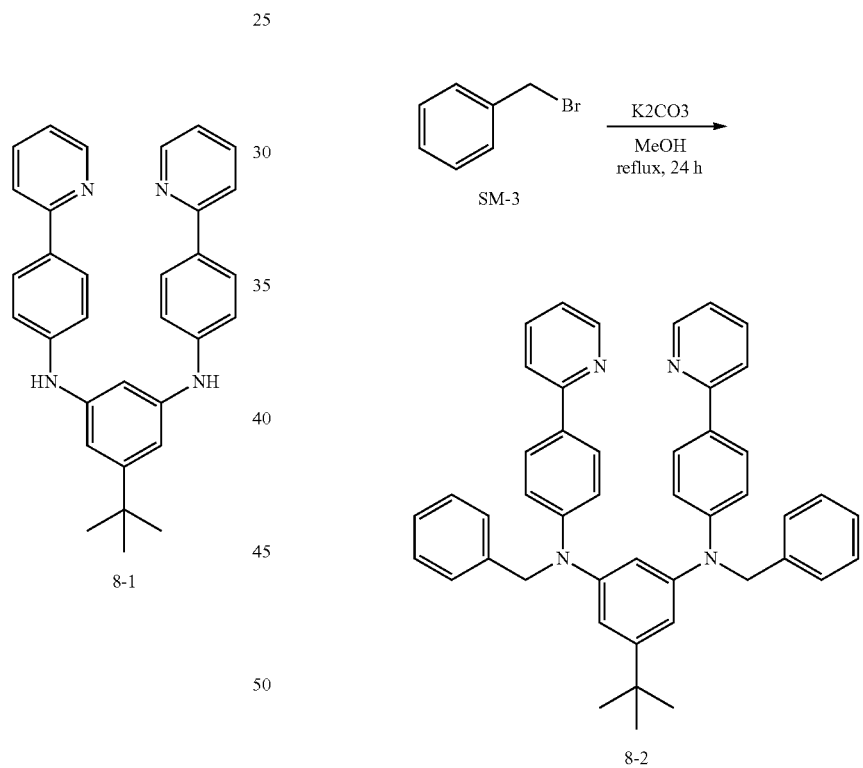

Reaction Formula 3-2

SM-5 (5.84 g, 20 mmol), SM-2 (6.81 g, 40 mmol), Pd(dba)$_2$ (1.15 g, 2.0 mmol), xantphos (1.16 g, 2.0 mmol) and NaOtBu (0.31 g, 80 mmol) dissolved in toluene (200 mL) was added into a 500 mL round-bottom flask, and then the solution was heated at 110° C. for 1 hour with stirring. After the reaction was complete, the solution was cooled down to a room temperature, and the organic layer was extracted with chloroform and was washed with water. The moisture was removed with anhydrous MgSO$_4$, the organic layer was concentrated under reduced pressure and purified with a column chromatography using MC/hexane (1:3) as an eluent to give an intermediate 8-1 (6.31 g, yield: 67%).

Intermediate 8-1 (4.71 g, 10 mmol), SM-3 (5.1 g, 30 mmol) and K$_2$CO$_3$ (6.9 g, 50 mmol) dissolved in methanol (200 mL) was added into a 500 mL round-bottom flask under nitrogen atmosphere, and the solution was refluxed for 24 hours with stirring. After the reaction was complete, the solution was cooled down to a room temperature, and the organic layer was extracted with chloroform and was washed with water. The moisture was removed with anhydrous MgSO$_4$, the organic layer was concentrated under reduced pressure, and purified with a column chromatography using MC/hexane (1:3) as an eluent to give an intermediate 8-2 (5.86 g, yield: 90%).

75

(3) Synthesis of Intermediate 8-3

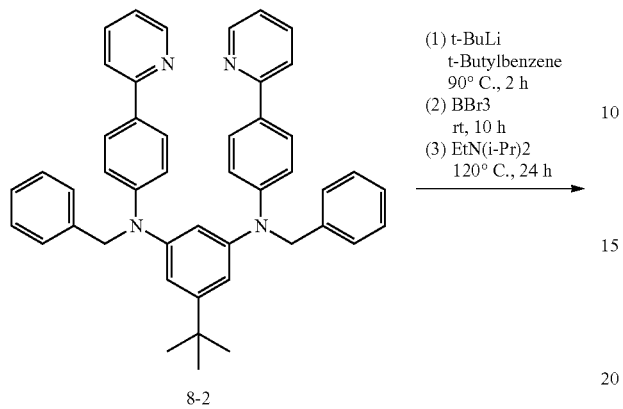

Reaction Formula 3-3

(1) t-BuLi
t-Butylbenzene
90° C., 2 h
(2) BBr3
rt, 10 h
(3) EtN(i-Pr)2
120° C., 24 h

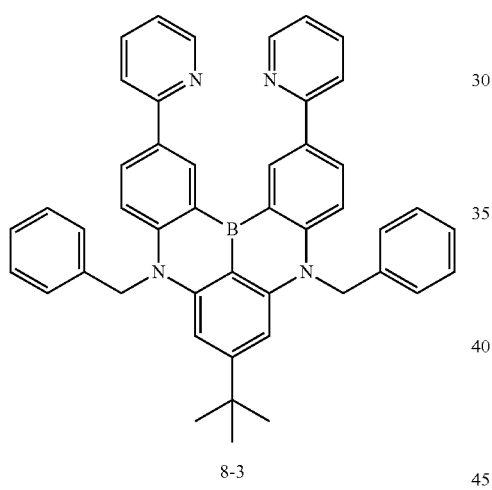

8-3

Intermediate 8-2 (6.51 g, 10 mmol) dissolved in t-butylbenzne (100 mL) was added into a 250 mL round-bottom flask under nitrogen atmosphere and the temperature was adjusted to 90° C. 1.7 M t-BuLi (in pentane, 7 mL, 12 mmol) was added drop wise to the flask and the solution was stirred for 2 hours. After the temperature was cooled down to a room temperature, $BBr_3$ (3.00 g, 12 mmol) was slowly added drop wise to the flask and the solution was stirred at a room temperature for 10 hours. EtN(i-Pr)$_2$ (2.58 g, 20 mmol) was added drop wise to the flask and the solution was stirred at 120° C. for 24 hours. After the reaction was complete, the solution was cooled down to a room temperature, and the organic layer was extracted with chloroform and was washed with water. The moisture was removed with anhydrous $MgSO_4$, the organic layer was concentrated under reduced pressure and purified with a column chromatography using MC/hexane (1:3) as an eluent to give an intermediate 8-3 (2.11 g, yield: 32%).

76

(4) Synthesis of Intermediate 8-4

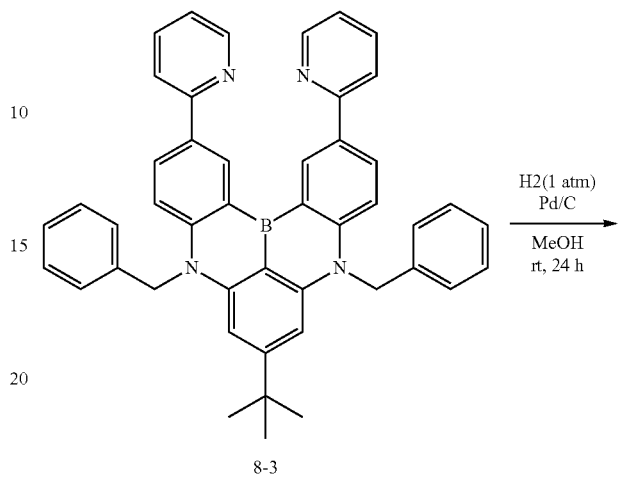

Reaction Formula 3-4

H2(1 atm)
Pd/C

MeOH
rt, 24 h

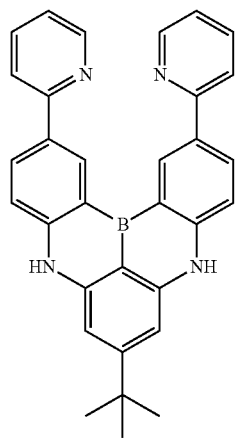

8-4

Intermediate 8-3 (6.89 g, 10 mmol) and palladium on activated charcoal (1 g, 10% Pd/C) dissolved in methanol (100 mL) was added into a 250 mL round-bottom flask under hydrogen atmosphere, and then the solution was stirred for 24 hours. After the reaction was complete, the solution was cooled down to a room temperature, and the organic layer was extracted with chloroform and was washed with water. The moisture was removed with anhydrous $MgSO_4$, the organic layer was concentrated under reduced pressure and purified with a column chromatography using MC/hexane (1:3) as an eluent to give an intermediate 8-4 (4.31 g, yield: 90%).

(5) Synthesis of Intermediate 8-5

(6) Synthesis of Compound 8

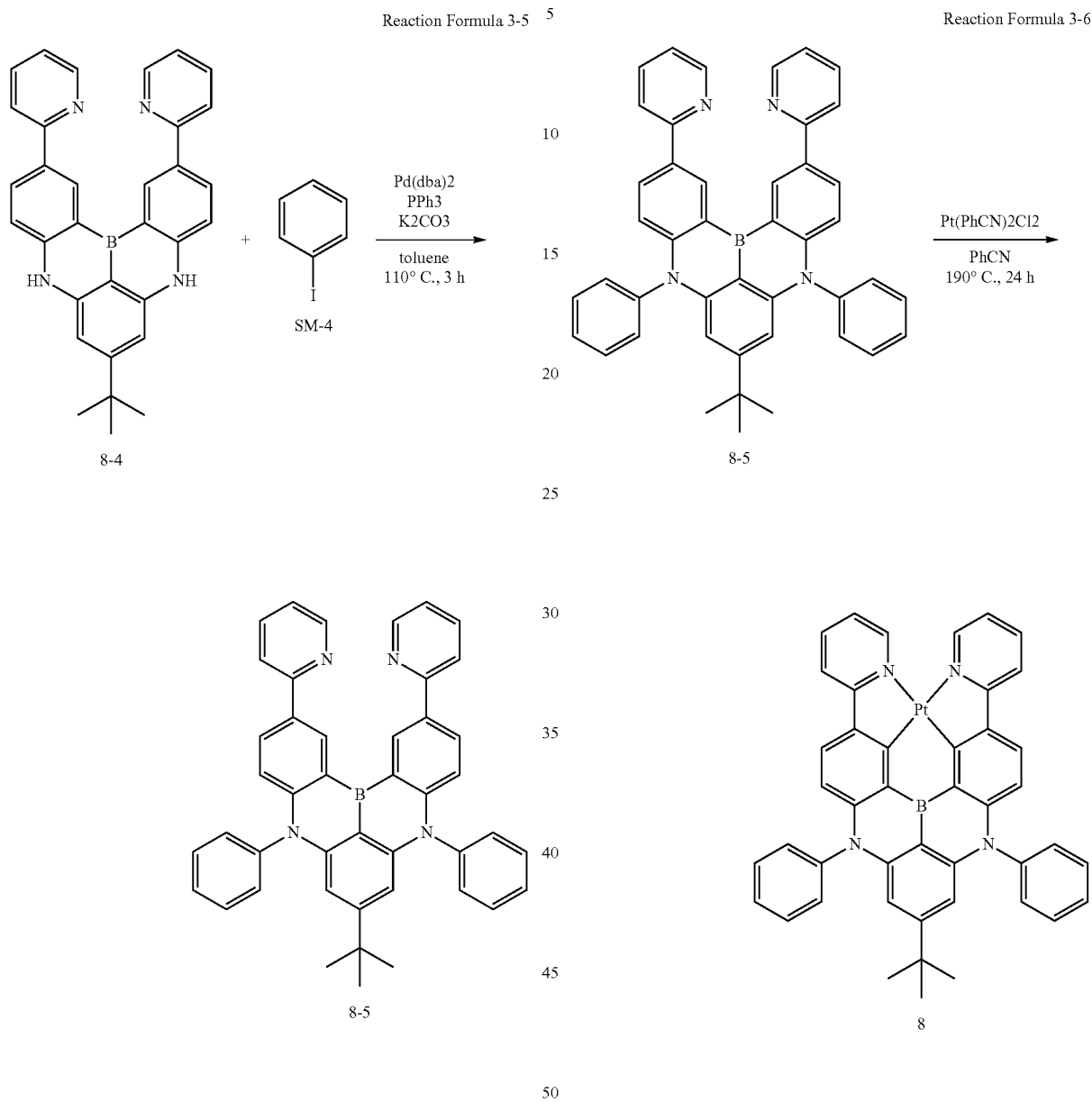

Intermediate 8-4 (9.57 g, 20 mmol), SM-4 (8.16 g, 40 mmol), Pd(dba)$_2$ (1.15 g, 2.0 mmol), PPh$_3$ (0.52 g, 2.0 mmol) and K$_2$CO$_3$ (0.31 g, 80 mmol) dissolved in toluene (200 mL) was added into a 500 mL round-bottom flask under nitrogen atmosphere, and then the solution was heated at 110° C. for 3 hours with stirring. After the reaction was complete, the solution was cooled down to a room temperature, and the organic layer was extracted with chloroform and was washed with water. The moisture was removed with anhydrous MgSO$_4$, the organic layer was concentrated under reduced pressure and purified with a column chromatography using MC/hexane (1:3) as an eluent to give an intermediate 8-5 (11.5 g, yield: 91%).

Intermediate 8-5 (6.31 g, 10 mmol) and Pt(PhCN)$_2$Cl$_2$ (4.72 g, 10 mmol) dissolved in PhCN (100 mL) was added into a 250 round-bottom flask under nitrogen atmosphere, and then the solution was stirred at 190° C. for 24 hours. After the reaction was complete, the solution was cooled down to a room temperature, and the organic layer was extracted chloroform and was washed with water. The moisture was removed with anhydrous MgSO$_4$, the organic layer was concentrated under reduced pressure and purified with a column chromatograph using MC/hexane (5:1) as an eluent to give Compound 8 (2.47 g, yield: 30%).

Synthesis Example 4

Synthesis of Compound 13

(1) Synthesis of Intermediate 13-1

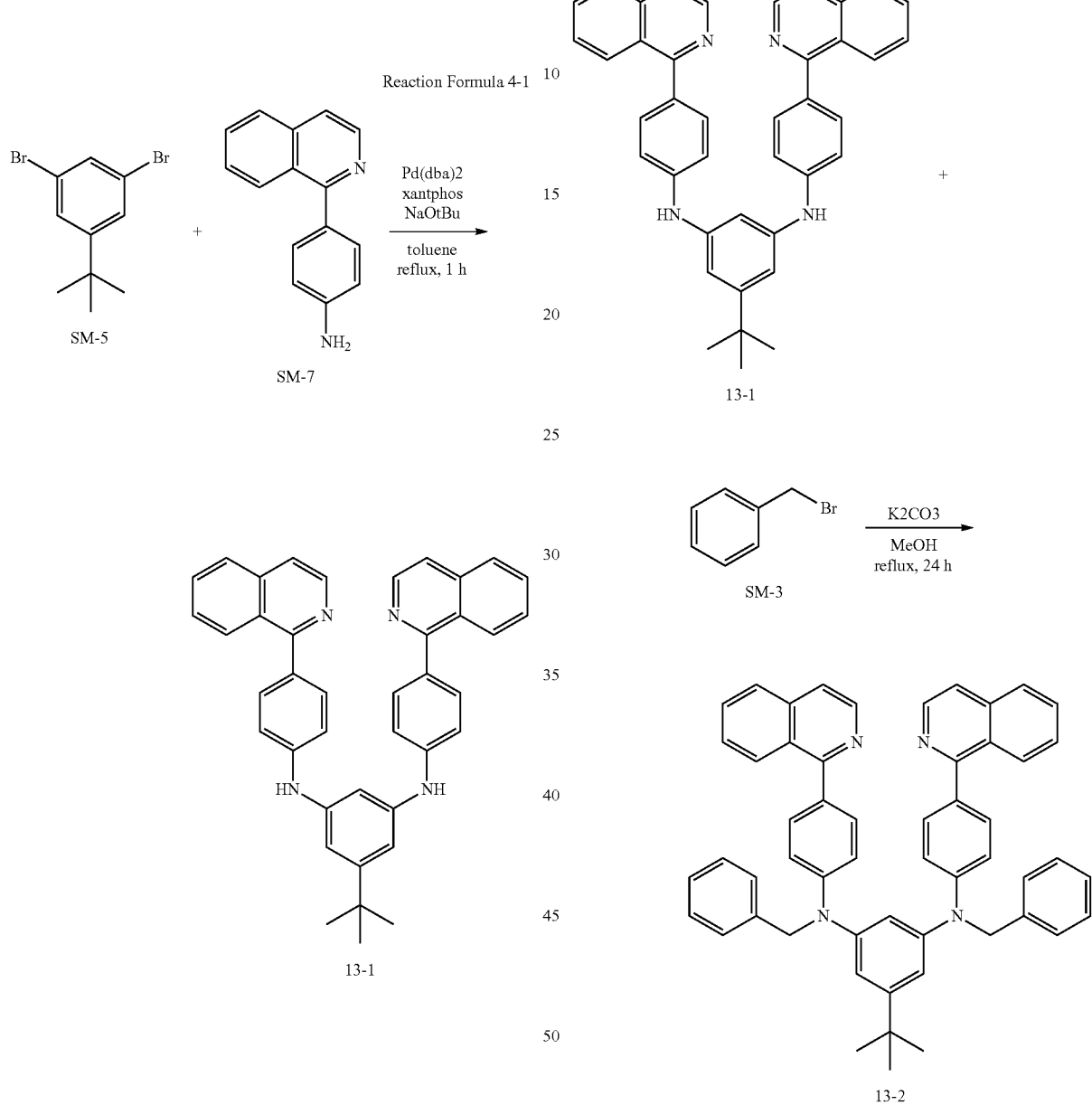

Reaction Formula 4-1

Reaction Formula 4-2

SM-5 (5.84 g, 20 mmol), SM-7 (8.81 g, 40 mmol), Pd(dba)$_2$ (1.15 g, 2.0 mmol), xantphos (1.16 g, 2.0 mmol) and NaOtBu (0.31 g, 80 mmol) dissolved in toluene (200 mL) was added into a 500 mL round-bottom flask, and then the solution was heated at 110° C. for 1 hour with stirring. After the reaction was complete, the solution was cooled down to a room temperature, and the organic layer was extracted with chloroform and was washed with water. The moisture was removed with anhydrous MgSO$_4$, the organic layer was concentrated under reduced pressure and purified with a column chromatography using MC/hexane (1:3) as an eluent to give an intermediate 13-1 (7.53 g, yield: 66%).

(2) Synthesis of Intermediate 13-2

Intermediate 13-1 (5.71 g, 10 mmol), SM-3 (5.1 g, 30 mmol) and K$_2$CO$_3$ (6.9 g, 50 mmol) dissolved in methanol (200 mL) was added into a 500 mL round-bottom flask under nitrogen atmosphere, and the solution was refluxed for 24 hours with stirring. After the reaction was complete, the solution was cooled down to a room temperature, and the organic layer was extracted with chloroform and was washed with water. The moisture was removed with anhydrous MgSO$_4$, the organic layer was concentrated under reduced pressure, and purified with a column chromatography using MC/hexane (1:3) as an eluent to give an intermediate 13-2 (6.76 g, yield: 90%).

(3) Synthesis of Intermediate 13-3

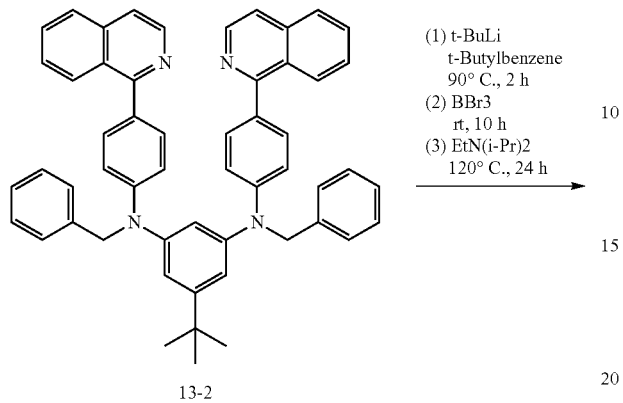

Reaction Formula 4-3

(1) t-BuLi
   t-Butylbenzene
   90° C., 2 h
(2) BBr3
   rt, 10 h
(3) EtN(i-Pr)2
   120° C., 24 h

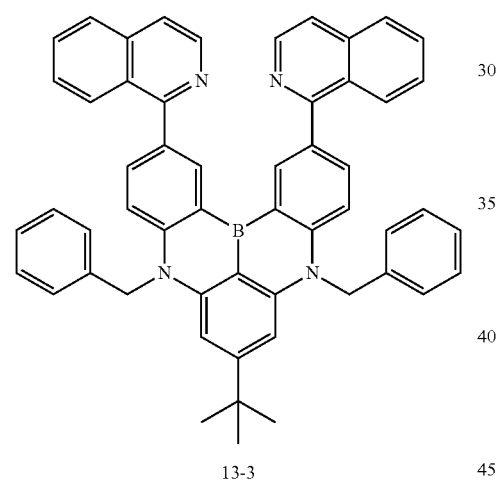

Intermediate 13-2 (7.51 g, 10 mmol) dissolved in t-butylbenzne (100 mL) was added into a 250 mL round-bottom flask under nitrogen atmosphere and the temperature was adjusted to 90° C. 1.7 M t-BuLi (in pentane, 7 mL, 12 mmol) was added drop wise to the flask and the solution was stirred for 2 hours. After the temperature was cooled down to a room temperature, $BBr_3$ (3.00 g, 12 mmol) was slowly added drop wise to the flask and the solution was stirred at a room temperature for 10 hours. EtN(i-Pr)$_2$ (2.58 g, 20 mmol) was added drop wise to the flask and the solution was stirred at 120° C. for 24 hours. After the reaction was complete, the solution was cooled down to a room temperature, and the organic layer was extracted with chloroform and was washed with water. The moisture was removed with anhydrous $MgSO_4$, the organic layer was concentrated under reduced pressure and purified with a column chromatography using MC/hexane (1:3) as an eluent to give an intermediate 13-3 (2.96 g, yield: 39%).

(4) Synthesis of Intermediate 13-4

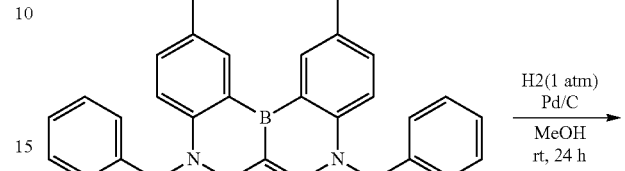

Reaction Formula 4-4

H2(1 atm)
Pd/C
MeOH
rt, 24 h

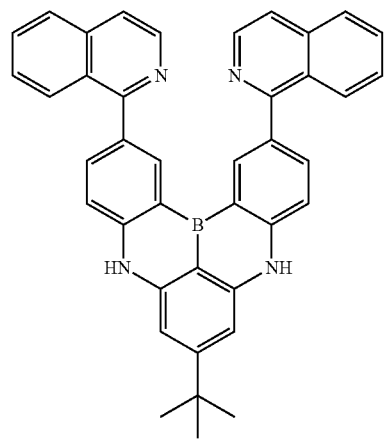

Intermediate 13-3 (7.59 g, 10 mmol) and palladium on activated charcoal (1 g, 10% Pd/C) dissolved in methanol (100 mL) was added into a 250 mL round-bottom flask under hydrogen atmosphere, and then the solution was stirred for 24 hours. After the reaction was complete, the solution was cooled down to a room temperature, and the organic layer was extracted with chloroform and was washed with water. The moisture was removed with anhydrous $MgSO_4$, the organic layer was concentrated under reduced pressure and purified with a column chromatography using MC/hexane (1:3) as an eluent to give an intermediate 13-4 (5.20 g, yield: 90%).

(5) Synthesis of Intermediate 13-5

(6) Synthesis of Compound 13

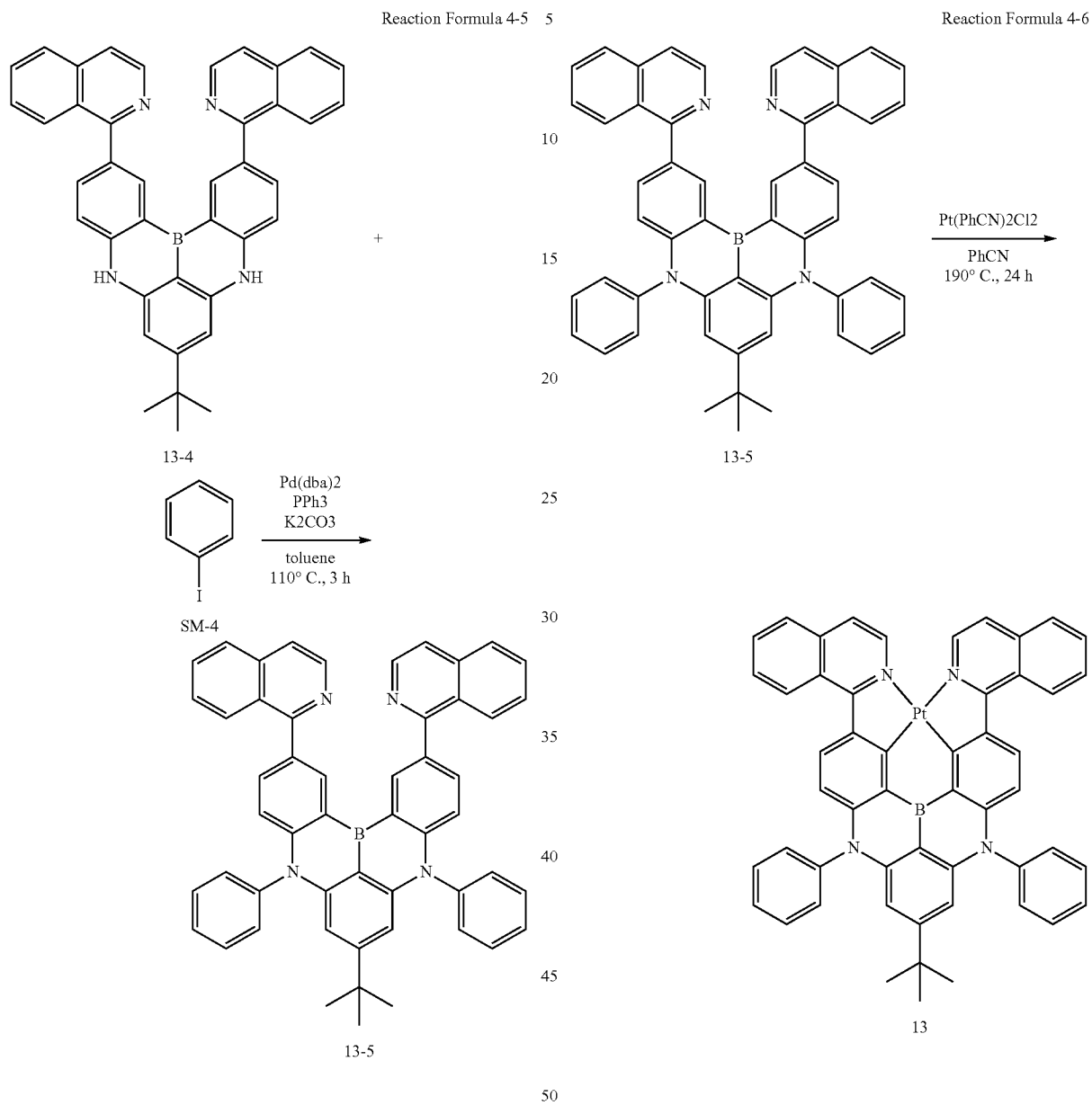

Intermediate 13-4 (11.6 g, 20 mmol), SM-4 (8.16 g, 40 mmol), Pd(dba)$_2$ (1.15 g, 2.0 mmol), PPh$_3$ (0.52 g, 2.0 mmol) and K$_2$CO$_3$ (0.31 g, 80 mmol) dissolved in toluene (200 mL) was added into a 500 mL round-bottom flask under nitrogen atmosphere, and then the solution was heated at 110° C. for 3 hours with stirring. After the reaction was complete, the solution was cooled down to a room temperature, and the organic layer was extracted with chloroform and was washed with water. The moisture was removed with anhydrous MgSO$_4$, the organic layer was concentrated under reduced pressure and purified with a column chromatography using MC/hexane (1:3) as an eluent to give an intermediate 13-5 (13.4 g, yield: 92%).

Intermediate 13-5 (7.31 g, 10 mmol) and Pt(PhCN)$_2$Cl$_2$ (4.72 g, 10 mmol) dissolved in PhCN (100 mL) was added into a 250 round-bottom flask under nitrogen atmosphere, and then the solution was stirred at 190° C. for 24 hours. After the reaction was complete, the solution was cooled down to a room temperature, and the organic layer was extracted chloroform and was washed with water. The moisture was removed with anhydrous MgSO$_4$, the organic layer was concentrated under reduced pressure and purified with a column chromatograph using MC/hexane (5:1) as an eluent to give Compound 13 (2.77 g, yield: 30%).

Synthesis Example 5

Synthesis of Compound 16

(1) Synthesis of Intermediate 16-1

Reaction Formula 5-1

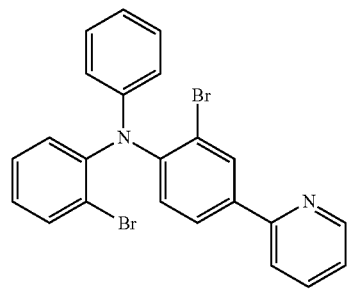

SM-8

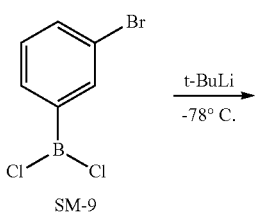

SM-9

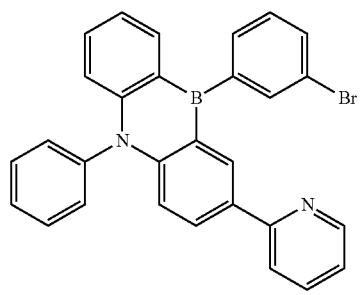

16-1

SM-8 (4.80 g, 10 mmol) dissolved in diethylether (100 mL) was added into a 250 mL round-bottom flask under nitrogen atmosphere and the temperature was adjusted to −78° C. 1.7 M t-BuLi (in pentane, 7 mL, 12 mmol) was added drop wise to the flask and the solution was stirred for 2 hours. SM-9 (2.38 g, 10 mmol) was added drop wise to the flask and the solution was stirred for 1 hour. After raising the temperature to a room temperature, the solution was stirred again for 5 hours. After the reaction was complete, the organic layer was extracted with chloroform and was washed with water. The moisture was removed with anhydrous $MgSO_4$, the organic layer was concentrated under reduced pressure and purified with a column chromatography using MC/hexane (1:3) as an eluent to give an intermediate 16-1 (3.96 g, yield: 39%).

(2) Synthesis of Intermediate 16-2

Reaction Formula 5-2

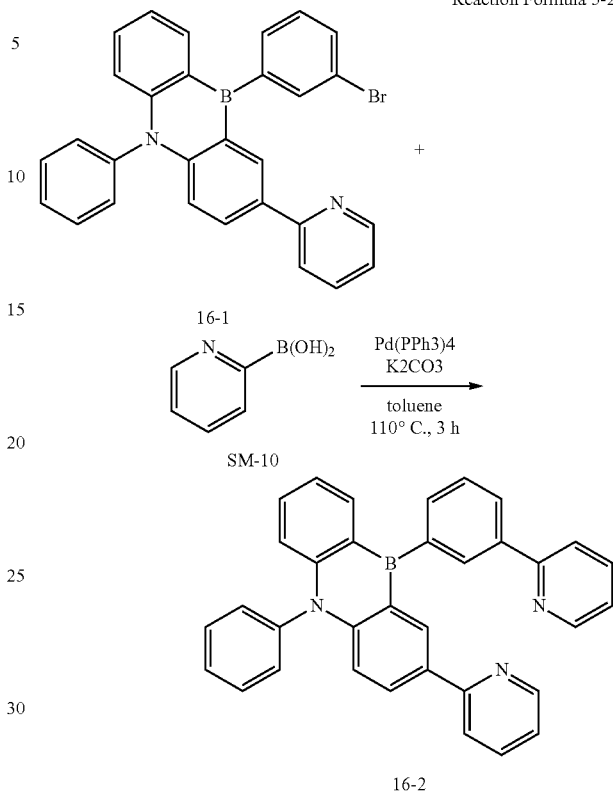

Intermediate 16-1 (9.74 g, 20 mmol), SM-10 (2.46 g, 20 mmol), tetrakis(triphenylphosphine)palladium(0) (Pd(PPh$_3$)$_4$, 1.16 g, 1.0 mmol) and K$_2$CO$_3$ (8.28 g, 60 mmol) dissolved in toluene (200 mL) was added into a 500 mL round-bottom flask under nitrogen atmosphere, and then the solution was heated at 110° C. for 3 hours with stirring. After the reaction was complete, the solution was cooled down to a room temperature, and the organic layer was extracted with chloroform and was washed with water. The moisture was removed with anhydrous MgSO$_4$, the organic layer was concentrated under reduced pressure and purified with a column chromatography using MC/hexane (1:3) as an eluent to give an intermediate 16-2 (9.22 g, yield: 95%).

(3) Synthesis of Compound 16

Reaction Formula 5-3

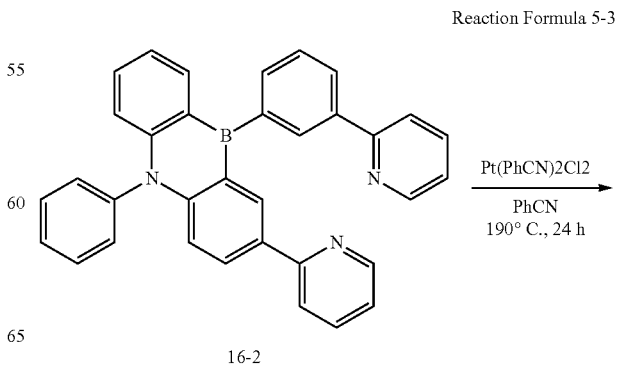

16-2

-continued

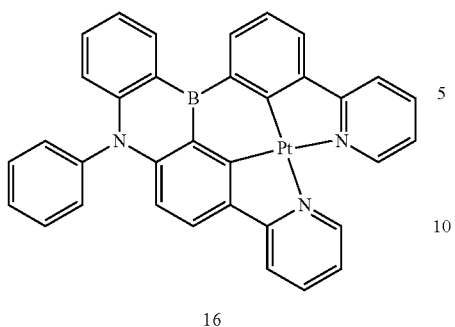

16

Intermediate 16-2 (4.85 g, 10 mmol) and Pt(PhCN)₂Cl₂ (4.72 g, 10 mmol) dissolved in PhCN (100 mL) was added into a 250 round-bottom flask under nitrogen atmosphere, and then the solution was stirred at 190° C. for 24 hours. After the reaction was complete, the solution was cooled down to a room temperature, and the organic layer was extracted chloroform and was washed with water. The moisture was removed with anhydrous MgSO₄, the organic layer was concentrated under reduced pressure and purified with a column chromatograph using MC/hexane (5:1) as an eluent to give Compound 16 (2.51 g, yield: 37%).

Synthesis Example 6

Synthesis of Compound 17

(1) Synthesis of Intermediate 17-1

-continued

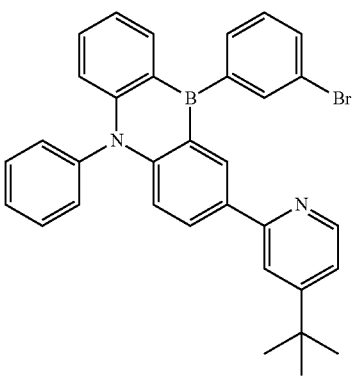

17-1

SM-11 (5.36 g, 10 mmol) dissolved in diethylether (100 mL) was added into a 250 mL round-bottom flask under nitrogen atmosphere and the temperature was adjusted to −78° C. 1.7 M t-BuLi (in pentane, 7 mL, 12 mmol) was added drop wise to the flask and the solution was stirred for 2 hours. SM-9 (2.38 g, 10 mmol) was added drop wise to the flask and the solution was stirred for 1 hour. After raising the temperature to a room temperature, the solution was stirred again for 5 hours. After the reaction was complete, the organic layer was extracted with chloroform and was washed with water. The moisture was removed with anhydrous MgSO₄, the organic layer was concentrated under reduced pressure and purified with a column chromatography using MC/hexane (1:3) as an eluent to give an intermediate 17-1 (4.18 g, yield: 77%).

(2) Synthesis of Intermediate 17-2

Reaction Formula 6-1

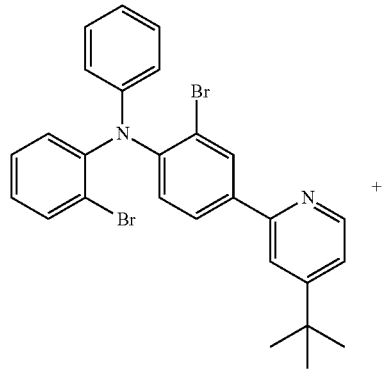

SM-11

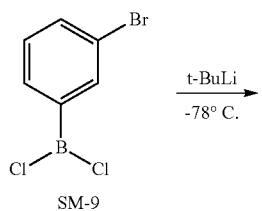

SM-9 t-BuLi
−78° C.

Reaction Formula 6-2

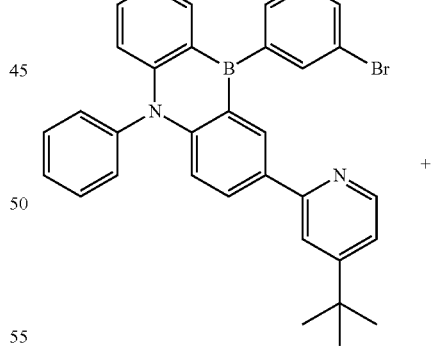

17-1

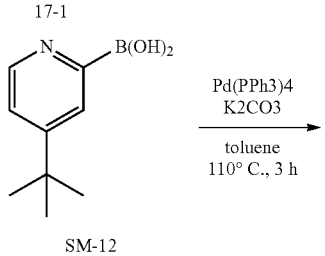

SM-12

Pd(PPh3)4
K2CO3 toluene
110° C., 3 h

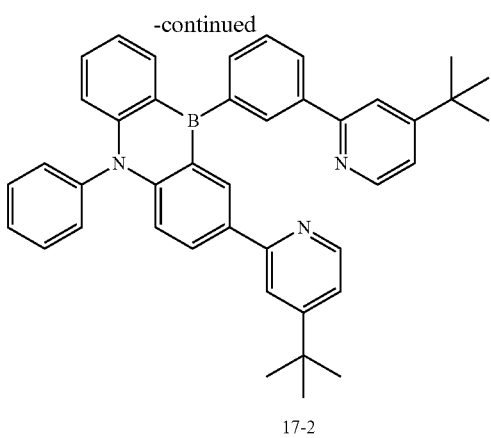

17-2

Intermediate 17-1 (10.9 g, 20 mmol), SM-12 (3.58 g, 20 mmol), Pd(PPh$_3$)$_4$ (1.16 g, 1.0 mmol) and K$_2$CO$_3$ (8.28 g, 60 mmol) dissolved in toluene (200 mL) was added into a 500 mL round-bottom flask under nitrogen atmosphere, and then the solution was heated at 110° C. for 2 hours with stirring. After the reaction was complete, the solution was cooled down to a room temperature, and the organic layer was extracted with chloroform and was washed with water. The moisture was removed with anhydrous MgSO$_4$, the organic layer was concentrated under reduced pressure and purified with a column chromatography using MC/hexane (1:3) as an eluent to give an intermediate 17-2 (10.9 g, yield: 91%).

(3) Synthesis of Compound 17

Reaction Formula 6-3

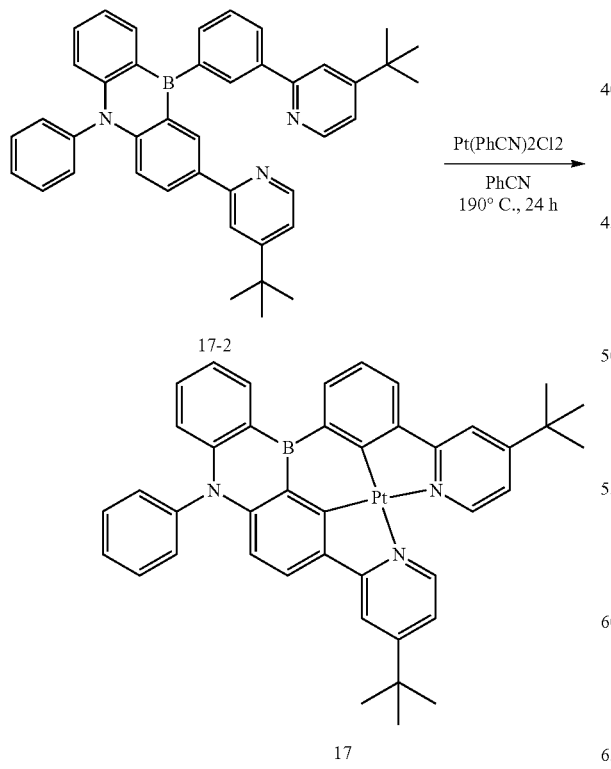

Intermediate 17-2 (5.98 g, 10 mmol) and Pt(PhCN)$_2$Cl$_2$ (4.72 g, 10 mmol) dissolved in PhCN (100 mL) was added into a 250 round-bottom flask under nitrogen atmosphere, and then the solution was stirred at 190° C. for 24 hours. After the reaction was complete, the solution was cooled down to a room temperature, and the organic layer was extracted chloroform and was washed with water. The moisture was removed with anhydrous MgSO$_4$, the organic layer was concentrated under reduced pressure and purified with a column chromatograph using MC/hexane (5:1) as an eluent to give Compound 17 (2.69 g, yield: 34%).

Synthesis Example 7

Synthesis of Compound 42

(1) Synthesis of Intermediate 42-1

Reaction Formula 7-1

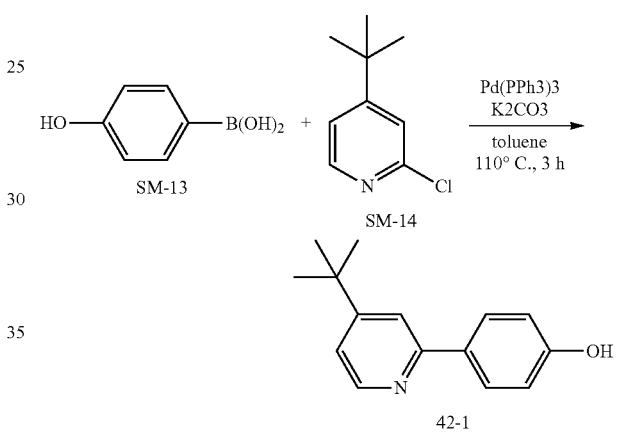

SM-13 (2.76 g, 10 mmol), SM-14 (3.40 g, 20 mmol), Pd(PPh$_3$)$_4$ (1.16 g, 1.0 mmol) and K$_2$CO$_3$ (8.28 g, 60 mmol) dissolved in toluene (200 mL) was added into a 500 mL round-bottom flask under nitrogen atmosphere, and the solution was heated at 110° C. for 2 hours. After the reaction was complete, the solution was cooled down to a room temperature, and the organic layer was extracted with chloroform and was washed with water. The moisture was removed with anhydrous MgSO$_4$, the organic layer was concentrated under reduced pressure, and purified with a column chromatography using MC/hexane (1:3) as an eluent to give an intermediate 42-1 (4.236 g, yield: 93%).

(2) Synthesis of Intermediate 42-2

Reaction Formula 7-2

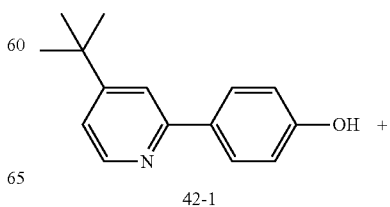

-continued

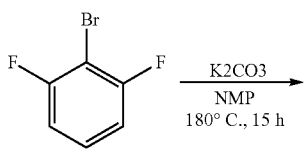

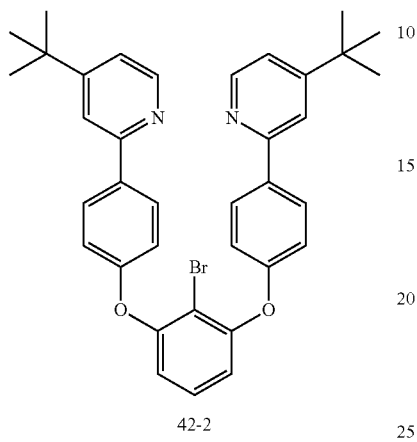

42-2

Intermediate 42-1 (4.55 g, 20 mmol), SM-15 (1.93 g, 10 mmol) and K₂CO₃ (6.90 g, 50 mmol) dissolved in N-methyl-2-pyrrolidone (NMP, 100 mL) was added into a 250 mL round-bottom flask under nitrogen atmosphere, and then the solution was heated at 150° C. for 15 hours with stirring. After the reaction was complete, the solution was cooled down to a room temperature, NMP was removed under reduced pressure, and the organic layer was extracted with chloroform and was washed with water. The moisture was removed with anhydrous MgSO₄, the organic layer was concentrated under reduced pressure and purified with a column chromatography using MC/hexane (1:3) as an eluent to give an intermediate 42-2 (5.04 g, yield: 83%).

(3) Synthesis of Intermediate 42-3

-continued

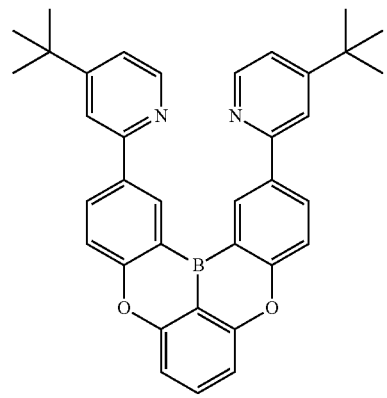

42-3

Intermediate 42-2 (6.08 g, 10 mmol) dissolved in t-butyl-benzne (100 mL) was added into a 250 mL round-bottom flask under nitrogen atmosphere and the temperature was adjusted to 60° C. 1.7 M t-BuLi (in pentane, 7 mL, 12 mmol) was added drop wise to the flask and the solution was stirred for 2 hours. After the temperature was cooled down to a room temperature, BBr₃ (3.00 g, 12 mmol) was slowly added drop wise to the flask and the solution was stirred at a room temperature for 30 minutes. EtN(i-Pr)₂ (2.58 g, 20 mmol) was added drop wise to the flask and the solution was stirred at 120° C. for 3 hours. After the reaction was complete, the solution was cooled down to a room temperature, and the organic layer was extracted with chloroform and was washed with water. The moisture was removed with anhydrous MgSO₄, the organic layer was concentrated under reduced pressure and purified with a column chromatography using MC/hexane (1:3) as an eluent to give an intermediate 42-3 (1.99 g, yield: 37%).

(4) Synthesis of Compound 42

Reaction Formula 7-3

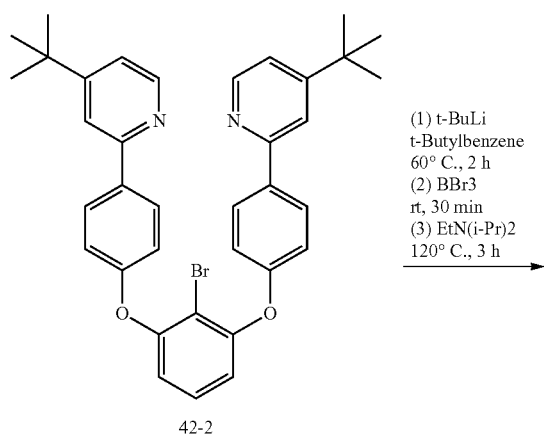

Reaction Formula 7-4

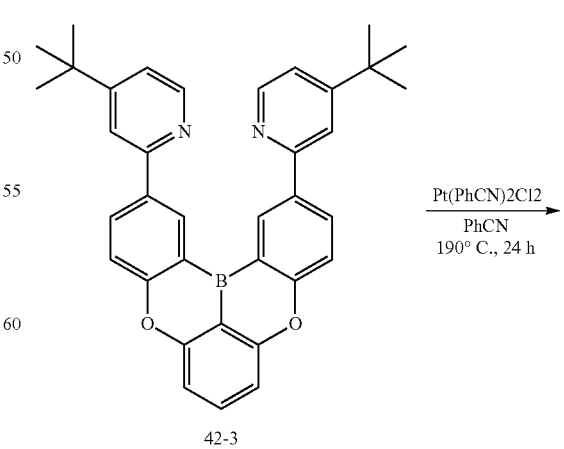

93

-continued

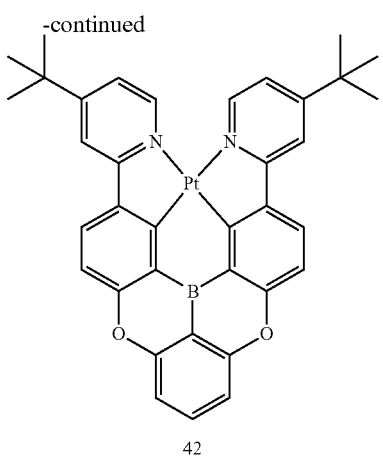

42

Intermediate 42-3 (5.37 g, 10 mmol) and Pt(PhCN)$_2$Cl$_2$ (4.72 g, 10 mmol) dissolved in PhCN (100 mL) was added into a 250 round-bottom flask under nitrogen atmosphere, and then the solution was stirred at 190° C. for 24 hours. After the reaction was complete, the solution was cooled down to a room temperature, and the organic layer was extracted chloroform and was washed with water. The moisture was removed with anhydrous MgSO$_4$, the organic layer was concentrated under reduced pressure and purified with a column chromatograph using MC/hexane (5:1) as an eluent to give Compound 42 (2.85 g, yield: 39%).

Synthesis Example 8

Synthesis of Compound 31

(1) Synthesis of Intermediate 31-1

Reaction Formula 8-1

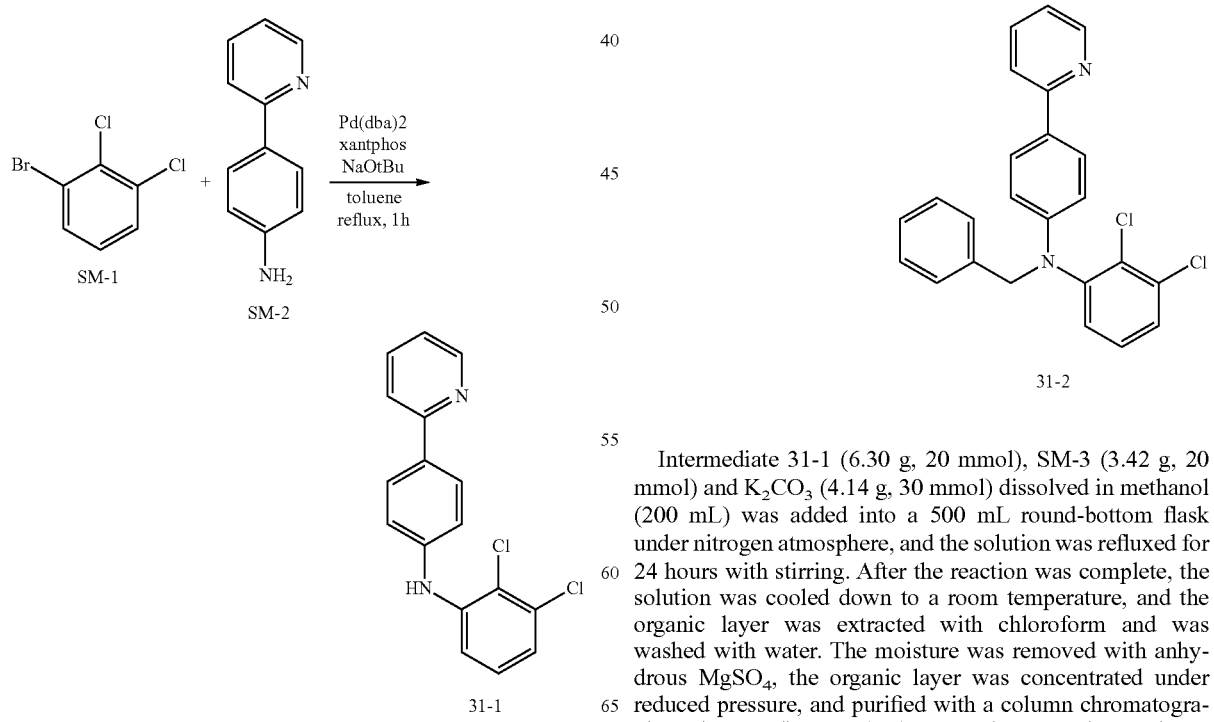

94

SM-1 (4.52 g, 20 mmol), SM-2 (3.40 g, 20 mmol), Pd(dba)$_2$ (1.15 g, 2.0 mmol), xantphos (1.16 g, 2.0 mmol) and NaOtBu (0.31 g, 80 mmol) dissolved in toluene (200 mL) was added into a 500 mL round-bottom flask, and then the solution was heated at 110° C. for 1 hour with stirring. After the reaction was complete, the solution was cooled down to a room temperature, and the organic layer was extracted with chloroform and was washed with water. The moisture was removed with anhydrous MgSO$_4$, the organic layer was concentrated under reduced pressure and purified with a column chromatography using MC/hexane (1:3) as an eluent to give an intermediate 31-1 (5.04 g, yield: 80%).

(2) Synthesis of Intermediate 31-2

Reaction Formula 8-2

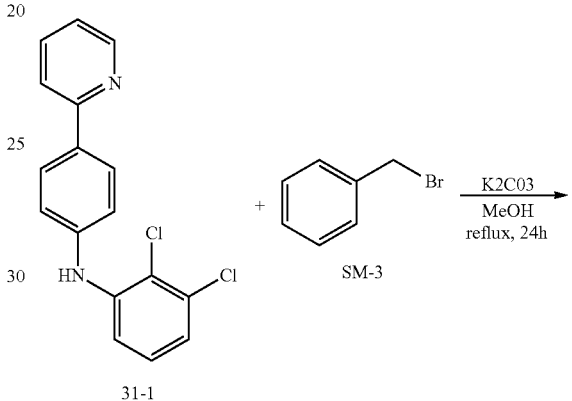

Intermediate 31-1 (6.30 g, 20 mmol), SM-3 (3.42 g, 20 mmol) and K$_2$CO$_3$ (4.14 g, 30 mmol) dissolved in methanol (200 mL) was added into a 500 mL round-bottom flask under nitrogen atmosphere, and the solution was refluxed for 24 hours with stirring. After the reaction was complete, the solution was cooled down to a room temperature, and the organic layer was extracted with chloroform and was washed with water. The moisture was removed with anhydrous MgSO$_4$, the organic layer was concentrated under reduced pressure, and purified with a column chromatography using MC/hexane (1:3) as an eluent to give an intermediate 31-2 (7.54 g, yield: 93%).

(3) Synthesis of Intermediate 31-3

(4) Synthesis of Intermediate 31-4

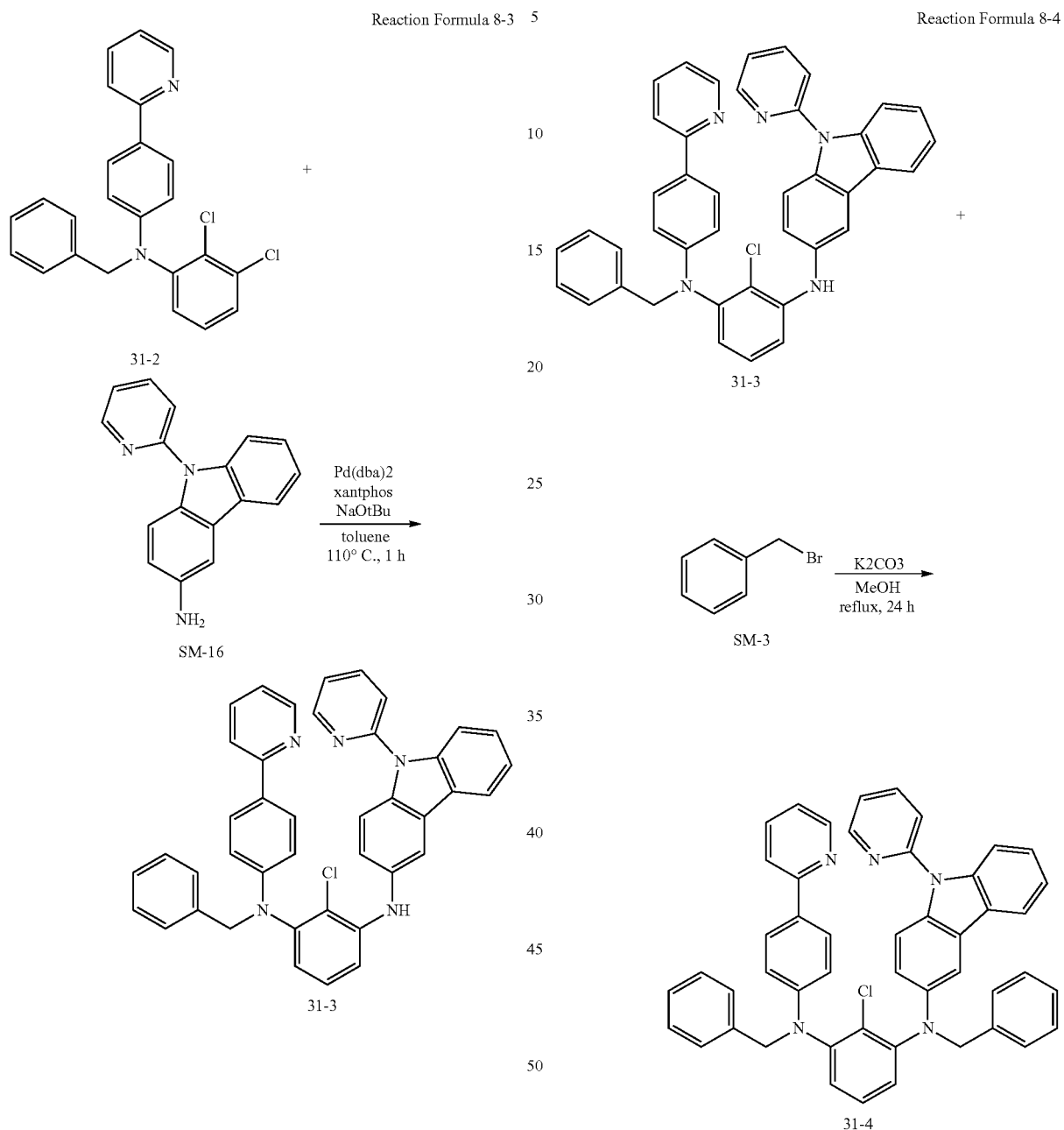

Reaction Formula 8-3

Reaction Formula 8-4

Intermediate 31-2 (11 g, 20 mmol), SM-16 (5.19 g, 20 mmol), Pd(dba)₂ (1.15 g, 2.0 mmol), xantphos (1.16 g, 2.0 mmol) and NaOtBu (0.31 g, 80 mmol) dissolved in toluene (200 mL) was added into a 500 mL round-bottom flask, and then the solution was heated at 110° C. for 1 hour with stirring. After the reaction was complete, the solution was cooled down to a room temperature, and the organic layer was extracted with chloroform and was washed with water. The moisture was removed with anhydrous MgSO₄, the organic layer was concentrated under reduced pressure and purified with a column chromatography using MC/hexane (1:3) as an eluent to give an intermediate 31-3 (10.7 g, yield: 85%).

Intermediate 31-3 (12.6 g, 20 mmol), SM-3 (3.42 g, 20 mmol) and K₂CO₃ (4.14 g, 30 mmol) dissolved in methanol (200 mL) was added into a 500 mL round-bottom flask under nitrogen atmosphere, and the solution was refluxed for 24 hours with stirring. After the reaction was complete, the solution was cooled down to a room temperature, and the organic layer was extracted with chloroform and was washed with water. The moisture was removed with anhydrous MgSO₄, the organic layer was concentrated under reduced pressure, and purified with a column chromatography using MC/hexane (1:3) as an eluent to give an intermediate 31-4 (12.9 g, yield: 90%).

(5) Synthesis of Intermediate 31-5

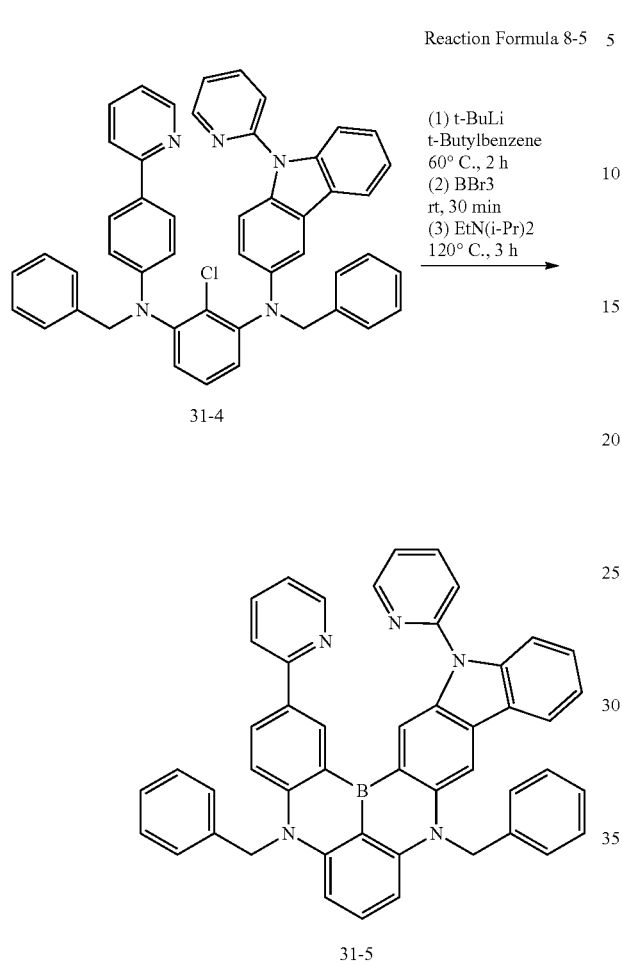

Intermediate 31-4 (7.13 g, 10 mmol) dissolved in t-butylbenzne (100 mL) was added into a 250 mL round-bottom flask under nitrogen atmosphere and the temperature was adjusted to 60° C. 1.7 M t-BuLi (in pentane, 7 mL, 12 mmol) was added drop wise to the flask and the solution was stirred for 2 hours. After the temperature was cooled down to a room temperature, BBr$_3$ (3.00 g, 12 mmol) was slowly added drop wise to the flask and the solution was stirred at a room temperature for 30 minutes. EtN(i-Pr)$_2$ (2.58 g, 20 mmol) was added drop wise to the flask and the solution was stirred at 120° C. for 3 hours. After the reaction was complete, the solution was cooled down to a room temperature, and the organic layer was extracted with chloroform and was washed with water. The moisture was removed with anhydrous MgSO$_4$, the organic layer was concentrated under reduced pressure and purified with a column chromatography using MC/hexane (1:3) as an eluent to give an intermediate 31-5 (6.69 g, yield: 33%).

(6) Synthesis of Intermediate 31-6

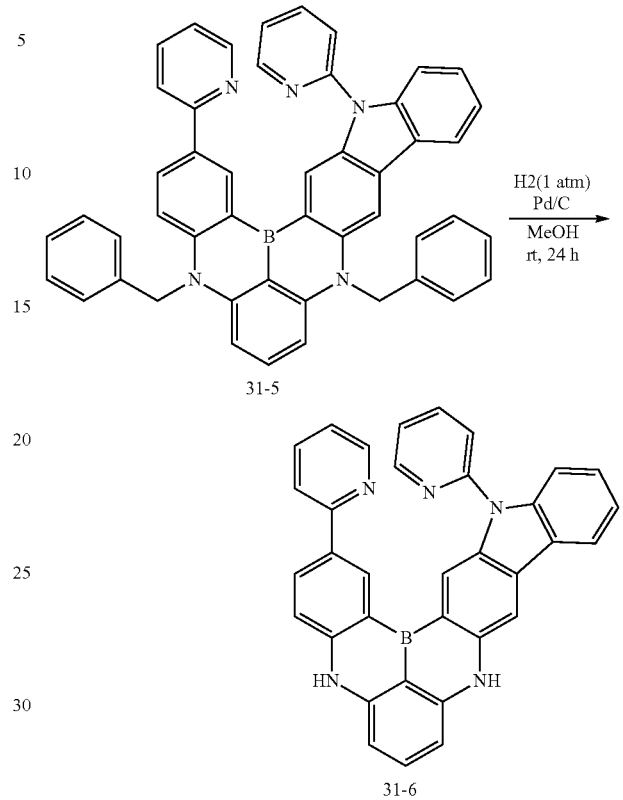

Intermediate 31-5 (6.92 g, 10 mmol) and palladium on activated charcoal (1 g, 10% Pd/C) dissolved in methanol (100 mL) was added into a 250 mL round-bottom flask under hydrogen atmosphere, and then the solution was stirred for 24 hours. After the reaction was complete, the solution was cooled down to a room temperature, and the organic layer was extracted with chloroform and was washed with water. The moisture was removed with anhydrous MgSO$_4$, the organic layer was concentrated under reduced pressure and purified with a column chromatography using MC/hexane (1:3) as an eluent to give an intermediate 31-6 (3.94 g, yield: 77%).

(7) Synthesis of Intermediate 31-7

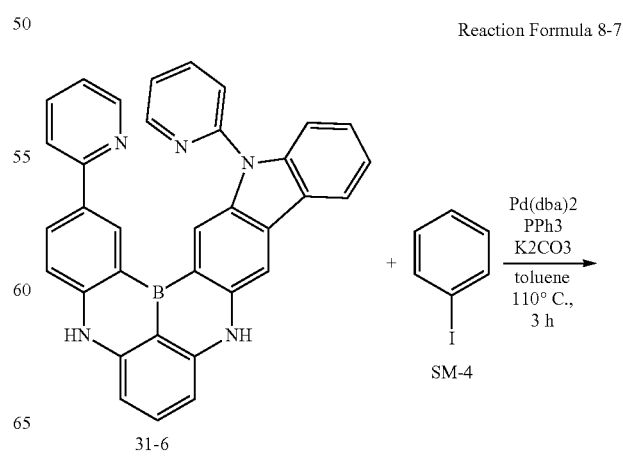

-continued

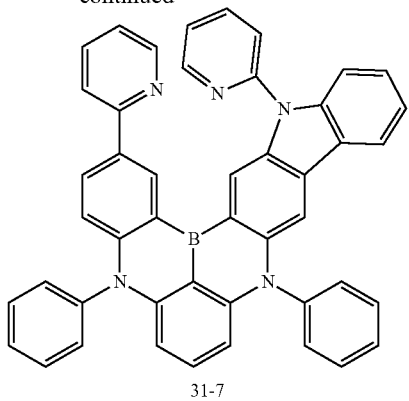

31-7

Intermediate 31-6 (10.2 g, 20 mmol), SM-4 (8.16 g, 40 mmol), Pd(dba)₂ (1.15 g, 2.0 mmol), PPh₃ (0.52 g, 2.0 mmol) and K₂CO₃ (0.31 g, 80 mmol) dissolved in toluene (200 mL) was added into a 500 mL round-bottom flask under nitrogen atmosphere, and then the solution was heated at 110° C. for 3 hours with stirring. After the reaction was complete, the solution was cooled down to a room temperature, and the organic layer was extracted with chloroform and was washed with water. The moisture was removed with anhydrous MgSO₄, the organic layer was concentrated under reduced pressure and purified with a column chromatography using MC/hexane (1:3) as an eluent to give an intermediate 31-7 (12.2 g, yield: 92%).

(8) Synthesis of Compound 31

Reaction Formula 8-8

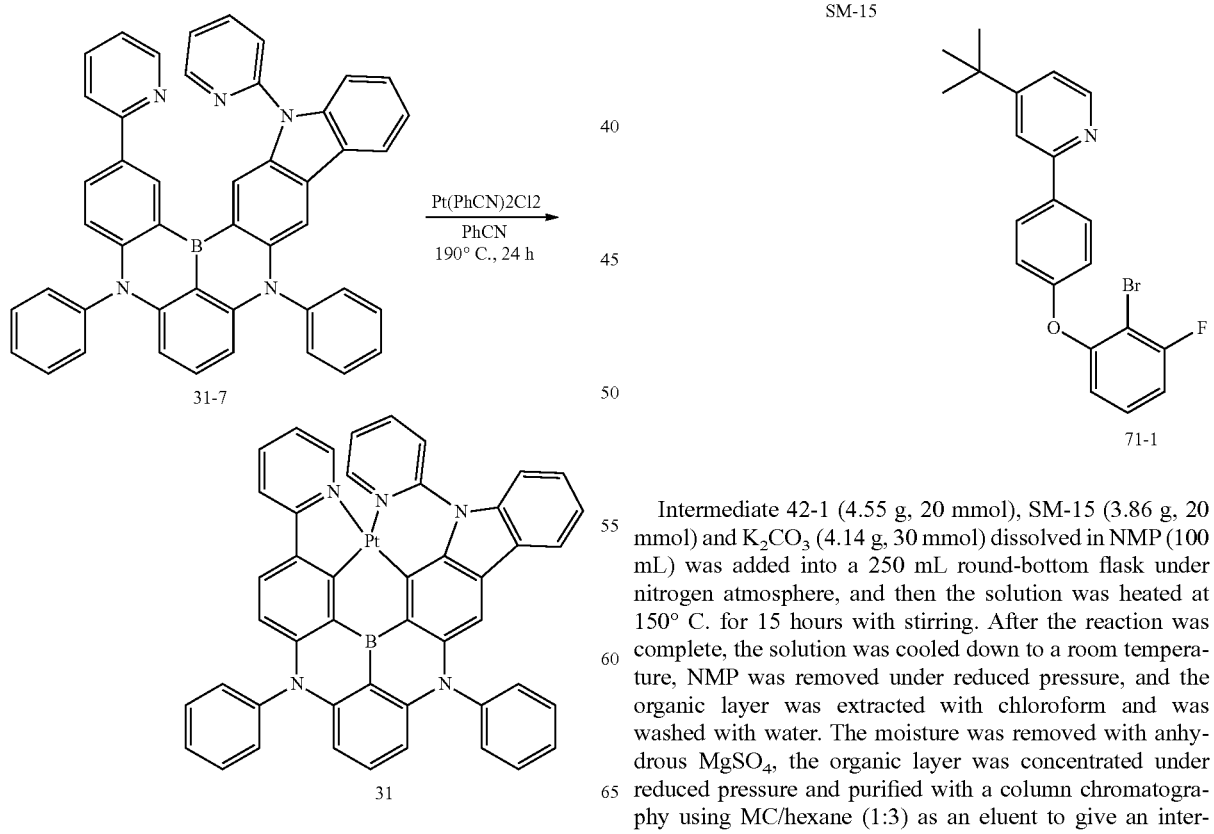

Intermediate 31-7 (6.64 g, 10 mmol) and Pt(PhCN)₂Cl₂ (4.72 g, 10 mmol) dissolved in PhCN (100 mL) was added into a 250 round-bottom flask under nitrogen atmosphere, and then the solution was stirred at 190° C. for 24 hours. After the reaction was complete, the solution was cooled down to a room temperature, and the organic layer was extracted chloroform and was washed with water. The moisture was removed with anhydrous MgSO₄, the organic layer was concentrated under reduced pressure and purified with a column chromatograph using MC/hexane (5:1) as an eluent to give Compound 31 (2.31 g, yield: 27%).

Synthesis Example 9

Synthesis of Compound 71

(1) Synthesis of Intermediate 71-1

Reaction Formula 9-1

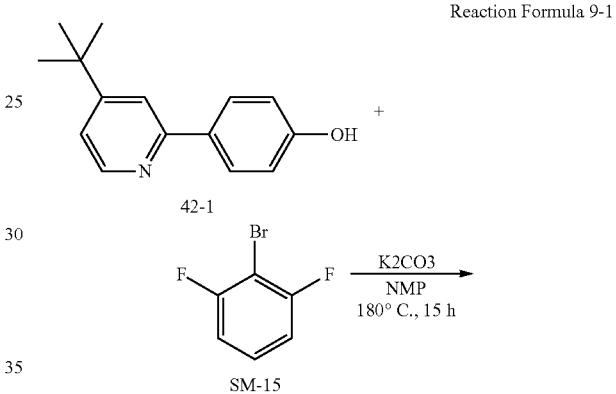

Intermediate 42-1 (4.55 g, 20 mmol), SM-15 (3.86 g, 20 mmol) and K₂CO₃ (4.14 g, 30 mmol) dissolved in NMP (100 mL) was added into a 250 mL round-bottom flask under nitrogen atmosphere, and then the solution was heated at 150° C. for 15 hours with stirring. After the reaction was complete, the solution was cooled down to a room temperature, NMP was removed under reduced pressure, and the organic layer was extracted with chloroform and was washed with water. The moisture was removed with anhydrous MgSO₄, the organic layer was concentrated under reduced pressure and purified with a column chromatography using MC/hexane (1:3) as an eluent to give an intermediate 71-1 (6.40 g, yield: 80%).

(2) Synthesis of Intermediate 71-2

(3) Synthesis of Intermediate 71-3

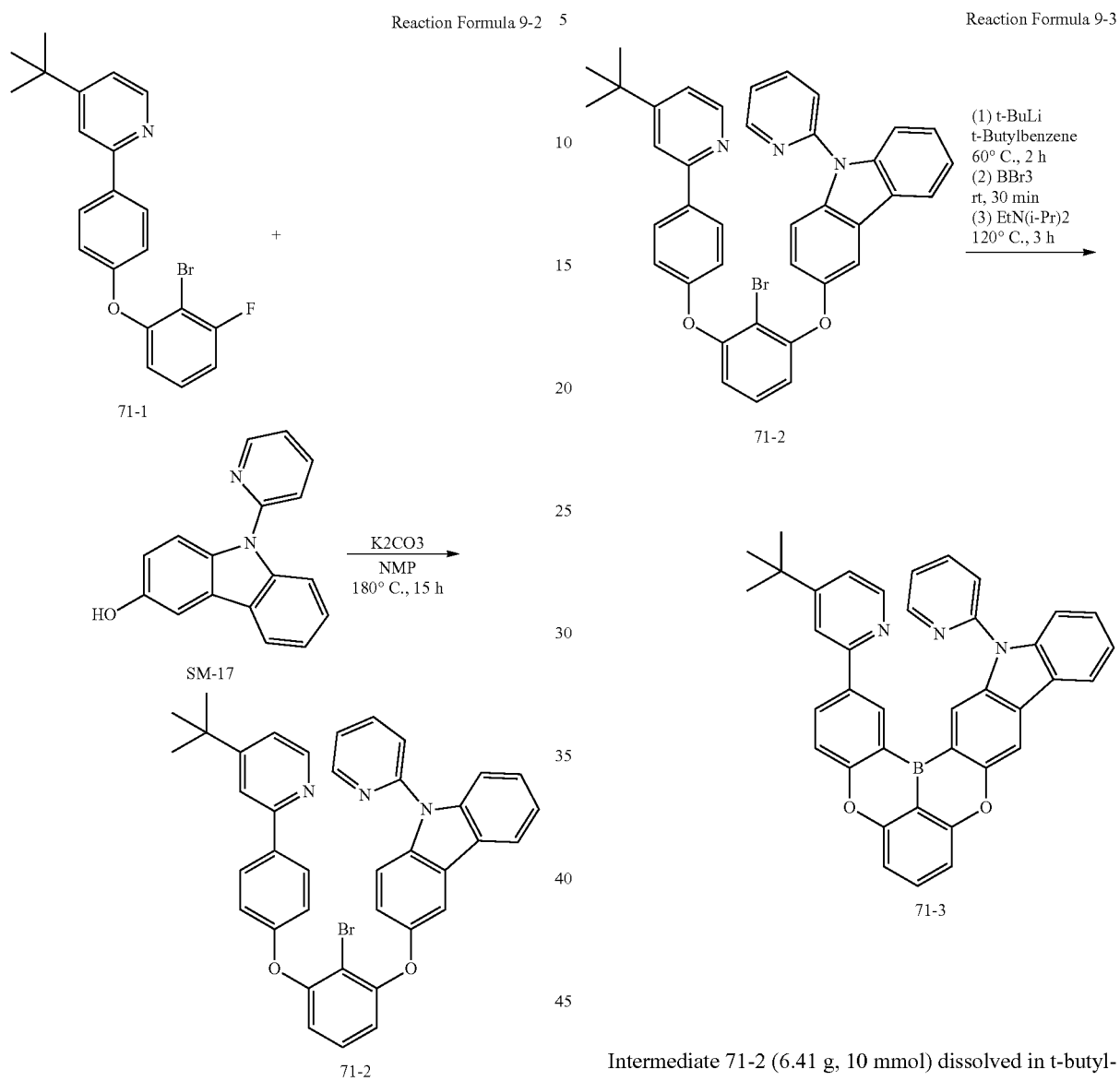

Intermediate 71-1 (4.55 g, 20 mmol), SM-17 (3.86 g, 20 mmol) and K₂CO₃ (4.14 g, 30 mmol) dissolved in NMP (100 mL) was added into a 250 mL round-bottom flask under nitrogen atmosphere, and then the solution was heated at 180° C. for 15 hours with stirring. After the reaction was complete, the solution was cooled down to a room temperature, NMP was removed under reduced pressure, and the organic layer was extracted with chloroform and was washed with water. The moisture was removed with anhydrous MgSO₄, the organic layer was concentrated under reduced pressure and purified with a column chromatography using MC/hexane (1:3) as an eluent to give an intermediate 71-2 (6.40 g, yield: 80%).

Intermediate 71-2 (6.41 g, 10 mmol) dissolved in t-butylbenzne (100 mL) was added into a 250 mL round-bottom flask under nitrogen atmosphere and the temperature was adjusted to 60° C. 1.7 M t-BuLi (in pentane, 7 mL, 12 mmol) was added drop wise to the flask and the solution was stirred for 2 hours. After the temperature was cooled down to a room temperature, BBr₃ (3.00 g, 12 mmol) was slowly added drop wise to the flask and the solution was stirred at a room temperature for 30 minutes. EtN(i-Pr)₂ (2.58 g, 20 mmol) was added drop wise to the flask and the solution was stirred at 120° C. for 3 hours. After the reaction was complete, the solution was cooled down to a room temperature, and the organic layer was extracted with chloroform and was washed with water. The moisture was removed with anhydrous MgSO₄, the organic layer was concentrated under reduced pressure and purified with a column chromatography using MC/hexane (1:3) as an eluent to give an intermediate 71-3 (1.88 g, yield: 33%).

(4) Synthesis of Compound 71

Reaction Formula 9-4

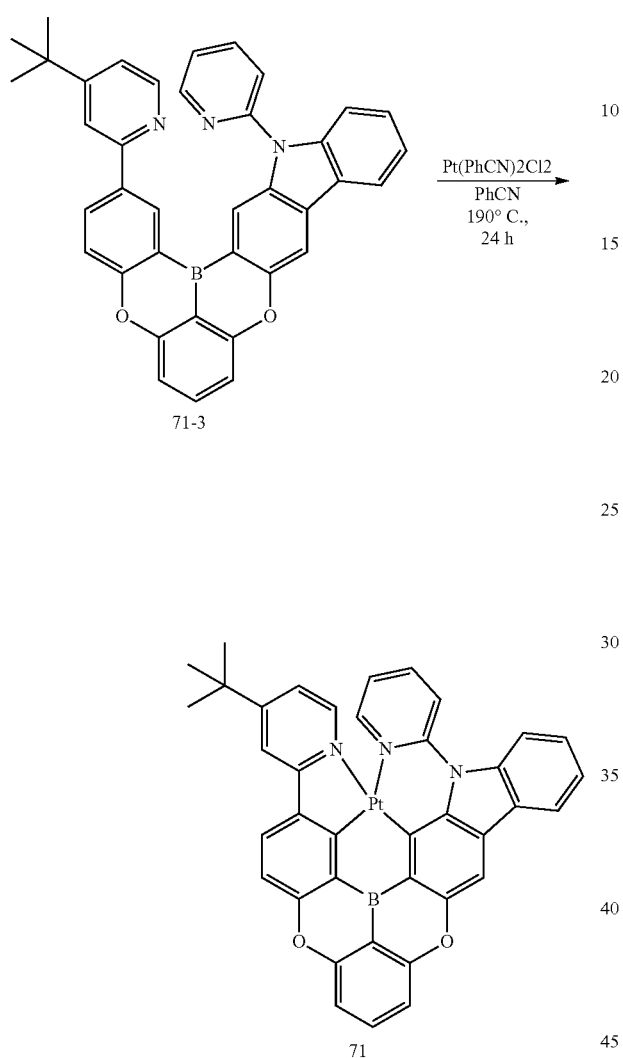

Synthesis Example 10

Synthesis of Compound 96

(1) Synthesis of Intermediate 96-1

Reaction Formula 10-1

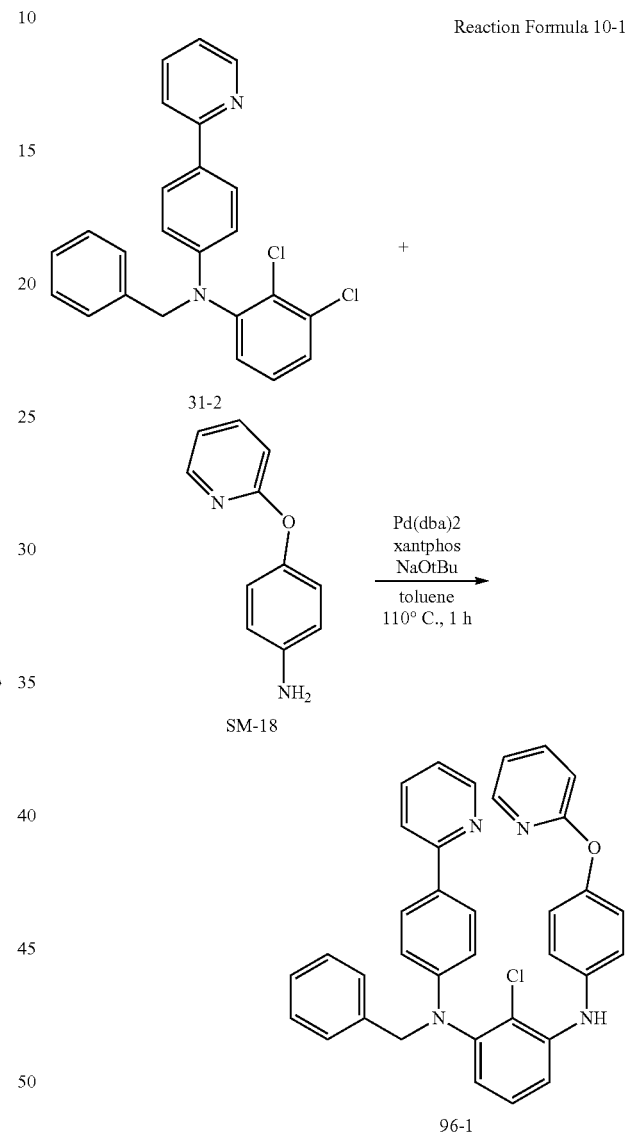

Intermediate 71-3 (5.70 g, 10 mmol) and Pt(PhCN)$_2$Cl$_2$ (4.72 g, 10 mmol) dissolved in PhCN (100 mL) was added into a 250 round-bottom flask under nitrogen atmosphere, and then the solution was stirred at 190° C. for 24 hours. After the reaction was complete, the solution was cooled down to a room temperature, and the organic layer was extracted chloroform and was washed with water. The moisture was removed with anhydrous MgSO$_4$, the organic layer was concentrated under reduced pressure and purified with a column chromatograph using MC/hexane (5:1) as an eluent to give Compound 71 (2.82 g, yield: 37%).

Intermediate 31-2 (8.11 g, 20 mmol), SM-18 (3.72 g, 20 mmol), Pd(dba)$_2$ (1.15 g, 2.0 mmol), xantphos (1.16 g, 2.0 mmol) and NaOtBu (0.31 g, 80 mmol) dissolved in toluene (200 mL) was added into a 500 mL round-bottom flask, and then the solution was heated at 110° C. for 1 hour with stirring. After the reaction was complete, the solution was cooled down to a room temperature, and the organic layer was extracted with chloroform and was washed with water. The moisture was removed with anhydrous MgSO$_4$, the organic layer was concentrated under reduced pressure and purified with a column chromatography using MC/hexane (1:3) as an eluent to give an intermediate 96-1 (8.99 g, yield: 81%).

(2) Synthesis of Intermediate 96-2

Reaction Formula 10-2

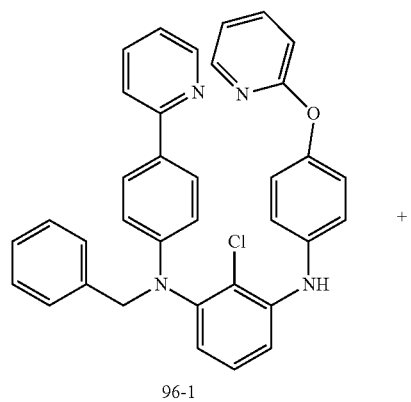

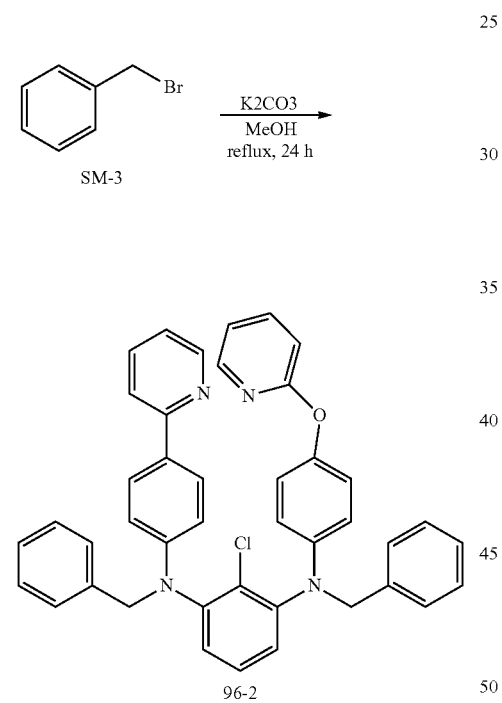

Intermediate 96-1 (11.1 g, 20 mmol), SM-3 (3.42 g, 20 mmol) and K$_2$CO$_3$ (4.14 g, 30 mmol) dissolved in methanol (200 mL) was added into a 500 mL round-bottom flask under nitrogen atmosphere, and the solution was refluxed for 24 hours with stirring. After the reaction was complete, the solution was cooled down to a room temperature, and the organic layer was extracted with chloroform and was washed with water. The moisture was removed with anhydrous MgSO$_4$, the organic layer was concentrated under reduced pressure, and purified with a column chromatography using MC/hexane (1:3) as an eluent to give an intermediate 96-2 (11.6 g, yield: 88%).

(3) Synthesis of Intermediate 96-3

Reaction Formula 10-3

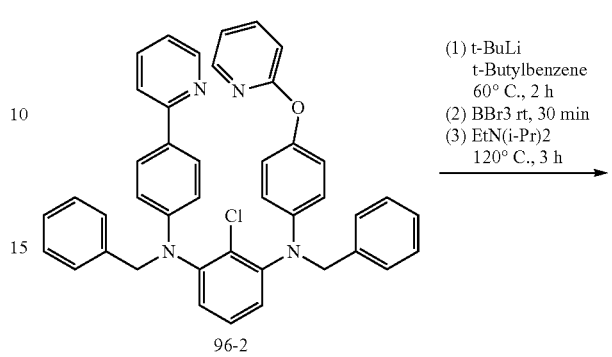

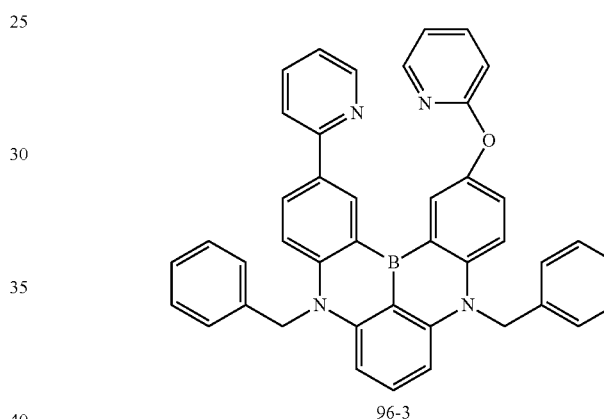

Intermediate 96-2 (2.45 g, 10 mmol) dissolved in t-butylbenzne (100 mL) was added into a 250 mL round-bottom flask under nitrogen atmosphere and the temperature was adjusted to 60° C. 1.7 M t-BuLi (in pentane, 7 mL, 12 mmol) was added drop wise to the flask and the solution was stirred for 2 hours. After the temperature was cooled down to a room temperature, BBr$_3$ (3.00 g, 12 mmol) was slowly added drop wise to the flask and the solution was stirred at a room temperature for 30 minutes. EtN(i-Pr)$_2$ (2.58 g, 20 mmol) was added drop wise to the flask and the solution was stirred at 120° C. for 3 hours. After the reaction was complete, the solution was cooled down to a room temperature, and the organic layer was extracted with chloroform and was washed with water. The moisture was removed with anhydrous MgSO$_4$, the organic layer was concentrated under reduced pressure and purified with a column chromatography using MC/hexane (1:3) as an eluent to give an intermediate 96-3 (1.86 g, yield: 30%).

(4) Synthesis of Intermediate 96-4

Reaction Formula 10-4

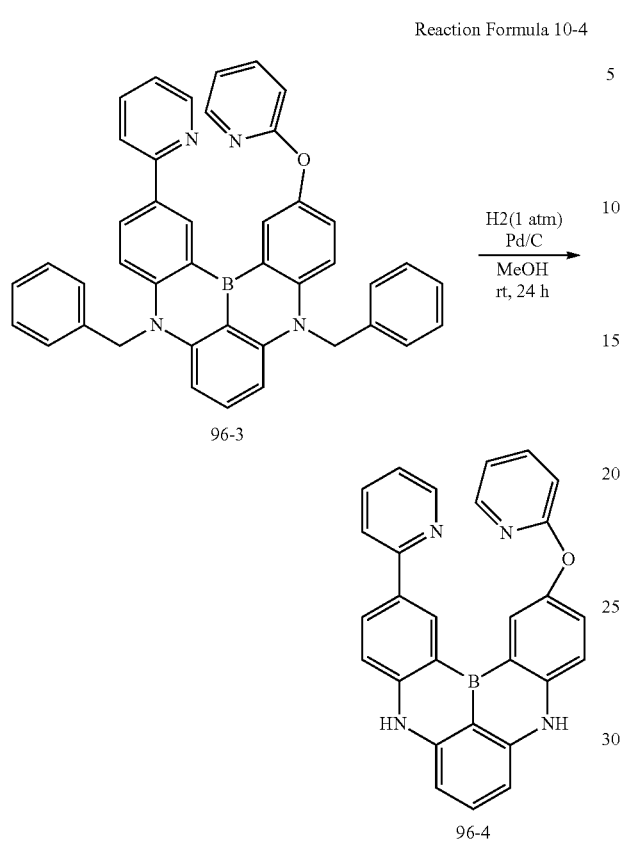

Intermediate 96-3 (6.19 g, 10 mmol) and palladium on activated charcoal (1 g, 10% Pd/C) dissolved in methanol (100 mL) was added into a 250 mL round-bottom flask under hydrogen atmosphere, and then the solution was stirred for 24 hours. After the reaction was complete, the solution was cooled down to a room temperature, and the organic layer was extracted with chloroform and was washed with water. The moisture was removed with anhydrous MgSO$_4$, the organic layer was concentrated under reduced pressure and purified with a column chromatography using MC/hexane (1:3) as an eluent to give an intermediate 96-4 (3.51 g, yield: 80%).

(5) Synthesis of Intermediate 96-5

Reaction Formula 10-5

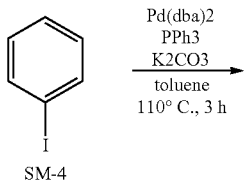

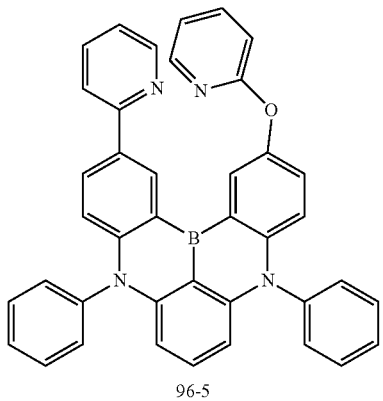

Intermediate 96-4 (8.77 g, 20 mmol), SM-4 (8.16 g, 40 mmol), Pd(dba)$_2$ (1.15 g, 2.0 mmol), PPh$_3$ (0.52 g, 2.0 mmol) and K$_2$CO$_3$ (0.31 g, 80 mmol) dissolved in toluene (200 mL) was added into a 500 mL round-bottom flask under nitrogen atmosphere, and then the solution was heated at 110° C. for 3 hours with stirring. After the reaction was complete, the solution was cooled down to a room temperature, and the organic layer was extracted with chloroform and was washed with water. The moisture was removed with anhydrous MgSO$_4$, the organic layer was concentrated under reduced pressure and purified with a column chromatography using MC/hexane (1:3) as an eluent to give an intermediate 96-5 (12.2 g, yield: 95%).

(6) Synthesis of Compound 96

Reaction Formula 10-6

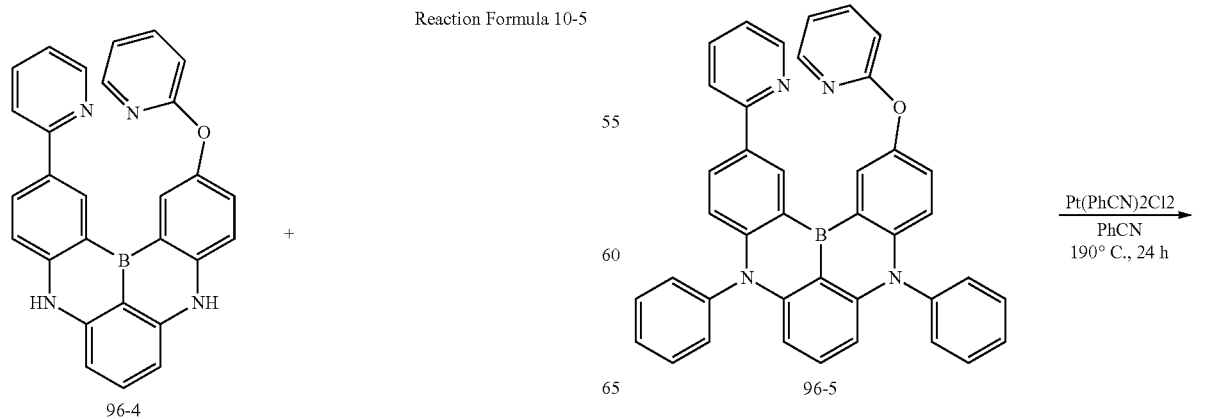

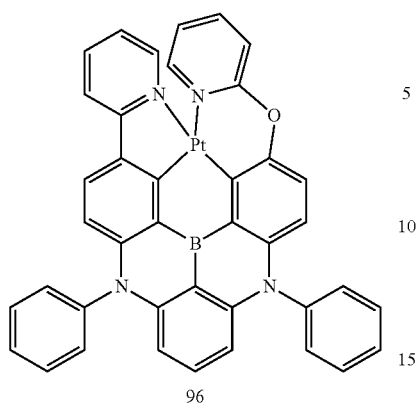

96

Intermediate 96-5 (5.91 g, 10 mmol) and Pt(PhCN)$_2$Cl$_2$ (4.72 g, 10 mmol) dissolved in PhCN (100 mL) was added into a 250 round-bottom flask under nitrogen atmosphere, and then the solution was stirred at 190° C. for 24 hours. After the reaction was complete, the solution was cooled down to a room temperature, and the organic layer was extracted chloroform and was washed with water. The moisture was removed with anhydrous MgSO$_4$, the organic layer was concentrated under reduced pressure and purified with a column chromatograph using MC/hexane (5:1) as an eluent to give Compound 96 (2.35 g, yield: 30%).

Synthesis Example 11

Synthesis of Compound 82

(1) Synthesis of Intermediate 82-1

Reaction Formula 11-1

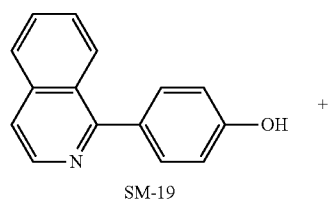

SM-19

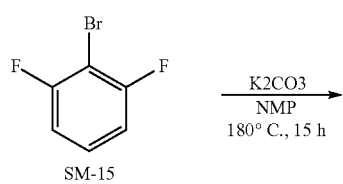

SM-15

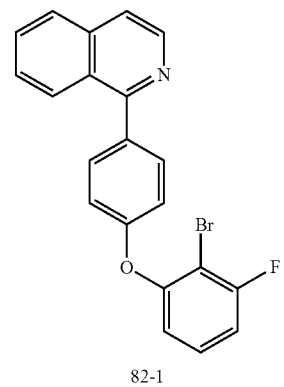

82-1

SM-19 (4.43 g, 20 mmol), SM-15 (3.86 g, 20 mmol) and K$_2$CO$_3$ (4.14 g, 30 mmol) dissolved in NMP (100 mL) was added into a 250 mL round-bottom flask under nitrogen atmosphere, and then the solution was heated at 180° C. for 15 hours with stirring. After the reaction was complete, the solution was cooled down to a room temperature, NMP was removed under reduced pressure, and the organic layer was extracted with chloroform and was washed with water. The moisture was removed with anhydrous MgSO$_4$, the organic layer was concentrated under reduced pressure and purified with a column chromatography using MC/hexane (1:3) as an eluent to give an intermediate 82-1 (6.46 g, yield: 82%).

(2) Synthesis of Intermediate 82-2

Reaction Formula 11-2

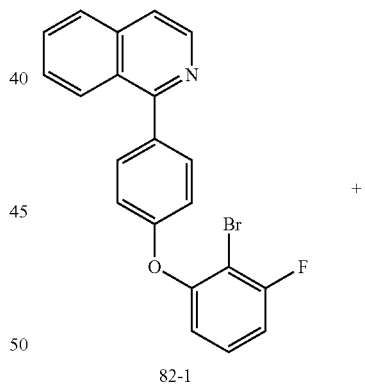

82-1

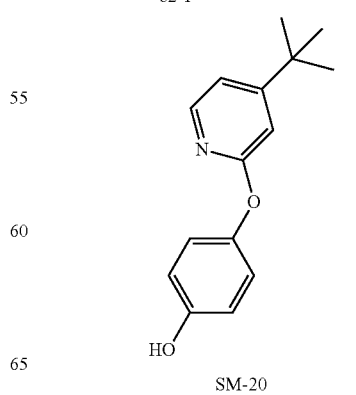

SM-20

K2CO3 / NMP
180° C., 15 h

111

-continued

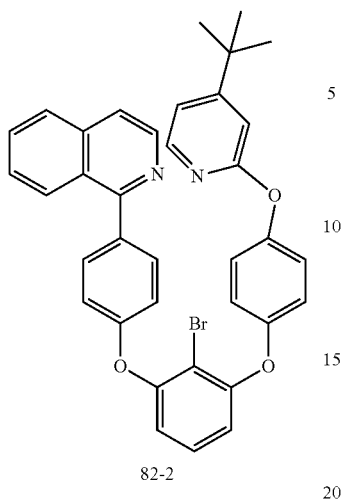

82-2

Intermediate 82-1 (7.88 g, 20 mmol), SM-20 (4.87 g, 20 mmol) and $K_2CO_3$ (4.14 g, 30 mmol) dissolved in NMP (100 mL) was added into a 250 mL round-bottom flask under nitrogen atmosphere, and then the solution was heated at 180° C. for 15 hours with stirring. After the reaction was complete, the solution was cooled down to a room temperature, NMP was removed under reduced pressure, and the organic layer was extracted with chloroform and was washed with water. The moisture was removed with anhydrous $MgSO_4$, the organic layer was concentrated under reduced pressure and purified with a column chromatography using MC/hexane (1:3) as an eluent to give an intermediate 82-2 (9.51 g, yield: 77%).

(3) Synthesis of Intermediate 82-3

112

-continued

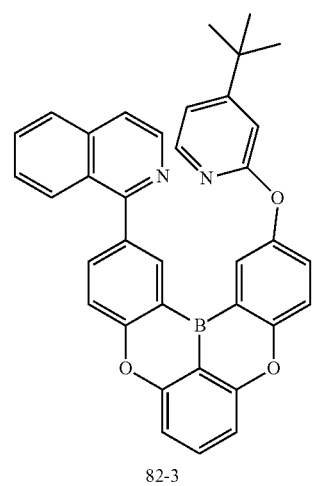

82-3

Intermediate 82-2 (6.18 g, 10 mmol) dissolved in t-butylbenzne (100 mL) was added into a 250 mL round-bottom flask under nitrogen atmosphere and the temperature was adjusted to 60° C. 1.7 M t-BuLi (in pentane, 7 mL, 12 mmol) was added drop wise to the flask and the solution was stirred for 2 hours. After the temperature was cooled down to a room temperature, $BBr_3$ (3.00 g, 12 mmol) was slowly added drop wise to the flask and the solution was stirred at a room temperature for 30 minutes. $EtN(i-Pr)_2$ (2.58 g, 20 mmol) was added drop wise to the flask and the solution was stirred at 120° C. for 3 hours. After the reaction was complete, the solution was cooled down to a room temperature, and the organic layer was extracted with chloroform and was washed with water. The moisture was removed with anhydrous $MgSO_4$, the organic layer was concentrated under reduced pressure and purified with a column chromatography using MC/hexane (1:3) as an eluent to give an intermediate 82-3 (1.64 g, yield: 30%).

(4) Synthesis of Compound 82

Reaction Formula 11-3

Reaction Formula 11-4

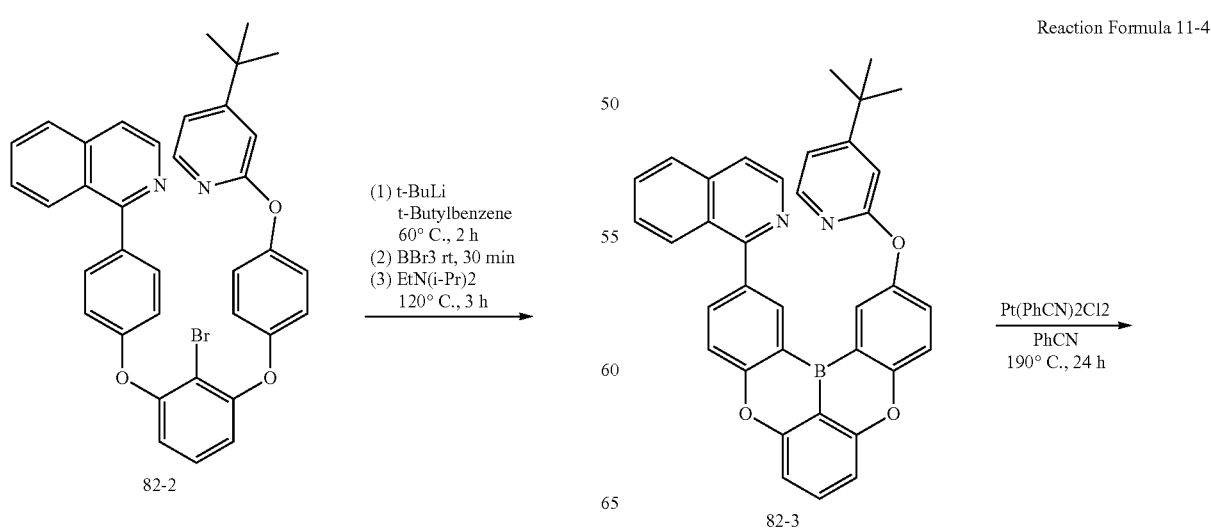

113
-continued

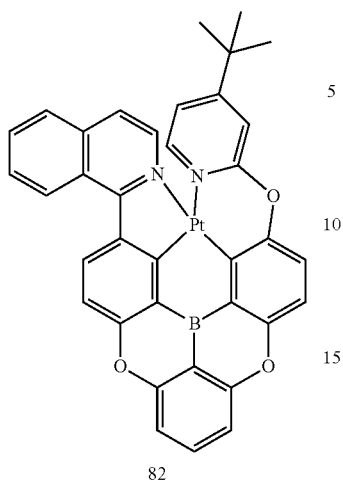

82

Intermediate 82-3 (5.46 g, 10 mmol) and Pt(PhCN)₂Cl₂ (4.72 g, 10 mmol) dissolved in PhCN (100 mL) was added into a 250 round-bottom flask under nitrogen atmosphere, and then the solution was stirred at 190° C. for 24 hours. After the reaction was complete, the solution was cooled down to a room temperature, and the organic layer was extracted chloroform and was washed with water. The moisture was removed with anhydrous MgSO₄, the organic layer was concentrated under reduced pressure and purified with a column chromatograph using MC/hexane (5:1) as an eluent to give Compound 82 (2.96 g, yield: 40%).

Synthesis Example 12

Synthesis of Compound 52

(1) Synthesis of Intermediate 52-1

Reaction Formula 12-1

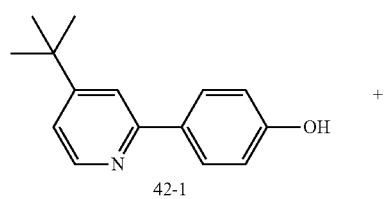

42-1

+

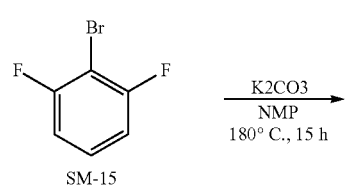

SM-15

$\xrightarrow{\text{K2CO3}}_{\substack{\text{NMP}\\180°\text{ C., 15 h}}}$

114
-continued

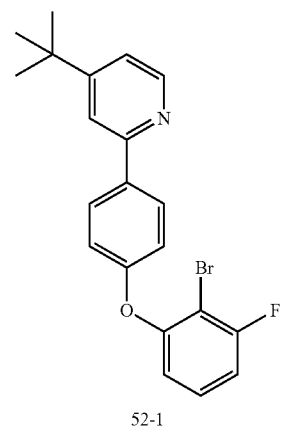

52-1

Intermediate 42-1 (4.55 g, 20 mmol), SM-15 (3.86 g, 20 mmol) and K₂CO₃ (4.14 g, 30 mmol) dissolved in NMP (100 mL) was added into a 250 mL round-bottom flask under nitrogen atmosphere, and then the solution was heated at 180° C. for 15 hours with stirring. After the reaction was complete, the solution was cooled down to a room temperature, NMP was removed under reduced pressure, and the organic layer was extracted with chloroform and was washed with water. The moisture was removed with anhydrous MgSO₄, the organic layer was concentrated under reduced pressure and purified with a column chromatography using MC/hexane (1:3) as an eluent to give an intermediate 52-1 (6.40 g, yield: 80%).

(2) Synthesis of Intermediate 52-2

Reaction Formula 12-2

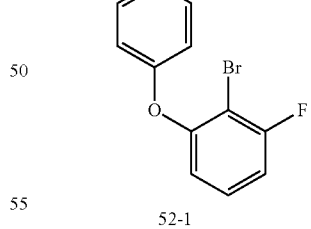

52-1

+

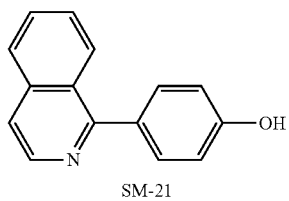

SM-21

$\xrightarrow{\text{K2CO3}}_{\substack{\text{NMP}\\180°\text{ C., 15 h}}}$

-continued

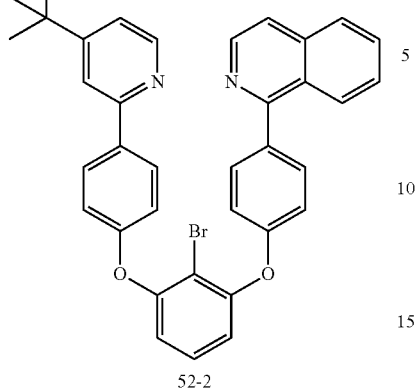

52-2

-continued

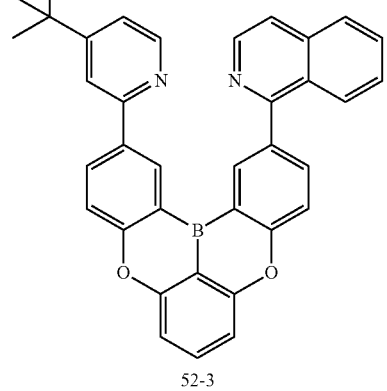

52-3

Intermediate 52-1 (8.00 g, 20 mmol), SM-21 (4.43 g, 20 mmol) and K$_2$CO$_3$ (4.14 g, 30 mmol) dissolved in NMP (100 mL) was added into a 250 mL round-bottom flask under nitrogen atmosphere, and then the solution was heated at 180° C. for 15 hours with stirring. After the reaction was complete, the solution was cooled down to a room temperature, NMP was removed under reduced pressure, and the organic layer was extracted with chloroform and was washed with water. The moisture was removed with anhydrous MgSO$_4$, the organic layer was concentrated under reduced pressure and purified with a column chromatography using MC/hexane (1:3) as an eluent to give an intermediate 52-2 (10.2 g, yield: 85%).

(3) Synthesis of Intermediate 52-3

Intermediate 52-2 (6.02 g, 10 mmol) dissolved in t-butylbenzne (100 mL) was added into a 250 mL round-bottom flask under nitrogen atmosphere and the temperature was adjusted to 60° C. 1.7 M t-BuLi (in pentane, 7 mL, 12 mmol) was added drop wise to the flask and the solution was stirred for 2 hours. After the temperature was cooled down to a room temperature, BBr$_3$ (3.00 g, 12 mmol) was slowly added drop wise to the flask and the solution was stirred at a room temperature for 30 minutes. EtN(i-Pr)$_2$ (2.58 g, 20 mmol) was added drop wise to the flask and the solution was stirred at 120° C. for 3 hours. After the reaction was complete, the solution was cooled down to a room temperature, and the organic layer was extracted with chloroform and was washed with water. The moisture was removed with anhydrous MgSO$_4$, the organic layer was concentrated under reduced pressure and purified with a column chromatography using MC/hexane (1:3) as an eluent to give an intermediate 52-3 (1.75 g, yield: 33%).

(4) Synthesis of Compound 52

Reaction Formula 12-3

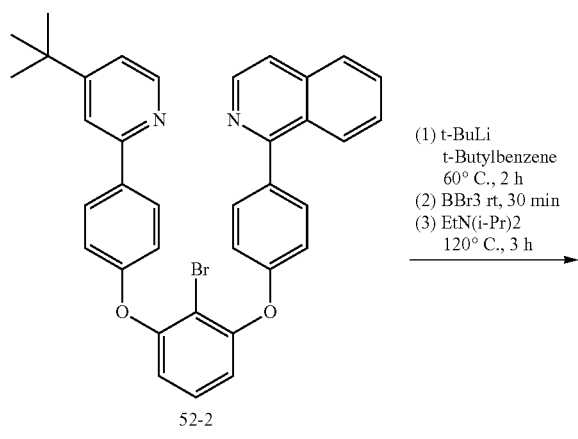

(1) t-BuLi
t-Butylbenzene
60° C., 2 h
(2) BBr3 rt, 30 min
(3) EtN(i-Pr)2
120° C., 3 h Reaction Formula 12-4

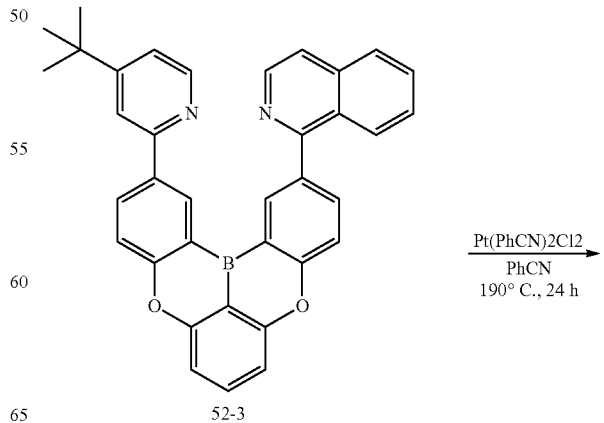

Pt(PhCN)2Cl2
PhCN
190° C., 24 h

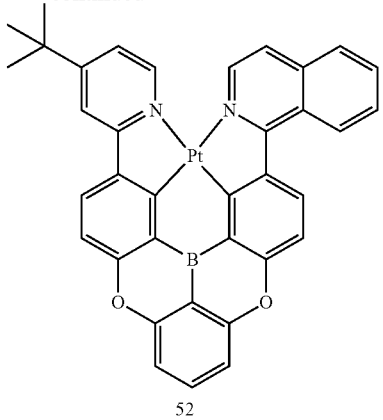

52

Intermediate 52-3 (5.30 g, 10 mmol) and Pt(PhCN)$_2$Cl$_2$ (4.72 g, 10 mmol) dissolved in PhCN (100 mL) was added into a 250 round-bottom flask under nitrogen atmosphere, and then the solution was stirred at 190° C. for 24 hours. After the reaction was complete, the solution was cooled down to a room temperature, and the organic layer was extracted chloroform and was washed with water. The moisture was removed with anhydrous MgSO$_4$, the organic layer was concentrated under reduced pressure and purified with a column chromatograph using MC/hexane (5:1) as an eluent to give Compound 52 (2.39 g, yield: 33%).

Example 1 (EX.1)

Fabrication of OLED

An OLED in which the Compound 1 is applied into an EML was fabricated. An ITO (including reflective layer; 40 mm×40 mm×100 nm) attached glass substrate was washed with isopropyl alcohol, acetone and methanol and dried in a oven at 100° C. The substrate was treated with O$_2$ plasma at a vacuum state, and then was transferred to a vacuum deposition chamber in order to deposit other layers on the substrate. An organic layer was deposited by evaporation by a heated boat under 5×10$^{-7}$ torr with a deposition rate 1 Å in the following order:

A HIL (HI-1 below (NPNPB); 60 nm); a HTL (NPB, 80 nm); an EML (mCBP (host): Compound 1 (dopant)=95:5 by weight; 30 nm); an ETL-EIL (ET-1 below (ZADN): Liq=1:1 be weight; 30 nm); and a cathode (Al; 100 nm).

And then, cappling layer (CPL) was deposited over the cathode and the device was encapsulated by glass. After deposition of emissive layer and the cathode, the OLED was transferred from the deposition chamber to a dry box for film formation, followed by encapsulation using UV-curable epoxy resin and moisture getter.

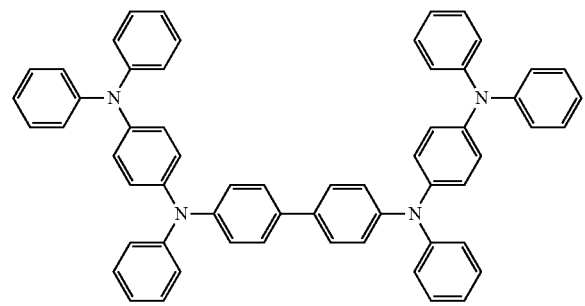

HI-1

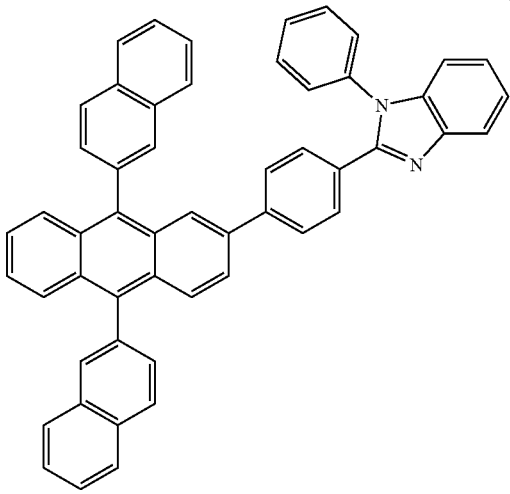

ET-1

Examples 2-11 (EX. 2-11)

Fabrication of OLED

An OLED was fabricated using the same materials as Example 1, except that Compound 3 (Ex. 2), Compound 8 (Ex. 3), Compound 13 (Ex. 4), Compound 16 (Ex. 5), Compound 17 (Ex. 6), Compound 25 (Ex. 7), Compound 26 (Ex. 8), Compound 41 (Ex. 9), Compound 42 (Ex. 10) or Compound 52 (Ex. 11) was applied into the EML as the dopant in the EML instead of the Compound 1.

Comparative Examples 1-4 (REF. 1-4)

Fabrication of OLED

An OLED was fabricated using the same materials as Example 1, except that Ref. Compound 1(Ref. 1), the Ref. Compound 2 (Ref. 2), the Ref. Compound 3 (Ref. 3) or the Ref. Compound 4 (Ref. 4) as indicated below was applied into the EML as the dopant in the EML instead of the Compound 1.

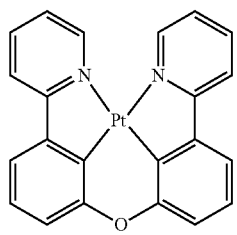

Ref. 1

-continued

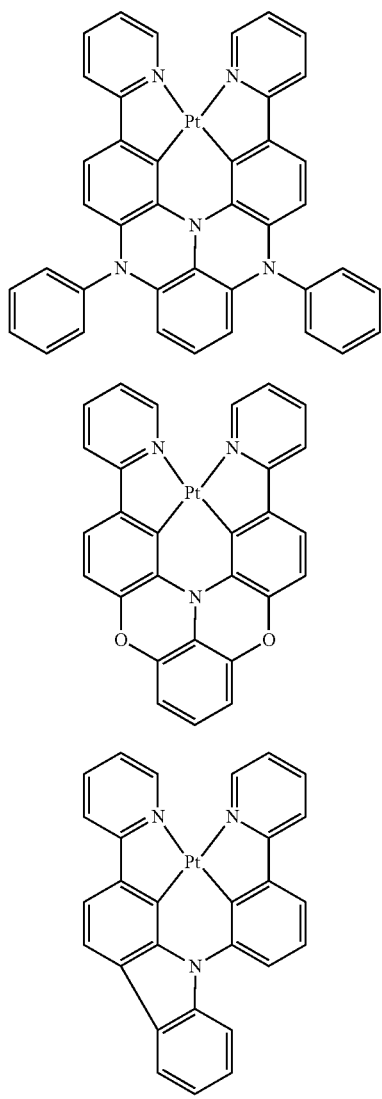

Ref. 2

Ref. 3

Ref. 4

Experimental Example 1

Measurement of Luminous Properties of OLED

Each of the OLED fabricated by Ex. 1-11 and Ref. 1-4 was connected to an external power source and then luminous properties for all the diodes were evaluated using a constant current source (KEITHLEY) and a photometer PR650 at room temperature. In particular, driving voltage (V), maximum External Quantum Efficiency ($EQE_{max}$, %), EQE (%) and time period (LT95, %) at which the luminance was reduced to 95% at a 10 mA/cm² current density were measured. The results thereof are shown in the following Table 1.

TABLE 1

| Luminous Properties of OLED | | | | | |
|---|---|---|---|---|---|
| Sample | Dopant | V | $EQE_{max}$ (%)* | EQE (%)* | LT95 (%)* |
| Ref. 1 | Ref. 1 | 4.25 | 100 | 100 | 100 |
| Ref. 2 | Ref. 2 | 4.42 | 108 | 106 | 106 |
| Ref. 3 | Ref. 3 | 4.38 | 102 | 101 | 102 |
| Ref. 4 | Ref. 4 | 4.42 | 105 | 103 | 107 |
| Ex. 1 | 1 | 4.22 | 129 | 123 | 133 |
| Ex. 2 | 3 | 4.22 | 122 | 120 | 121 |
| Ex. 3 | 8 | 4.26 | 132 | 125 | 122 |
| Ex. 4 | 13 | 4.21 | 119 | 116 | 138 |
| Ex. 5 | 16 | 4.26 | 135 | 133 | 125 |
| Ex. 6 | 17 | 4.30 | 113 | 110 | 133 |
| Ex. 7 | 25 | 4.24 | 123 | 112 | 140 |
| Ex. 8 | 26 | 4.22 | 125 | 116 | 151 |
| Ex. 9 | 41 | 4.29 | 138 | 142 | 108 |
| Ex. 10 | 42 | 4.26 | 139 | 141 | 123 |
| Ex. 11 | 52 | 4.29 | 133 | 140 | 122 |

*Relative value

Examples 12-17 (EX. 12-17)

Fabrication of OLED

An OLED was fabricated using the same materials as Example 1, except that Compound 82 (Ex. 12), Compound 87 (Ex. 13), Compound 92 (Ex. 14), Compound 86 (Ex. 15), Compound 99 (Ex. 16) or Compound 103 (Ex. 17) was applied into the EML as the dopant in the EML instead of the Compound 1.

Comparative Examples 5 (REF. 5)

Fabrication of OLED

An OLED was fabricated using the same materials as Example 1, except that Ref. Compound 5 (Ref 5) as indicated below was applied into the EML as the dopant in the EML instead of the Compound 1.

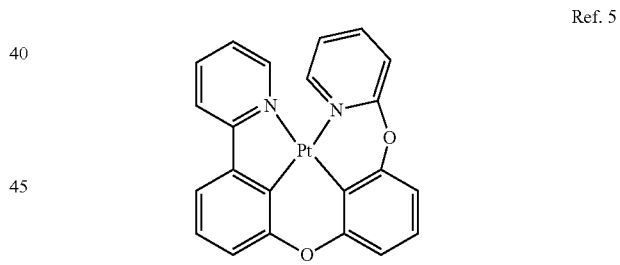

Ref. 5

Experimental Example 2

Measurement of Luminous Properties of OLED

The luminous properties for each of the OLEDs fabricated by Ex. 12-17 and Ref 5 was measured using the same process as the Experimental Example 1. The measurement results are shown in the following Table 2.

TABLE 2

| Luminous Properties of OLED | | | | | |
|---|---|---|---|---|---|
| Sample | Dopant | V | $EQE_{max}$ (%)* | EQE (%)* | LT95 (%)* |
| Ref. 5 | Ref. 5 | 4.22 | 100 | 100 | 100 |
| Ex. 12 | 82 | 4.23 | 135 | 129 | 119 |
| Ex. 13 | 87 | 4.19 | 131 | 127 | 121 |
| Ex. 14 | 92 | 4.22 | 138 | 133 | 125 |

TABLE 2-continued

Luminous Properties of OLED

| Sample | Dopant | V | EQE$_{max}$ (%)* | EQE (%)* | LT95 (%)* |
|---|---|---|---|---|---|
| Ex. 15 | | 96 | 4.26 | 129 | 124 | 118 |
| Ex. 16 | | 99 | 4.18 | 127 | 127 | 117 |
| Ex. 17 | | 103 | 4.18 | 126 | 126 | 109 |

*Relative value

Examples 18-21 (EX. 18-22)

Fabrication of OLED

An OLED was fabricated using the same materials as Example 1, except that Compound 31 (Ex. 18), Compound 33 (Ex. 19), Compound 38 (Ex. 20), Compound 71 (Ex. 21) or Compound 77 (Ex. 22) was applied into the EML as the dopant in the EML instead of the Compound 1.

Comparative Examples 6 (REF. 6)

Fabrication of OLED

An OLED was fabricated using the same materials as Example 1, except that Ref. Compound 6 (Ref 6) as indicated below was applied into the EML as the dopant in the EML instead of the Compound 1.

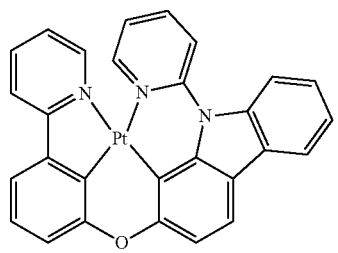

Ref. 6

Experimental Example 3

Measurement of Luminous Properties of OLED

The luminous properties for each of the OLEDs fabricated by Ex. 18-22 and Ref 6 was measured using the same process as the Experimental Example 1. The measurement results are shown in the following Table 3.

TABLE 3

Luminous Properties of OLED

| Sample | Dopant | V | EQE$_{max}$ (%)* | EQE (%)* | LT95 (%)* |
|---|---|---|---|---|---|
| Ref. 6 | Ref. 6 | 4.31 | 100 | 100 | 100 |
| Ex. 18 | 31 | 4.29 | 115 | 111 | 121 |
| Ex. 19 | 33 | 4.24 | 109 | 109 | 124 |
| Ex. 20 | 38 | 4.26 | 112 | 110 | 126 |
| Ex. 21 | 71 | 4.21 | 126 | 124 | 119 |
| Ex. 22 | 77 | 4.22 | 129 | 122 | 114 |

*Relative value

As indicated in Tables 1-3, compared to the OLEDs in Ref. 1-6, the OLEDs in Ex. 1-22 that each of which comprises the organic metal compound as the dopant in the EML enhanced their EQE$_{max}$, EQE and LT95 up to 39%, up to 40% and up to 51%, respectively. It was confirmed that it is possible to manufacture an OLED improving significantly its luminous efficiency and luminous lifetime by applying the organic metal compound into the EML.

It will be apparent to those skilled in the art that various modifications and variations can be made in the present disclosure without departing from the scope of the disclosure. Thus, it is intended that the present disclosure cover the modifications and variations of the present disclosure provided they come within the scope of the appended claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic metal compound having the following structure represented by Chemical Formula 7:

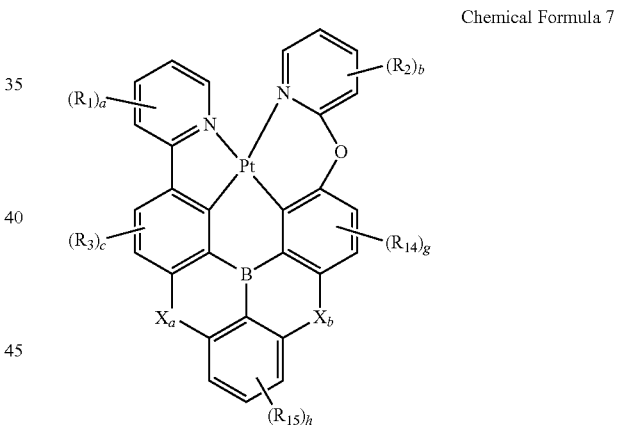

Chemical Formula 7 wherein:
each of $R_1$ to $R_3$ is independently selected from the group consisting of hydrogen, halogen, hydroxyl, cyano, nitro, amidino, hydrazine, hydrazone, $C_1$-$C_{20}$ alkyl, $C_2$-$C_{20}$ alkenyl, $C_2$-$C_{20}$ alkynyl, $C_1$-$C_{20}$ alkoxy, a $C_3$-$C_{30}$ alicyclic group, a $C_3$-$C_{20}$ hetero alicyclic group, a $C_6$-$C_{30}$ aromatic group and a $C_3$-$C_{30}$ hetero aromatic group, wherein each of the alicyclic group, the hetero alicyclic group, the aromatic group and the hetero aromatic group is independently unsubstituted or substituted;
each of a and b is independently an integer of 0 to 4;
c is an integer of 0 to 2;
$X_a$ is $NR_6$;
$X_b$ is $NR_{10}$;
$R_6$ is hydrogen, halogen, hydroxyl, cyano, nitro, amidino, hydrazine, hydrazone, $C_1$-$C_{20}$ alkyl, $C_2$-$C_{20}$ alkenyl, $C_2$-$C_{20}$ alkynyl, $C_1$-$C_{20}$ alkoxy, a $C_3$-$C_{30}$ alicyclic group, a $C_3$-$C_{20}$ hetero alicyclic group, a $C_6$-$C_{30}$ aromatic group or a $C_3$-$C_{30}$ hetero aromatic group, wherein each of the alicyclic group, the hetero alicyclic group, the aromatic group and the hetero aromatic group is independently unsubstituted or substituted;

each of $R_{10}$, $R_{14}$ and $R_{15}$ is independently hydrogen, halogen, hydroxyl, cyano, nitro, amidino, hydrazine, hydrazone, $C_1$-$C_{20}$ alkyl, $C_2$-$C_{20}$ alkenyl, $C_2$-$C_{20}$ alkynyl, $C_1$-$C_{20}$ alkoxy, a $C_3$-$C_{30}$ alicyclic group, a $C_3$-$C_{20}$ hetero alicyclic group, a $C_6$-$C_{30}$ aromatic group or a $C_3$-$C_{30}$ hetero aromatic group, wherein each of the alicyclic group, the hetero alicyclic group, the aromatic group and the hetero aromatic group in each of $R_1$ to $R_3$, R $R_{10}$, $R_{14}$ and $R_{15}$ is independently unsubstituted or substituted;

g is an integer of 0 to 2;

h is an integer of 0 to 3, provided that when each of a, b, c, g and h is an integer equal to or more than 2, each of two adjacent groups of $R_1$ to $R_3$, $R_{14}$ and $R_{15}$ independently forms an unsubstituted or substituted $C_5$-$C_{20}$ fused aromatic ring or an unsubstituted or substituted $C_3$-$C_{20}$ fused hetero aromatic ring or at least one of $R_3$ and $R_6$ and $R_{10}$ and $R_{14}$ forms an unsubstituted or substituted $C_6$-$C_{20}$ fused aromatic ring or an unsubstituted or substituted $C_3$-$C_{20}$ hetero aromatic ring.

2. An organic metal compound having one of the following structures represented by Chemical Formula 7 or 8:

Chemical Formula 7

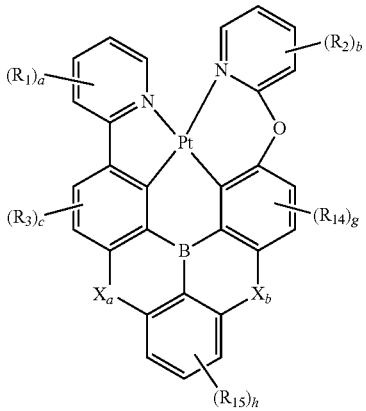

Chemical Formula 8

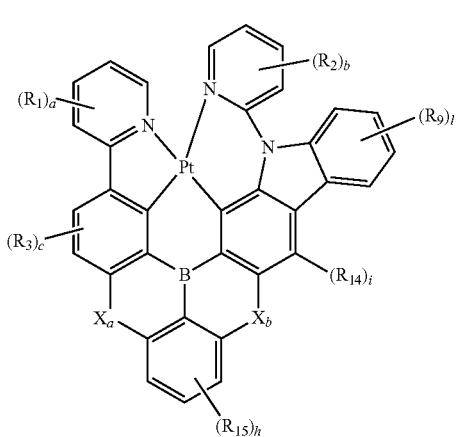

wherein:
each of $R_1$ to $R_3$ is independently selected from the group consisting of hydrogen, halogen, hydroxyl, cyano, nitro, amidino, hydrazine, hydrazone, $C_1$-$C_{20}$ alkyl, $C_2$-$C_{20}$ alkenyl, $C_2$-$C_{20}$ alkynyl, $C_1$-$C_{20}$ alkoxy, a $C_3$-$C_{30}$ alicyclic group, a $C_3$-$C_{20}$ hetero alicyclic group, a $C_6$-$C_{30}$ aromatic group and a $C_3$-$C_{30}$ hetero aromatic group;

each of a and b is independently an integer of 0 to 4;

c is an integer of 0 to 2;

$X_a$ is $NR_6$;

$X_b$ is $NR_{10}$;

$R_6$ is selected from the group consisting of hydrogen, halogen, hydroxyl, cyano, nitro, amidino, hydrazine, hydrazone, $C_1$-$C_{20}$ alkyl, $C_2$-$C_{20}$ alkenyl, $C_2$-$C_{20}$ alkynyl, $C_1$-$C_{20}$ alkoxy, a $C_3$-$C_{30}$ alicyclic group, a $C_3$-$C_{20}$ hetero alicyclic group, a $C_6$-$C_{30}$ aromatic group and a $C_3$-$C_{30}$ hetero aromatic group;

each of $R_{10}$, $R_{14}$ and $R_{15}$ is independently hydrogen, halogen, hydroxyl, cyano, nitro, amidino, hydrazine, hydrazone, $C_1$-$C_{20}$ alkyl, $C_2$-$C_{20}$ alkenyl, $C_2$-$C_{20}$ alkynyl, $C_1$-$C_{20}$ alkoxy, a $C_3$-$C_{30}$ alicyclic group, a $C_3$-$C_{20}$ hetero alicyclic group, a $C_6$-$C_{30}$ aromatic group or a $C_3$-$C_{30}$ hetero aromatic group, wherein each of the alicyclic group, the hetero alicyclic group, the aromatic group and the hetero aromatic group in each of $R_1$ to $R_3$, $R_6$, $R_{10}$, $R_{14}$ and $R_{15}$ is independently unsubstituted or substituted;

g is an integer of 0 to 2;

h is an integer of 0 to 3, i is an integer of 0 to 1, provided that when each of a, b, c, g and h is an integer equal to or more than 2, each of two adjacent groups of $R_1$ to $R_3$, $R_{14}$ and $R_{15}$ independently forms an unsubstituted or substituted $C_5$-$C_{20}$ fused aromatic ring or an unsubstituted or substituted $C_3$-$C_{20}$ fused hetero aromatic ring or at least one of $R_3$ and $R_6$ and $R_{10}$ and $R_{14}$ forms an unsubstituted or substituted $C_6$-$C_{20}$ fused aromatic ring or an unsubstituted or substituted $C_3$-$C_{20}$ hetero aromatic ring;

$R_9$ is hydrogen, halogen, hydroxyl, cyano, nitro, amidino, hydrazine, hydrazone, $C_1$-$C_{20}$ alkyl, $C_2$-$C_{20}$ alkenyl, $C_2$-$C_{20}$ alkynyl, $C_1$-$C_{20}$ alkoxy, a $C_3$-$C_{30}$ alicyclic group, a $C_3$-$C_{20}$ hetero alicyclic group, a $C_6$-$C_{30}$ aromatic group or a $C_3$-$C_{30}$ hetero aromatic group, wherein each of the alicyclic group, the hetero alicyclic group, the aromatic group and the hetero aromatic group is independently unsubstituted or substituted; and f is an integer of 0 to 4, provided that when f is an integer equal to or more than 2, two adjacent $R_9$ form an unsubstituted or substituted $C_5$-$C_{20}$ fused aromatic ring or an unsubstituted or substituted $C_3$-$C_{20}$ fused hetero aromatic ring.

3. The organic metal compound of claim 1, wherein each of $R_1$, $R_2$, $R_3$, $R_{14}$ and $R_{15}$ is independently selected from the group consisting of hydrogen, $C_1$-$C_{10}$ alkyl and the $C_6$-$C_{30}$ aromatic group, wherein the aromatic group in each of $R_1$, $R_2$, $R_3$, $R_{14}$ and $R_{15}$ is unsubstituted or substituted, and each of $R_6$ and $R_{10}$ is independently the $C_6$-$C_{30}$ aromatic group, wherein the aromatic group in each of $R_6$ and $R_{10}$ is unsubstituted or substituted, provided that when each of a, b, c, g and h is an integer equal to or more than 2, each of two adjacent groups of $R_1$ to $R_3$, $R_{14}$ and $R_{15}$ independently forms the unsubstituted or substituted $C_5$-$C_{20}$ fused aromatic ring or the unsubstituted or substituted $C_3$-$C_{20}$ fused hetero aromatic ring or at least one of $R_3$ and $R_6$ and $R_{10}$ and $R_{14}$ forms the unsubstituted or substituted $C_6$-$C_{20}$ fused aromatic ring or the unsubstituted or substituted $C_3$-$C_{20}$ hetero aromatic ring.

4. The organic metal compound of claim 2, wherein each of $R_1$, $R_2$, $R_3$, $R_9$, $R_{14}$ and $R_{15}$ is independently selected from the group consisting of hydrogen, $C_1$-$C_{10}$ alkyl and the $C_6$-$C_{30}$ aromatic group, wherein the aromatic group in each of $R_1$, $R_2$, $R_3$, $R_9$, $R_{14}$ and $R_{15}$ is unsubstituted or substituted, and each of $R_6$ and $R_{10}$ is independently the $C_6$-$C_{30}$ aromatic group, wherein the aromatic group in each of $R_6$ and $R_{10}$ is unsubstituted or substituted, provided that when each of a, b, c, g and h is an integer equal to or more than 2, each of two adjacent groups of $R_1$ to $R_3$, $R_{14}$ and $R_{15}$ independently forms the unsubstituted or substituted $C_5$-$C_{20}$ fused aromatic ring or the unsubstituted or substituted $C_3$-$C_{20}$ fused hetero aromatic ring or at least one of $R_3$ and $R_6$ and $R_{10}$ and $R_{14}$ forms the unsubstituted or substituted $C_6$-$C_{20}$ fused aromatic ring or the unsubstituted or substituted $C_3$-$C_{20}$ hetero aromatic ring, and provided that when f is an integer equal to or more than 2, two adjacent $R_9$ form an unsubstituted or substituted $C_5$-$C_{20}$ fused aromatic ring or an unsubstituted or substituted $C_3$-$C_{20}$ fused hetero aromatic ring.

5. The organic metal compound of claim 2, wherein the organic metal compound has one of the following structures:

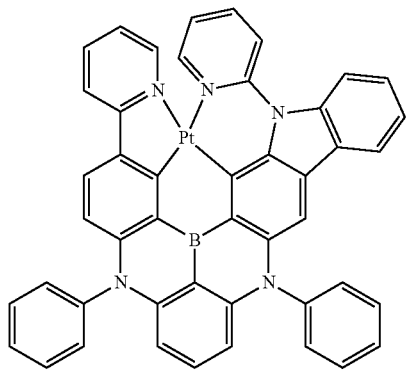

31

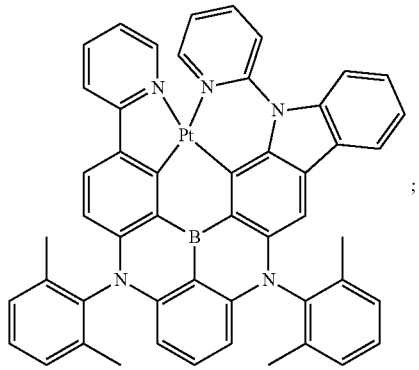

32

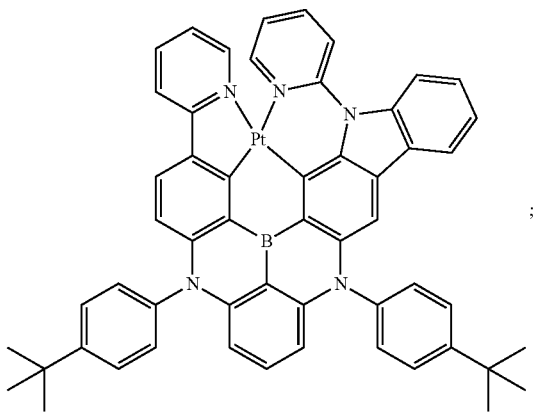

33

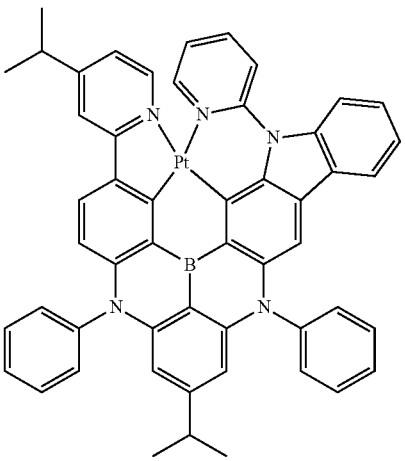

34

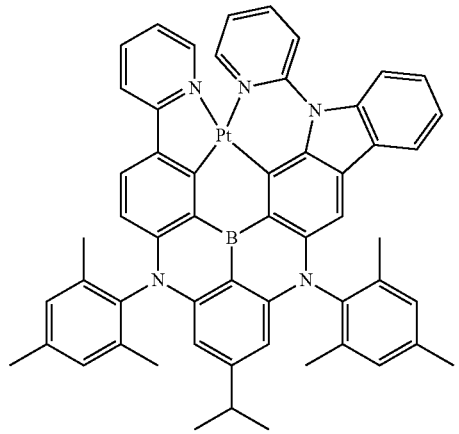

35

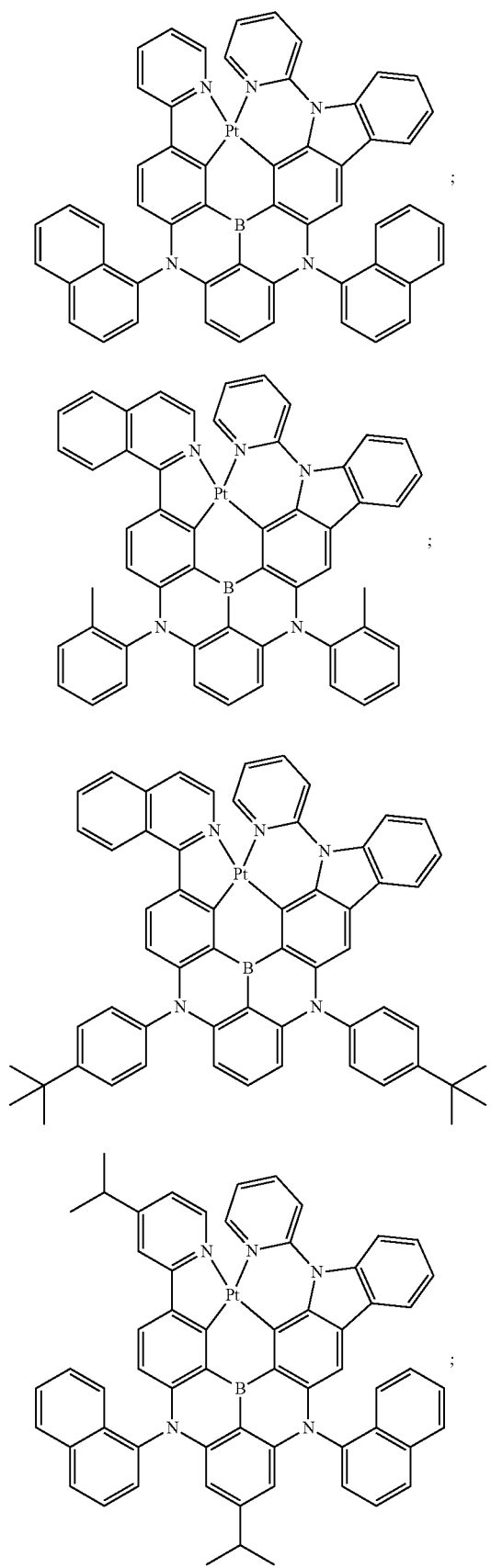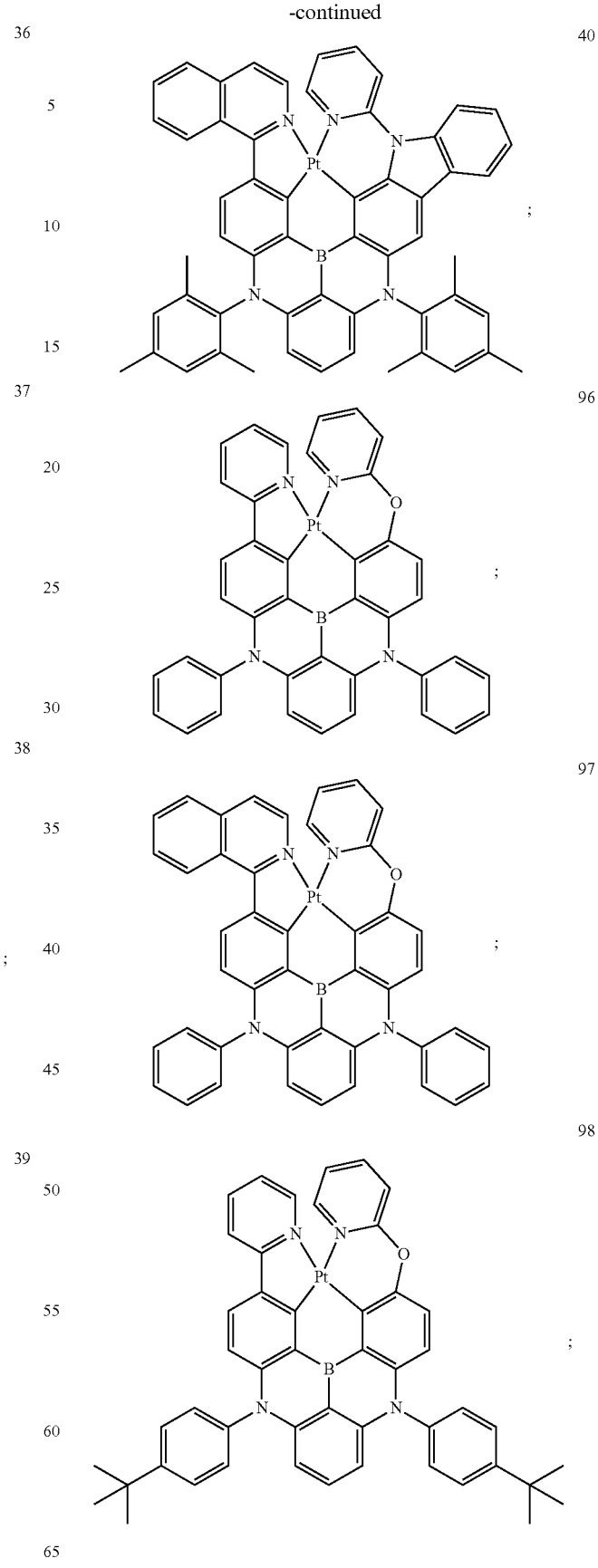

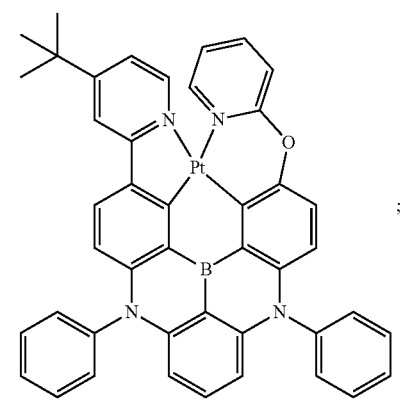
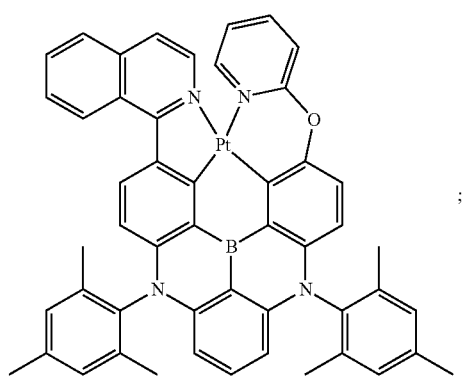
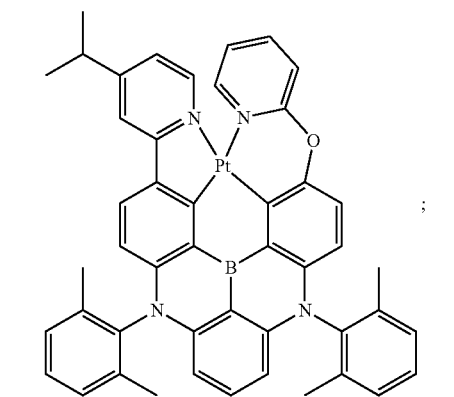
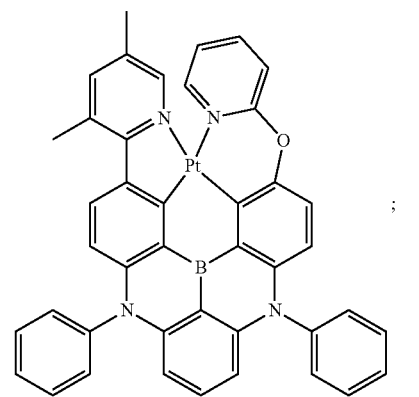
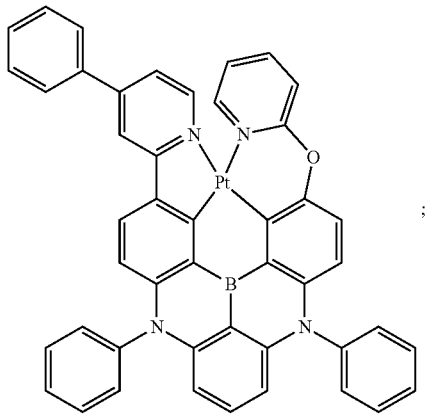
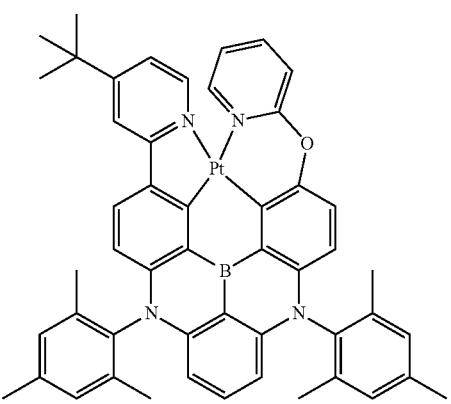
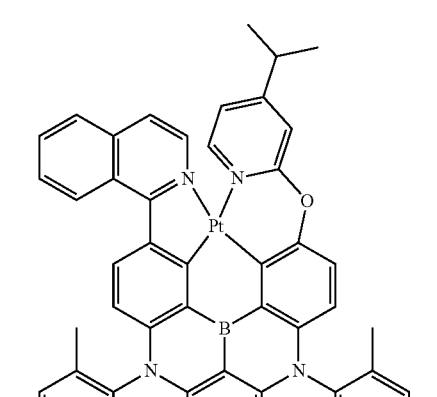
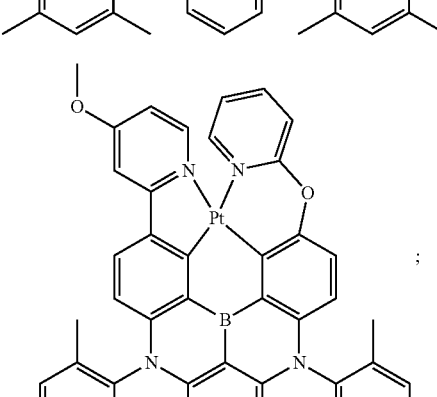

107
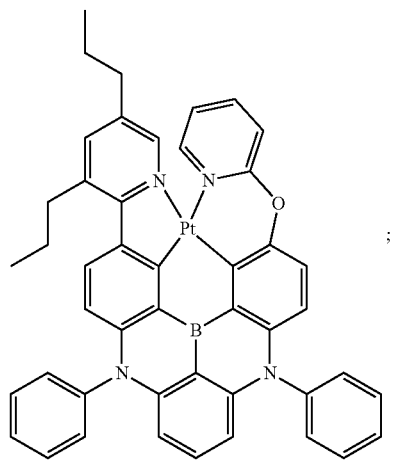
;
108
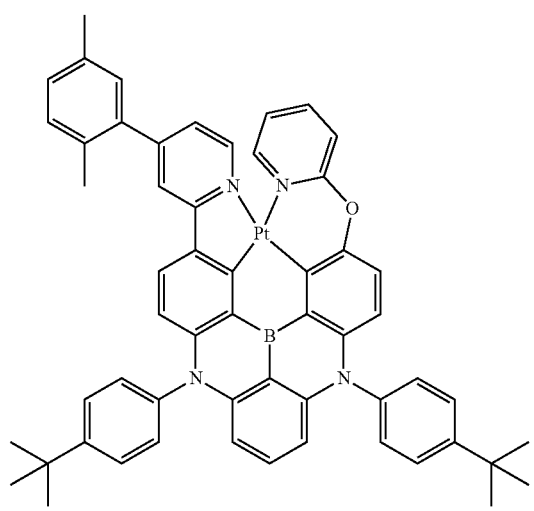
;
109
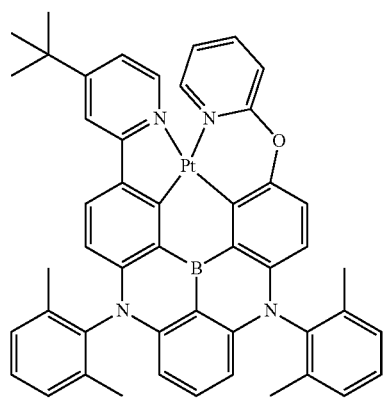
or
110
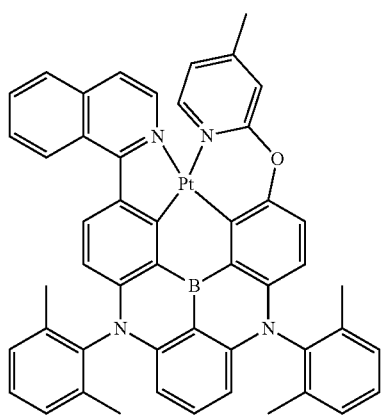
.
* * * * *

UNITED STATES PATENT AND TRADEMARK OFFICE
CERTIFICATE OF CORRECTION

PATENT NO. : 12,144,242 B2
APPLICATION NO. : 17/009609
DATED : November 12, 2024
INVENTOR(S) : Hee-Jun Park et al.

Page 1 of 1

It is certified that error appears in the above-identified patent and that said Letters Patent is hereby corrected as shown below:

In the Claims

Column 123, Claim 1, Line 14:
"$R_3$, R $R_{10}$, $R_{14}$ and $R_{15}$" should read: --$R_3$, $R_6$, $R_{10}$, $R_{14}$ and $R_{15}$--.

Signed and Sealed this
Fourth Day of February, 2025

Coke Morgan Stewart
*Acting Director of the United States Patent and Trademark Office*